US010859914B2

(12) United States Patent
Hatakeyama et al.

(10) Patent No.: US 10,859,914 B2
(45) Date of Patent: Dec. 8, 2020

(54) PATTERN FORMING METHOD, METHOD FOR PRODUCING ELECTRONIC DEVICE, AND ACTINIC RAY-SENSITIVE OR RADIATION-SENSITIVE RESIN COMPOSITION FOR ORGANIC SOLVENT DEVELOPMENT

(71) Applicant: FUJIFILM Corporation, Tokyo (JP)

(72) Inventors: Naoya Hatakeyama, Haibara-gun (JP); Akiyoshi Goto, Haibara-gun (JP); Michihiro Shirakawa, Haibara-gun (JP); Keita Kato, Haibara-gun (JP); Keiyu Ou, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 17 days.

(21) Appl. No.: 15/657,295

(22) Filed: Jul. 24, 2017

(65) Prior Publication Data
US 2017/0322490 A1 Nov. 9, 2017

Related U.S. Application Data

(63) Continuation of application No. PCT/JP2016/054491, filed on Feb. 17, 2016.

(30) Foreign Application Priority Data

| Feb. 26, 2015 | (JP) | 2015-036685 |
| Jul. 31, 2015 | (JP) | 2015-152934 |
| Dec. 25, 2015 | (JP) | 2015-255232 |

(51) Int. Cl.
| G03F 7/075 | (2006.01) |
| G03F 7/004 | (2006.01) |
| G03F 7/38 | (2006.01) |
| G03F 7/039 | (2006.01) |
| G03F 7/20 | (2006.01) |
| G03F 7/32 | (2006.01) |
| G03F 7/16 | (2006.01) |

(52) U.S. Cl.
CPC .......... *G03F 7/0758* (2013.01); *G03F 7/0045* (2013.01); *G03F 7/0046* (2013.01); *G03F 7/0397* (2013.01); *G03F 7/2006* (2013.01); *G03F 7/2041* (2013.01); *G03F 7/322* (2013.01); *G03F 7/325* (2013.01); *G03F 7/162* (2013.01); *G03F 7/168* (2013.01); *G03F 7/38* (2013.01)

(58) Field of Classification Search
CPC ..... G03F 7/30; G03F 7/38; G03F 7/40; G03F 7/0757; G03F 7/0758; G03F 7/325; G03F 7/397; G03F 7/2041
USPC ...................................................... 430/326
See application file for complete search history.

(56) References Cited

U.S. PATENT DOCUMENTS

| 4,743,529 | A | * | 5/1988 | Farid | C07D 311/16 |
| | | | | | 430/281.1 |
| 6,969,577 | B2 | * | 11/2005 | Adegawa | C09D 183/06 |
| | | | | | 430/270.1 |
| 7,341,817 | B2 | * | 3/2008 | Wada | C07C 309/39 |
| | | | | | 430/270.1 |
| 8,962,233 | B2 | * | 2/2015 | Kawabata | C07D 327/08 |
| | | | | | 430/270.1 |
| 2004/0137362 | A1 | | 7/2004 | De et al. | |
| 2004/0180288 | A1 | | 9/2004 | Adegawa | |
| 2005/0123859 | A1 | | 6/2005 | Wada et al. | |
| 2006/0093959 | A1 | * | 5/2006 | Huang | G03F 7/0752 |
| | | | | | 430/270.1 |
| 2013/0210236 | A1 | * | 8/2013 | Ogihara | C09D 183/06 |
| | | | | | 438/706 |
| 2014/0045117 | A1 | * | 2/2014 | Yamaguchi | G03F 7/11 |
| | | | | | 430/270.1 |
| 2017/0322490 | A1 | * | 11/2017 | Hatakeyama | G03F 7/0045 |

FOREIGN PATENT DOCUMENTS

| JP | 5-323611 A | 12/1993 |
| JP | 2004-264767 A | 9/2004 |
| JP | 2005-173549 A | 6/2005 |
| JP | 2006-504827 A | 2/2006 |
| JP | 2012-13812 A | 1/2012 |
| KR | 10-2005-0074979 A | 7/2005 |

OTHER PUBLICATIONS

Communication dated Oct. 24, 2017 issued by the Japanese Patent Office in counterpart application No. 2016-035725.
International Search Report for PCT/JP2016/054491 dated May 24, 2016 [PCT/ISA/210].
Written Opinion for PCT/JP2016/054491 dated May 24, 2016 [PCT/ISA/237].
Communication dated Oct. 1, 2018 from the Korean Intellectual Property Office in counterpart Application No. 10-2017-7020773.
Communication dated Feb. 13, 2019, from Korean Intellectual Property Office in counterpart application No. 10-2017-7020773.
Communication dated May 2, 2019 from the Korean Intellectual Property Office in counterpart Application No. 10-2017-7020773.

(Continued)

*Primary Examiner* — John S Chu
(74) *Attorney, Agent, or Firm* — Sughrue Mion, PLLC

(57) ABSTRACT

A method for producing an electronic device includes the pattern forming method, and an actinic ray-sensitive or radiation-sensitive resin composition for organic solvent development. Specifically, provided is a pattern forming method, including a film forming step of forming a film by an actinic ray-sensitive or radiation-sensitive resin composition, an exposure step of irradiating the film, and a development step of developing the film using a developer containing an organic solvent, in which the composition contains a resin containing a repeating unit having an Si atom and a repeating unit having an acid-decomposable group and a compound capable of generating an acid upon irradiation with actinic rays or radiation, the content of Si atoms in the resin is 1.0 to 30 mass %, and the content of the resin in the total solid content of the composition is 20 mass % or more.

9 Claims, 1 Drawing Sheet

(56) References Cited

OTHER PUBLICATIONS

Communication dated Oct. 3, 2019 from the Korean Intellectual Property Office in counterpart Application No. 10-2019-7021034.
Communication dated Jan. 30, 2020, from the Intellectual Property Office of Taiwan in Taiwan Application No. 105101451.
Communication dated Aug. 6, 2019, from the Taiwanese Patent Office in counterpart application No. 105101451.

\* cited by examiner

  unshared electron pair

PATTERN FORMING METHOD, METHOD FOR PRODUCING ELECTRONIC DEVICE, AND ACTINIC RAY-SENSITIVE OR RADIATION-SENSITIVE RESIN COMPOSITION FOR ORGANIC SOLVENT DEVELOPMENT

CROSS-REFERENCE TO RELATED APPLICATIONS

This application is a Continuation of PCT International Application No. PCT/JP2016/054491, filed on Feb. 17, 2016, which claims priority under 35 U.S.C. § 119(a) to Japanese Patent Application No. 2015-036685, filed on Feb. 26, 2015, Japanese Patent Application No. 2015-152934, filed on Jul. 31, 2015, and Japanese Patent Application No. 2015-255232, filed on Dec. 25, 2015. Each of the above application(s) is hereby expressly incorporated by reference, in its entirety, into the present application.

BACKGROUND OF THE INVENTION

1. Field of the Invention

The present invention relates to a pattern forming method, a method for producing an electronic device, and an actinic ray-sensitive or radiation-sensitive resin composition for organic solvent development. More specifically, the present invention relates to a pattern forming method and an actinic ray-sensitive or radiation-sensitive resin composition for organic solvent development, which are suitable for a production process of a semiconductor such as an integrated circuit (IC), a production process of a circuit board of, for example, a liquid crystal or a thermal head, and other lithography processes of photofabrication, and a pattern forming method. Further, the present invention also relates to a method for producing an electronic device including the foregoing pattern forming method.

2. Description of the Related Art

In the process of producing a semiconductor device such as an IC, microfabrication by lithography using an actinic ray-sensitive or radiation-sensitive resin composition (resist composition) has been conventionally carried out, and various pattern forming methods have been proposed.

For example, claim 1 of JP2012-13812A discloses "a pattern forming method including (a) a step of forming a film by a chemically amplified resist composition containing (A) a resin capable of increasing the polarity thereof by the action of an acid to decrease the solubility in a developer containing an organic solvent, (B) a compound capable of generating an acid upon irradiation with actinic rays or radiation, and (C) a solvent, (b) a step of exposing the film, and (c) a step of developing the exposed film using a developer containing an organic solvent, in which the resin (A) has a structure in which the polar group is protected by a leaving group which is capable of decomposing and leaving by the action of an acid, and the leaving group contains a silicon atom".

SUMMARY OF THE INVENTION

In recent years, further improvement of functions of various electronic devices is required, so that finer wiring is required to be manufactured. Further, further improvement of etching resistance of patterns and further reduction of residue defects after development are required.

Under such circumstances, the present inventors have formed a pattern with reference to the Examples of JP2012-13812A and found that the etching resistance of the formed pattern does not necessarily satisfy the level currently required even though the pattern exhibits a small number of residue defects and is relatively good.

The present invention has been made in view of the foregoing circumstances. Therefore, an object of the present invention is to provide a pattern forming method which is capable of forming a pattern having few residue defects and excellent etching resistance, a method for producing an electronic device including the pattern forming method, and an actinic ray-sensitive or radiation-sensitive resin composition for organic solvent development.

As a result of extensive studies on the above-mentioned problems, the present inventors have found that the above-mentioned problems can be solved by using a resin in which the content of Si atoms present in a site other than the leaving group is within a specific range.

That is, the present inventors have found that the above-described object can be achieved by the following configurations.

(1) A pattern forming method, comprising:
forming a film using an actinic ray-sensitive or radiation-sensitive resin composition; irradiating the film with actinic rays or radiation; and
developing the film irradiated with actinic rays or radiation using a developer containing an organic solvent,
in which the actinic ray-sensitive or radiation-sensitive resin composition contains a resin containing a repeating unit having an Si atom and a repeating unit having an acid-decomposable group and a compound capable of generating an acid upon irradiation with actinic rays or radiation,
the content of Si atoms in the resin is 1.0 to 30 mass %, and
the content of the resin in the total solid content of the actinic ray-sensitive or radiation-sensitive resin composition is 20 mass % or more, provided that, in the case where the repeating unit having an Si atom has a structure in which a polar group is protected by a leaving group capable of decomposing and leaving by the action of an acid and the leaving group has an Si atom, the amount of Si atoms in the leaving group is not included in the content of Si atoms in the resin.

(2) The pattern forming method according to (1), in which the repeating unit having an Si atom has a silsesquioxane structure.

(3) The pattern forming method according to (2), in which the silsesquioxane structure is a cage-type silsesquioxane structure.

(4) The pattern forming method according to any one of (1) to (3), in which the resin contains a repeating unit having at least one of a lactone structure, a sultone structure, or a carbonate structure.

(5) The pattern forming method according to any one of (1) to (4), in which the compound capable of generating an acid upon irradiation with actinic rays or radiation has a molecular weight of 580 or more.

(6) A method for producing an electronic device, comprising the pattern forming method according to any one of (1) to (5).

(7) An actinic ray-sensitive or radiation-sensitive resin composition for organic solvent development, comprising:

a resin containing a repeating unit having an Si atom and a repeating unit having an acid-decomposable group; and a compound capable of generating an acid upon irradiation with actinic rays or radiation, in which the content of Si atoms in the resin is 1.0 to 30 mass %, and the content of the resin in the total solid content of the actinic ray-sensitive or radiation-sensitive resin composition is 20 mass % or more, provided that, in the case where the repeating unit having an Si atom has a structure in which a polar group is protected by a leaving group capable of decomposing and leaving by the action of an acid and the leaving group has an Si atom, the amount of Si atoms in the leaving group is not included in the content of Si atoms in the resin.

As described below, according to the present invention, a pattern forming method which is capable of forming a pattern having few residue defects and excellent etching resistance, a method for producing an electronic device including the foregoing pattern forming method, and an actinic ray-sensitive or radiation-sensitive resin composition for organic solvent development can be provided.

BRIEF DESCRIPTION OF THE DRAWING

FIG. 1 is an example of a nitrogen atom with an unshared electron pair not contributing to π-conjugation.

DESCRIPTION OF THE PREFERRED EMBODIMENTS

Hereinafter, preferred embodiments of the present invention will be described in detail.

In the case where substitution or non-substitution is not explicitly indicated in the description of a group or atomic group in the present specification, the group or atomic group is intended to include both a group or atomic group having no substituent and a group or atomic group having a substituent. For example, an "alkyl group" not explicitly indicated to be substituted or unsubstituted is intended to include not only an alkyl group having no substituent (unsubstituted alkyl group) but also an alkyl group having a substituent (substituted alkyl group).

The term "actinic rays" or "radiation" as used herein refers to, for example, a bright line spectrum of mercury lamp, far ultraviolet rays represented by excimer laser, extreme ultraviolet rays (EUV light), X-rays, or particle beams such as electron beams or ion beams. The term "light" as used herein refers to actinic rays or radiation.

Unless otherwise indicated, the term "exposure" as used herein includes not only exposure to a mercury lamp, far ultraviolet rays represented by excimer laser, X-rays, extreme ultraviolet rays (EUV light), or the like but also lithography with particle beams such as electron beams or ion beams.

The term "(meth)acrylate" as used herein refers to "at least one of acrylate or methacrylate". The term "(meth) acrylic acid" refers to "at least one of acrylic acid or methacrylic acid".

The numerical value range shown with "to" as used herein refers to a range including the numerical values indicated before and after "to" as a lower limit value and an upper limit value, respectively.

As used herein, "1 Å" corresponds to "0.1 nanometers (nm)".

[Pattern Forming Method]

The pattern forming method of the present invention (hereinafter, also referred to as a method of the present invention) includes the following three steps.

(1) a film forming step of forming a film (resist film) by an actinic ray-sensitive or radiation-sensitive resin composition (resist composition).

(2) an exposure step of irradiating the film with actinic rays or radiation.

(3) a development step of developing the film irradiated with actinic rays or radiation using a developer containing an organic solvent.

Here, the actinic ray-sensitive or radiation-sensitive resin composition contains a resin containing a repeating unit having an Si atom and a repeating unit having an acid-decomposable group and a compound capable of generating an acid upon irradiation with actinic rays or radiation, in which the content of Si atoms in the resin is 1.0 to 30 mass %, and the content of the resin in the total solid content of the actinic ray-sensitive or radiation-sensitive resin composition is 20 mass % or more, provided that, in the case where the repeating unit having an Si atom has a structure in which the polar group is protected by a leaving group which is capable of decomposing and leaving by the action of an acid and the leaving group has an Si atom, the amount of Si atoms in the leaving group is not included in the content of Si atoms in the resin.

It is considered that a desired effect can be obtained since the method of the present invention adopts such a configuration. It is assumed that the reason is approximately as follows even though it is not clear.

As described above, the resist composition used in the method of the present invention contains a resin having a content of Si atoms within a specific range. Here, the content of Si atoms does not include the amount of Si atoms in the leaving group. That is, even in a resist pattern formed after exposure/organic solvent development (even in a state where a leaving group is eliminated), a predetermined amount of Si atoms are present in the resin. It is considered that the etching resistance of the pattern to be formed is improved due to the presence of the predetermined amount of Si atoms.

In addition, it is considered that the affinity between the resin having a content of Si atoms in a specific range and the developer containing an organic solvent is very high, so that the resin quickly dissolves at the time of development and the number of residue defects after development is small. This is also presumed from the fact that many residue defects are generated in the case of carrying out development with a developer other than a developer containing an organic solvent (Comparative Example 1), as shown in Comparative Examples to be described later.

Individual steps of the pattern forming method of the present invention will be described below.

[Step (1): Film Forming Step]

In step (1), an actinic ray-sensitive or radiation-sensitive resin composition film (resist film) is formed with an actinic ray-sensitive or radiation-sensitive resin composition (resist composition).

First, the members and materials used in the step (1) will be described, followed by the procedure of the step (1).

[Actinic Ray-Sensitive or Radiation-Sensitive Resin Composition (Resist Composition)]

The actinic ray-sensitive or radiation-sensitive resin composition (hereinafter, also referred to as the "composition of the present invention" or the "resist composition of the present invention") used in the method of the present invention contains a resin containing a repeating unit having an Si atom and a repeating unit having an acid-decomposable group and a compound capable of generating an acid upon irradiation with actinic rays or radiation, in which the content of Si atoms in the resin is 1.0 to 30 mass %, and the content of the resin in the total solid content of the actinic ray-sensitive or radiation-sensitive resin composition is 20 mass % or more, provided that, in the case where the repeating unit having an Si atom has a structure in which the polar group is protected by a leaving group which is capable of decomposing and leaving by the action of an acid and the leaving group has an Si atom, the amount of Si atoms in the leaving group is not included in the content of Si atoms in the resin.

The composition of the present invention is typically a chemically amplified resist composition.

Hereinafter, individual components contained in the composition of the present invention will be described.

[1] Resin

The composition of the present invention contains a resin (hereinafter, also referred to as a "specific resin") containing a repeating unit having an Si atom and a repeating unit having an acid-decomposable group. Here, the content of Si atoms in the specific resin is 1.0 to 30 mass %, provided that, in the case where the repeating unit having an Si atom has a structure in which the polar group is protected by a leaving group which is capable of decomposing and leaving by the action of an acid and the leaving group has an Si atom, the amount of Si atoms in the leaving group is not included in the content of Si atoms in the specific resin.

In the present specification, a repeating unit having both an Si atom and an acid-decomposable group corresponds to both a repeating unit having an Si atom and a repeating unit having an acid-decomposable group. For example, a resin consisting of only repeating units having both Si atoms and acid-decomposable groups corresponds to a resin containing a repeating unit having an Si atom and a repeating unit having an acid-decomposable group.

First, the repeating unit having an Si atom and the repeating unit having an acid-decomposable group will be described, and thereafter the repeating unit (arbitrary repeating unit) which the specific resin may contain will be described.

[1-1] Repeating Unit Having Si Atom

The repeating unit having an Si atom is not particularly limited as long as it has an Si atom. Examples thereof include a silane-based repeating unit (—SiR$_2$—: R$_2$ is an organic group), a siloxane-based repeating unit (—SiR$_2$—O—: R$_2$ is an organic group), a (meth)acrylate-based repeating unit having an Si atom, and a vinyl-based repeating unit having an Si atom.

It is preferred that the repeating unit having an Si atom does not have an acid-decomposable group.

The repeating unit having an Si atom preferably has a silsesquioxane structure. The silsesquioxane structure may be contained in the main chain or in the side chain, but it is preferable to have the silsesquioxane structure in the side chain.

Examples of the silsesquioxane structure include a cage-type silsesquioxane structure, a ladder-type silsesquioxane structure, and a random-type silsesquioxane structure. Among them, preferred is a cage-type silsesquioxane structure.

Here, the cage-type silsesquioxane structure is a silsesquioxane structure having a cage-like skeleton. The cage-type silsesquioxane structure may be a complete cage-type silsesquioxane structure or an incomplete cage-type silsesquioxane structure, among which a complete cage-type silsesquioxane structure is preferred.

The ladder-type silsesquioxane structure is a silsesquioxane structure having a ladder-like skeleton.

The random-type silsesquioxane structure is a silsesquioxane structure whose skeleton is of random.

The cage-type silsesquioxane structure is preferably a siloxane structure represented by General Formula (S).

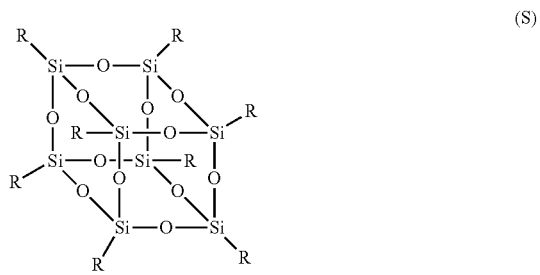

(S)

In General Formula (S), R represents a monovalent organic group. A plurality of R's may be the same or different.

The organic group is not particularly limited, and specific examples thereof include a hydrocarbon group which may have a halogen atom, a hydroxy group, a nitro group, a carboxy group, an alkoxy group, an amino group, a mercapto group, a blocked mercapto group (for example, an acyl group-blocked (protected) mercapto group), an acyl group, an imido group, a phosphino group, a phosphinyl group, a silyl group, a vinyl group, or a heteroatom, a (meth)acrylic group-containing group, and an epoxy group-containing group.

Examples of the halogen atom include a fluorine atom, a chlorine atom, a bromine atom, and an iodine atom.

Examples of the heteroatom in the hydrocarbon group which may have a heteroatom include an oxygen atom, a nitrogen atom, a sulfur atom, and a phosphorus atom.

Examples of the hydrocarbon group in the hydrocarbon group which may have a heteroatom include an aliphatic hydrocarbon group, an aromatic hydrocarbon group, and a group formed by combining these groups.

The aliphatic hydrocarbon group may be linear, branched or cyclic. Specific examples of the aliphatic hydrocarbon group include a linear or branched alkyl group (particularly, having 1 to 30 carbon atoms), a linear or branched alkenyl group (particularly, having 2 to 30 carbon atoms), and a linear or branched alkynyl group (particularly, having 2 to 30 carbon atoms).

Examples of the aromatic hydrocarbon group include aromatic hydrocarbon groups having 6 to 18 carbon atoms, such as a phenyl group, a tolyl group, a xylyl group, and a naphthyl group.

The repeating unit having an Si atom is preferably represented by General Formula (I).

(I)

In General Formula (I), L represents a single bond or a divalent linking group.

Examples of the divalent linking group include an alkylene group, a —COO-Rt- group, and an —O—Rt- group. In the formula, Rt represents an alkylene group or a cycloalkylene group.

L is preferably a single bond or a —COO-Rt- group. Rt is preferably an alkylene group having 1 to 5 carbon atoms and more preferably a —$CH_2$— group, a —$(CH_2)_2$— group, or a —$(CH_2)_3$— group.

In General Formula (I), X represents a hydrogen atom or an organic group.

The organic group may be, for example, an alkyl group which may have a substituent such as a fluorine atom or a hydroxyl group. Preferred is a hydrogen atom, a methyl group, a trifluoromethyl group, or a hydroxymethyl group.

In General Formula (I), A represents an Si-containing group. Among them, a group represented by General Formula (a) or (b) is preferable.

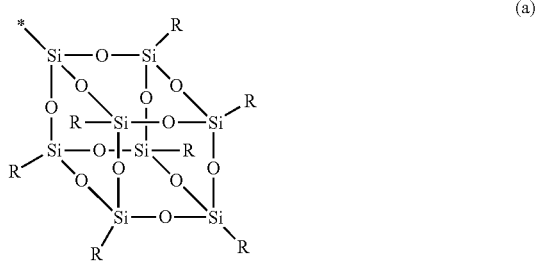

In General Formula (a), R represents a monovalent organic group. The plurality of R's may be the same or different. Specific examples and preferred embodiments of R are the same as in General Formula (S). In the case where A in General Formula (I) is a group represented by General Formula (a), General Formula (I) is represented by General Formula (I-a).

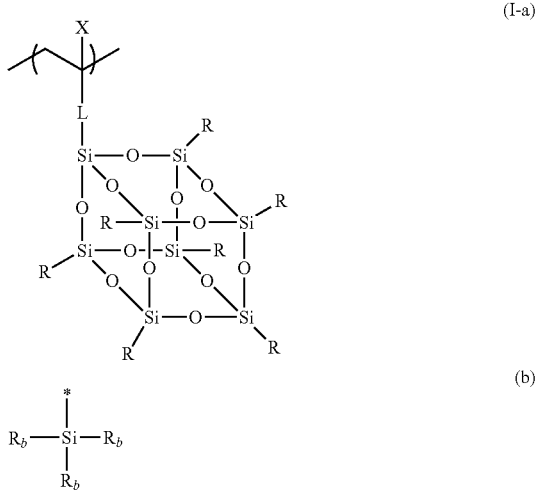

In General Formula (b), $R_b$ represents a hydrocarbon group which may have a heteroatom. Specific examples and preferred embodiments of the hydrocarbon group which may have a heteroatom are the same as R in General Formula (S).

The repeating unit having an Si atom contained in the specific resin may be one kind or a combination of two or more kinds thereof.

The content of the repeating unit having an Si atom with respect to the total repeating units of the specific resin is not particularly limited, but it is preferably 1 to 70 mol % and more preferably 3 to 50 mol %.

[1-2] Repeating Unit Having Acid-Decomposable Group

As described above, the specific resin contains a repeating unit having an acid-decomposable group. The repeating unit having an acid-decomposable group preferably has no Si atom.

Here, the acid-decomposable group refers to a group which is decomposed by the action of an acid to generate a polar group.

The acid-decomposable group preferably has a structure in which the polar group is protected by a group (leaving group) which is capable of decomposing and leaving by the action of an acid.

The polar group is not particularly limited as long as it is sparingly soluble or insoluble in the organic solvent-containing developer, examples of which include an acidic group (conventionally used as a resist developer, a group capable of dissociating in 2.38 mass % of tetramethylamonium hydroxide aqueous solution) such as a phenolic hydroxyl group, a carboxyl group, a fluorinated alcohol group (preferably hexafluoroisopropanol group), a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl) methylene group, a bis(alkylcarbonyl)imido group, a bis (alkylsulfonyl)methylene group, a bis(alkylsulfonyl)imido group, a tris(alkylcarbonyl)methylene group, or a tris(alkylsulfonyl)methylene group, and an alcoholic hydroxyl group.

Further, the alcoholic hydroxyl group refers to a hydroxyl group other than a hydroxyl group (phenolic hydroxyl group) bonded directly to the aromatic ring as a hydroxyl group bonded to a hydrocarbon group, and excludes an aliphatic alcohol substituted with an electron withdrawing group such as a fluorine atom at α-position of the hydroxyl group (for example, a fluorinated alcohol group (hexafluoroisopropanol group, or the like)). The alcoholic hydroxyl group is preferably a hydroxyl group having a pKa (acid dissociation constant) of 12 or more and 20 or less.

Preferred examples of the polar group include a carboxyl group, a fluorinated alcohol group (preferably, hexafluoroisopropanol group), and a sulfonate group.

A preferred group as the acid-decomposable group is a group substituted by a group in which a hydrogen atom in these groups is capable of leaving by an acid.

Examples of the group capable of leaving (leaving group) by an acid include —$C(R_{36})(R_{37})(R_{38})$, —$C(R_{36})(R_{37})(OR_{39})$, and —$C(R_{01})(R_{02})(OR_{39})$.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may be monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinenyl group, a tricyclodecanyl group, a tetracyclododecyl group, and an androstanyl group. At least one carbon atom in the cycloalkyl group may be substituted by a heteroatom such as an oxygen atom.

The aryl group of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by bonding of $R_{36}$ and $R_{37}$ to each other is preferably a cycloalkyl group (monocyclic or polycyclic). The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group, more preferably a monocyclic cycloalkyl group having 5 to 6 carbon atoms, and particularly preferably a monocyclic cycloalkyl group having 5 carbon atoms.

The acid-decomposable group is preferably a cumyl ester group, an enol ester group, an acetal ester group, or a tertiary alkyl ester group, and more preferably a tertiary alkyl ester group.

The specific resin preferably has a repeating unit represented by General Formula (AI) as a repeating unit having an acid-decomposable group. The repeating unit represented by General Formula (AI) is a repeating unit capable of generating a carboxyl group as a polar group by the action of an acid, and it exhibits a high interaction by hydrogen bonding at a plurality of carboxyl groups, so that it is possible to insolubilize or hardly solubilize the formed negative type pattern more reliably with respect to the solvent in the composition of the present invention described above.

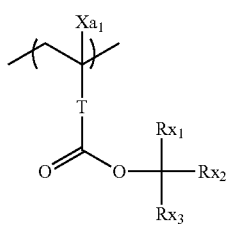

(AI)

In General Formula (AI), $Xa_1$ represents a hydrogen atom, an alkyl group, a cyano group, or a halogen atom.

T represents a single bond or a divalent linking group.

$Rx_1$ to $Rx_3$ each independently represent an alkyl group or a cycloalkyl group.

Two of $Rx_1$ to $Rx_3$ may be bonded to each other to form a ring structure.

Examples of the divalent linking group of T include an alkylene group, a —COO-Rt- group, a —O-Rt- group, and a phenylene group. In the formula, Rt represents an alkylene group or a cycloalkylene group.

T is preferably a single bond or a —COO-Rt- group. Rt is preferably an alkylene group having 1 to 5 carbon atoms and more preferably a —CH$_2$— group, a —(CH$_2$)$_2$— group, or a —(CH$_2$)$_3$— group. T is more preferably a single bond.

The alkyl group of $Xa_1$ may have a substituent, and examples of the substituent include a hydroxyl group and a halogen atom (preferably, a fluorine atom).

The alkyl group of $Xa_1$ is preferably an alkyl group having 1 to 4 carbon atoms, and examples thereof include a methyl group, an ethyl group, a propyl group, a hydroxymethyl group, and a trifluoromethyl group, among which a methyl group is preferred.

$Xa_1$ is preferably a hydrogen atom or a methyl group.

The alkyl group of $Rx_1$, $Rx_2$, and $Rx_3$ may be linear or branched, and preferred examples thereof include a methyl group, an ethyl group, an n-propyl group, an isopropyl group, an n-butyl group, an isobutyl group, and a t-butyl group. The alkyl group preferably has 1 to 10 carbon atoms and more preferably 1 to 5 carbon atoms.

The cycloalkyl group of $Rx_1$, $Rx_2$, and $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The ring structure formed by bonding of two of $Rx_1$, $Rx_2$, and $Rx_3$ is preferably a monocyclic cycloalkane ring such as a cyclopentyl ring or a cyclohexyl ring, or a polycyclic cycloalkyl group such as a norbornane ring, a tetracyclodecane ring, a tetracyclododecane ring, or an adamantane ring. A monocyclic cycloalkane ring having 5 or 6 carbon atoms is particularly preferred.

$Rx_1$, $Rx_2$, and $Rx_3$ are each independently preferably an alkyl group and more preferably a linear or branched alkyl group having 1 to 4 carbon atoms.

The respective groups may have a substituent, and examples of the substituent include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), with the number of carbon atoms being preferably 8 or less. Among them, from the viewpoint of further improving the dissolution contrast with respect to a developer containing an organic solvent before and after acid decomposition, more preferred is a substituent having no heteroatom such as an oxygen atom, a nitrogen atom, or a sulfur atom (for example, it is more preferred that the substituent is not an alkyl group substituted with a hydroxyl group, or the like), still more preferred is a group consisting of only a hydrogen atom and a carbon atom, and particularly preferred is a linear or branched alkyl group or a cycloalkyl group.

In General Formula (AI), $Rx_1$ to $Rx_3$ each independently represent an alkyl group, and it is preferred that two of $Rx_1$ to $Rx_3$ are not bonded to each other to form a ring structure. This makes it possible to suppress an increase in the volume of the group represented by —C($Rx_1$)($Rx_2$)($Rx_3$) as a group which is capable of decomposing and leaving by the action of an acid, and the volume shrinkage of the exposed portion tends to be suppressed in an exposure step and a post-exposure heating step which may be carried out after the exposure step.

Specific examples of the repeating unit represented by General Formula (AI) are shown below, but the present invention is not limited to these specific examples.

In the specific examples, Rx represents a hydrogen atom, CH$_3$, CF$_3$, or CH$_2$OH. Rxa and Rxb each independently represent an alkyl group (an alkyl group having preferably 1 to 10 carbon atoms and more preferably 1 to 5 carbon atoms). Xa$_1$ represents a hydrogen atom, CH$_3$, CF$_3$, or CH$_2$OH. Z represents a substituent, and in the case where there is a plurality of Z's, the plurality of Z's may be the same or different. p represents 0 or a positive integer. Specific examples and preferred examples of Z are the same as the specific examples and preferred examples of the substituent which may be contained in each group, such as Rx$_1$ to Rx$_3$.

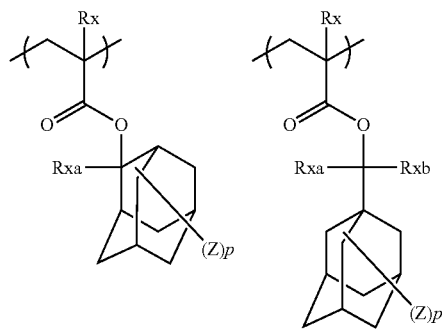

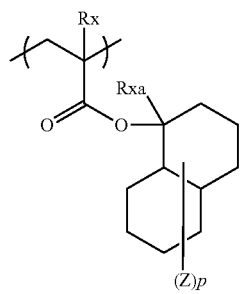

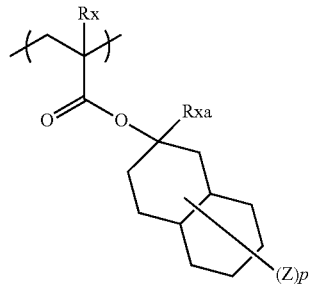

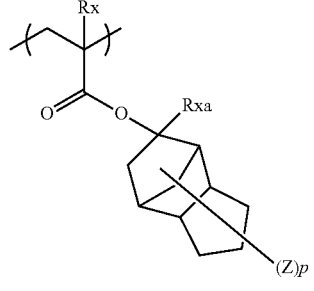

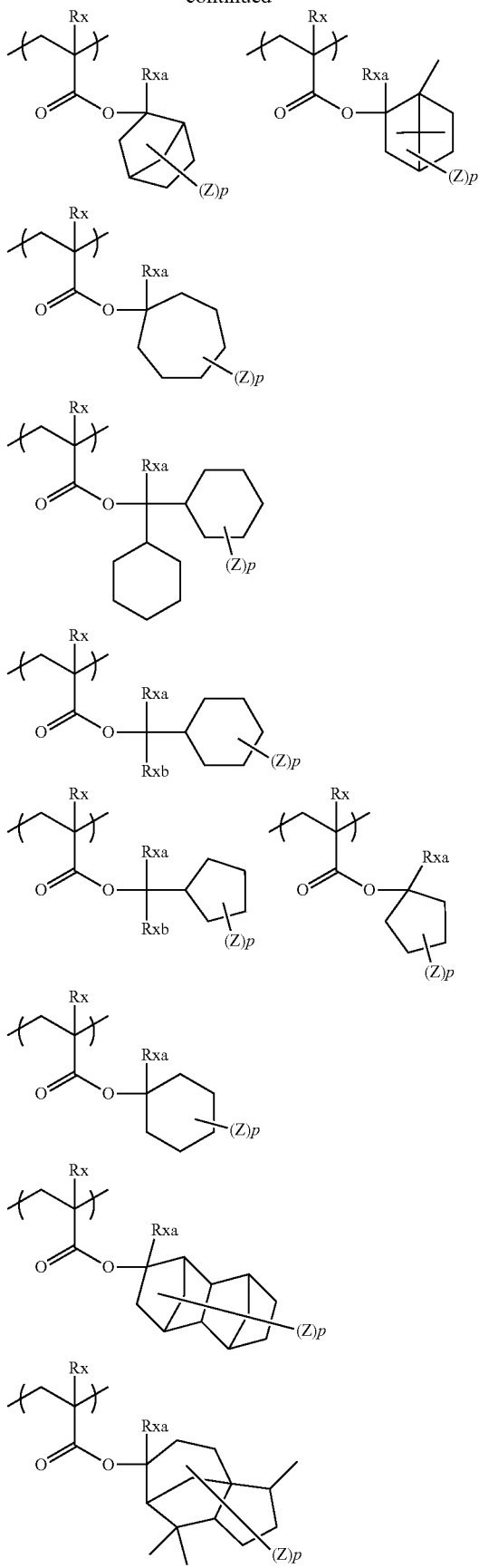

-continued
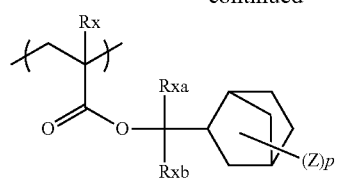
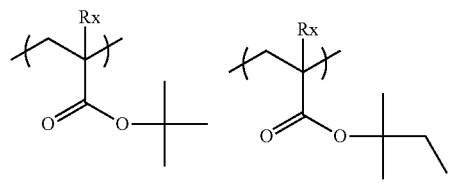
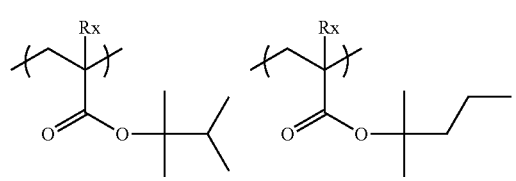
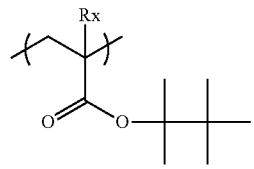
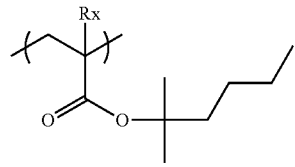
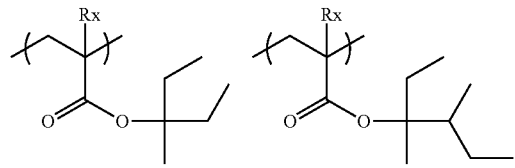
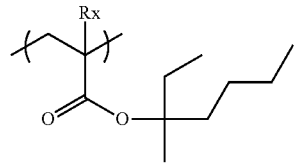
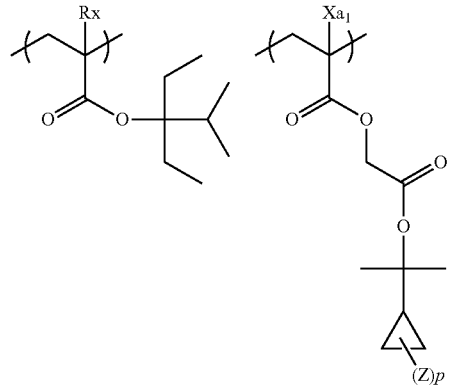
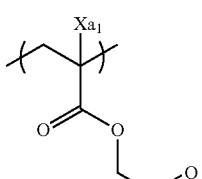
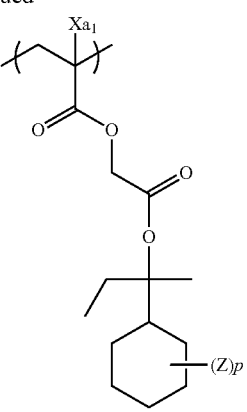
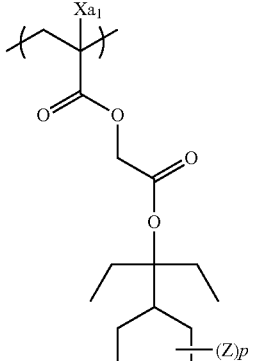
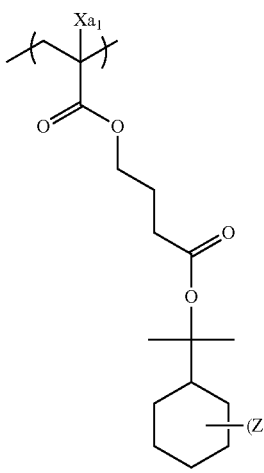
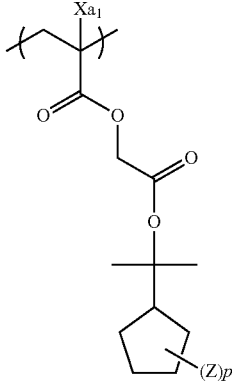

-continued
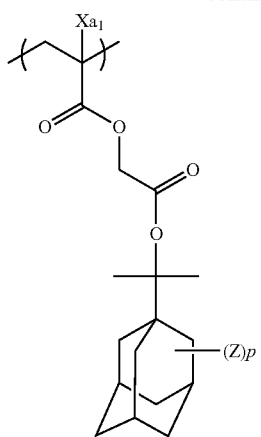
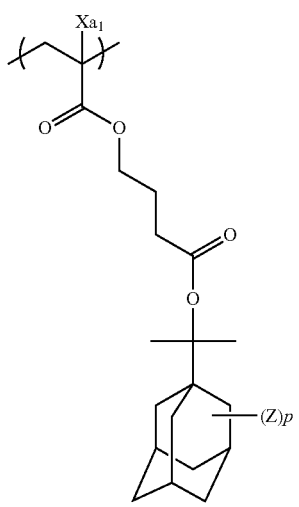
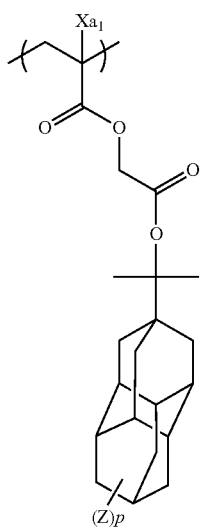 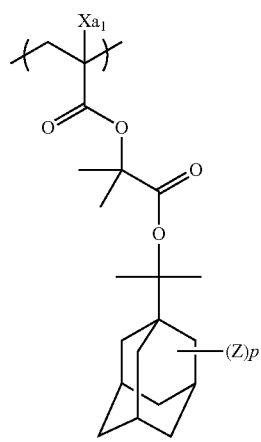
-continued
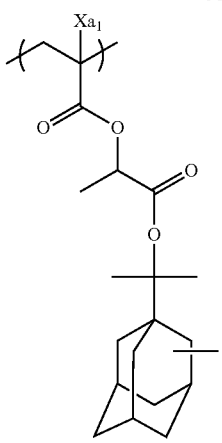 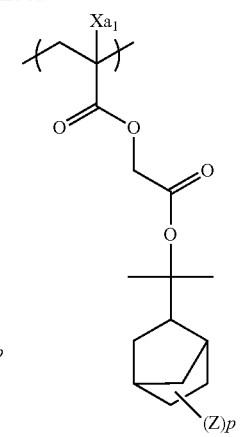
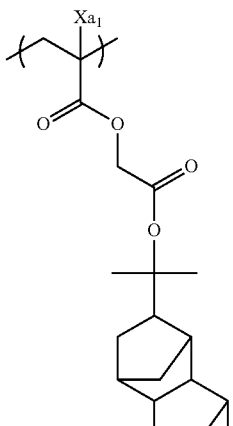
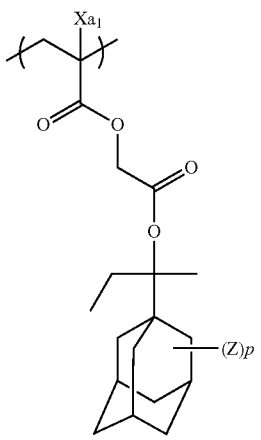

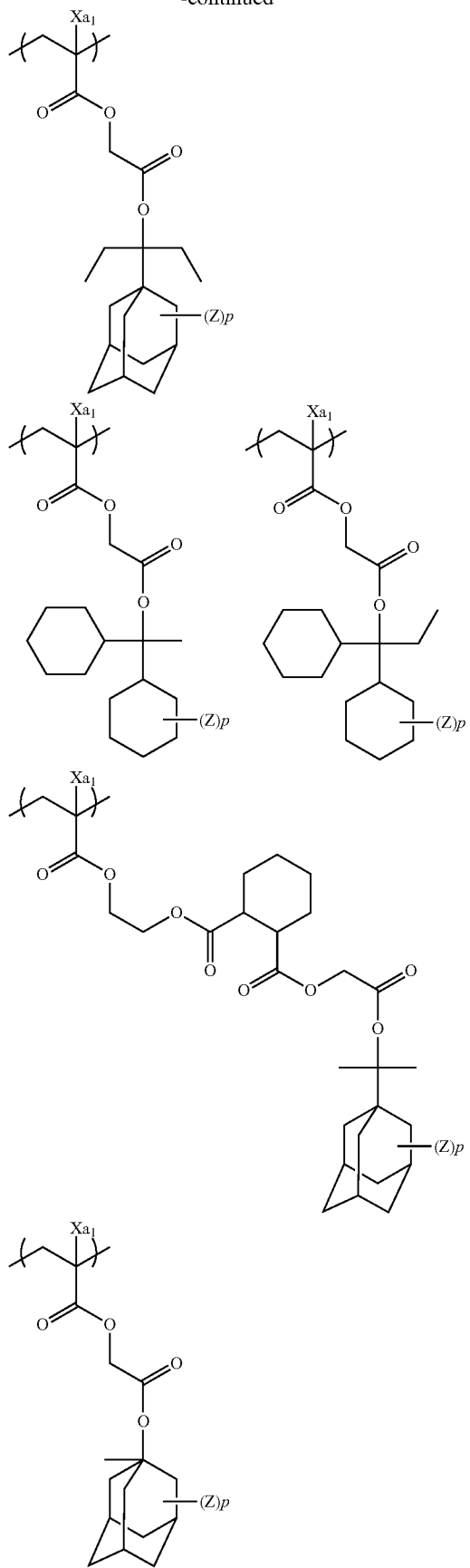
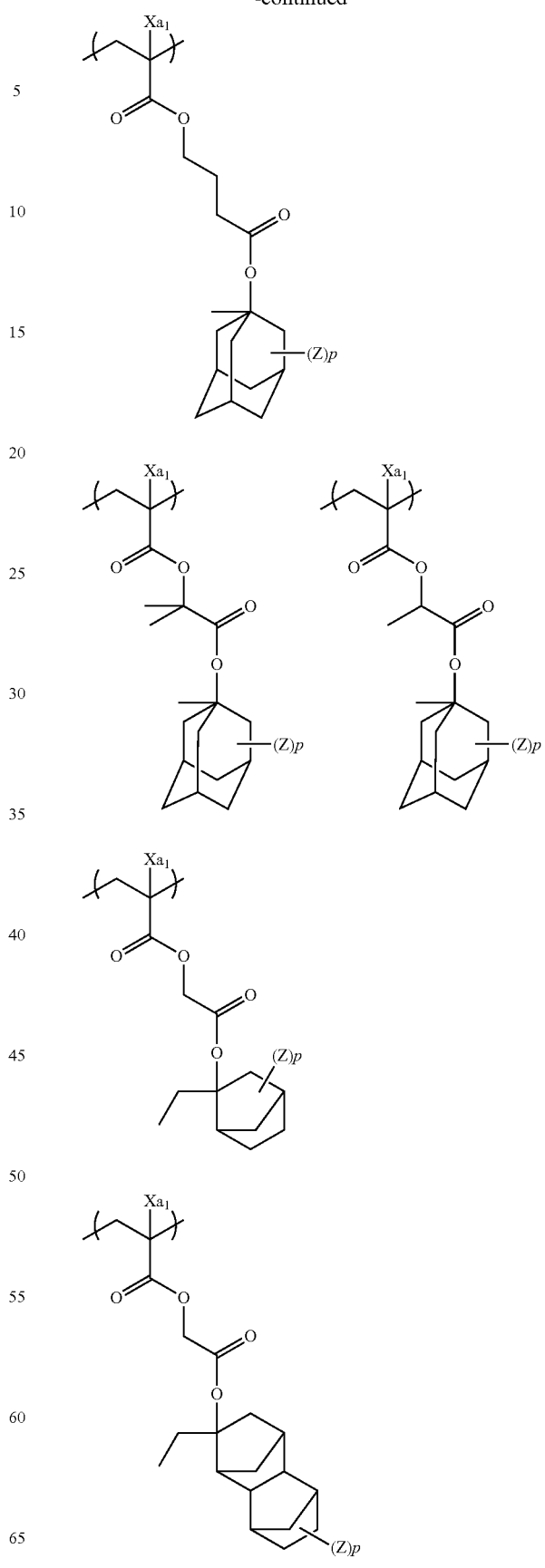

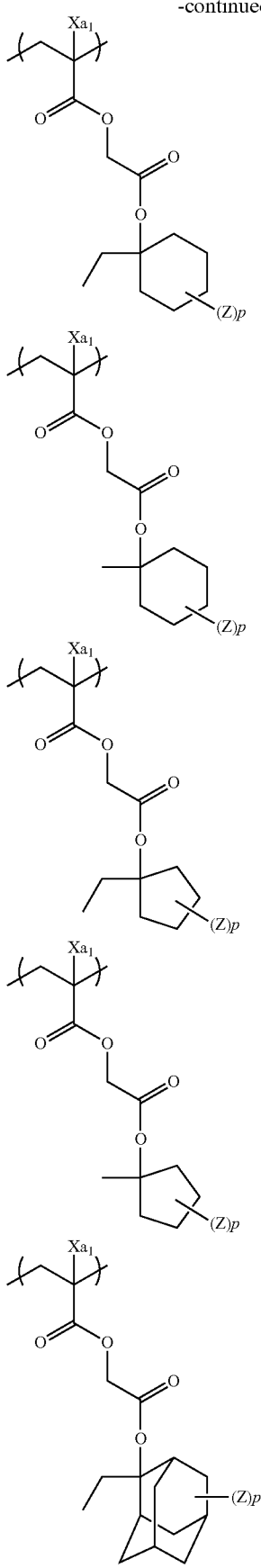

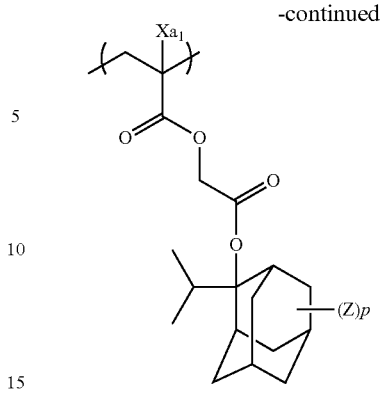

In addition, the specific resin preferably has the repeating unit described in paragraphs <0057> to <0071> of JP2014-202969A as a repeating unit having an acid-decomposable group.

The specific resin may have a repeating unit capable of generating an alcoholic hydroxyl group described in paragraphs <0072> to <0073> of JP2014-202969A as a repeating unit having an acid-decomposable group.

The repeating units having an acid-decomposable group may be used alone or in combination of two or more thereof.

The content of the repeating unit having an acid-decomposable group (the total content of repeating units in the case where there is a plurality of repeating units having an acid-decomposable group) contained in the specific resin is preferably 20 to 90 mol % and more preferably 40 to 80 mol %, with respect to the total repeating units of the specific resin. Among them, it is preferred that the specific resin has the repeating unit represented by General Formula (AI) and the content of the repeating unit represented by General Formula (AI) with respect to the total repeating units of the specific resin is 40 mol % or more.

The specific resin preferably contains a repeating unit having at least one of a lactone structure, a sultone structure, or a carbonate structure.

As the group having a lactone structure or a sultone structure, any group may be used as long as the group has a lactone structure or a sultone structure, but a lactone structure having a 5- to 7-membered ring or a sultone structure having a 5- to 7-membered ring is preferred. A group in which another ring structure is condensed to a lactone structure having a 5- to 7-membered ring in the form of forming a bicyclo structure or a spiro structure, or a group in which another ring structure is condensed to a sultone structure having a 5- to 7-membered ring in the form of forming a bicyclo structure or a spiro structure is more preferred. It is still more preferred that the group has a repeating unit having a lactone structure represented by any one of General Formulae (LC1-1) to (LC1-21) or a sultone structure represented by any one of General Formulae (SL1-1) to (SL1-3). Further, the lactone structure or sultone structure may be bonded directly to the main chain. A preferred lactone structure is (LC1-1), (LC1-4), (LC1-5), (LC1-6), (LC1-13), (LC1-14), and (LC1-17), and a particularly preferred lactone structure is (LC1-4). The use of such a specific lactone structure leads to favorable results in terms of LER and development defects.

LC1-1 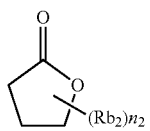
LC1-2 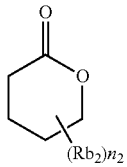
LC1-3 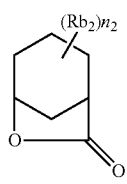
LC1-4 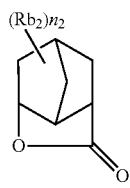
LC1-5 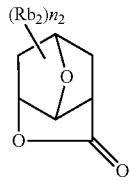
LC1-6 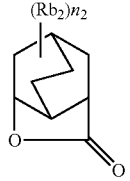
LC1-7 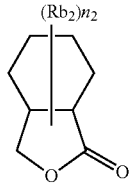
LC1-8 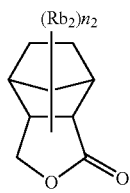
LC1-9 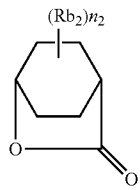
LC1-10 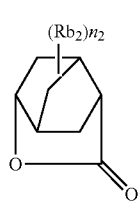
LC1-11 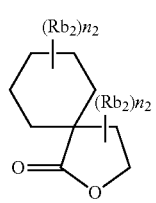
LC1-12 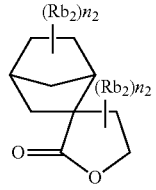
LC1-13 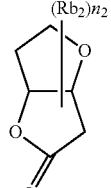
LC1-14 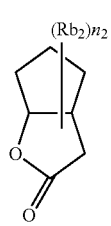
LC1-15 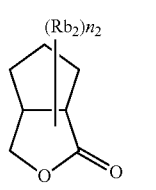
LC1-16 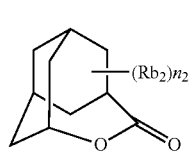

LC1-17 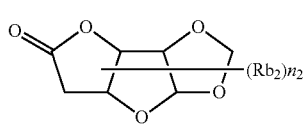

LC1-18 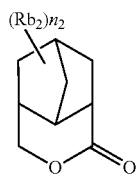

LC1-19 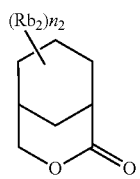

LC1-20 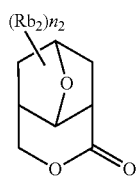

LC1-21 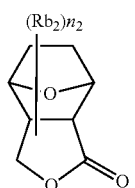

SL1-1 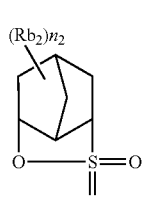

SL1-2 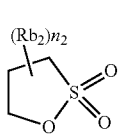

SL1-3 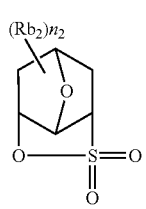

The lactone structure or sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. An alkyl group having 1 to 4 carbon atoms, a cyano group, and an acid-decomposable group are more preferred. $n_2$ represents an integer of 0 to 4. When $n_2$ is 2 or more, a plurality of substituents ($Rb_2$) may be the same or different, and the plurality of substituents ($Rb_2$) may be bonded to one other to form a ring.

The repeating unit having a lactone structure or a sultone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more and more preferably 95 or more.

The repeating unit having a lactone structure or a sultone structure is preferably a repeating unit represented by General Formula (III).

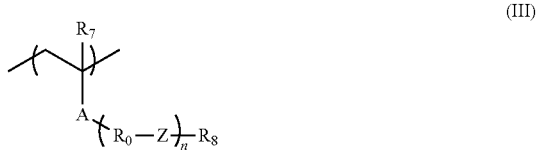

(III)

In General Formula (III),

A represents an ester bond (a group represented by —COO—) or an amide bond (a group represented by —CONH—).

In the case where there is a plurality of $R_0$'s, $R_0$'s each independently represent an alkylene group, a cycloalkylene group, or a combination thereof.

In the case where there is a plurality of Z's, Z's each independently represent a single bond, an ether bond, an ester bond, an amide bond, a urethane bond (group represented by

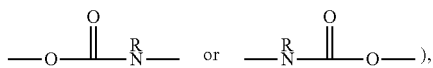

or a urea bond (group represented by

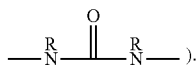

Here, R's each independently represent a hydrogen atom, an alkyl group, a cycloalkyl group, or an aryl group.

$R_8$ represents a monovalent organic group having a lactone structure or a sultone structure.

n is the repeating number of the structure represented by —$R_0$—Z— and represents an integer of 0 to 5, preferably 0 or 1 and more preferably 0. In the case where n is 0, —$R_0$—Z— is not present and n is a single bond.

$R_7$ represents a hydrogen atom, a halogen atom, or an alkyl group.

The alkylene group or cycloalkylene group of $R_0$ may have a substituent.

Z is preferably an ether bond or an ester bond and particularly preferably an ester bond.

The alkyl group of $R_7$ is preferably an alkyl group having 1 to 4 carbon atoms, more preferably a methyl group or an ethyl group, and particularly preferably a methyl group.

The alkylene group and cycloalkylene group of $R_0$, and the alkyl group of $R_7$ may be respectively substituted, and examples of the substituent include a halogen atom such as a fluorine atom, a chlorine atom, or a bromine atom, a mercapto group, a hydroxyl group, an alkoxy group such as a methoxy group, an ethoxy group, an isopropoxy group, a t-butoxy group, or a benzyloxy group, and an acyloxy group such as an acetyloxy group or a propionyloxy group.

$R_7$ is preferably a hydrogen atom, a methyl group, a trifluoromethyl group, or a hydroxymethyl group.

The preferred chain-like alkylene group in $R_0$ is preferably a chain-like alkylene group having 1 to 10 carbon atoms and more preferably 1 to 5 carbon atoms and examples thereof include a methylene group, an ethylene group, and a propylene group. The preferred cycloalkylene group is a cycloalkylene group having 3 to 20 carbon atoms and examples thereof include a cyclohexylene group, a cyclopentylene group, a norbornylene group, and an adamantylene group. In order to exhibit the effects of the present invention, a chain-like alkylene group is more preferred, and a methylene group is particularly preferred.

The monovalent organic group having a lactone structure or a sultone structure represented by $R_8$ is not particularly limited as long as it has a lactone structure or a sultone structure. Specific examples thereof include a lactone structure or a sultone structure represented by any one of General Formulae (LC1-1) to (LC1-21) and (SL1-1) to (SL1-3). Among them, a structure represented by (LC1-4) is particularly preferred. In addition, $n_2$ in (LC1-1) to (LC1-21) is more preferably 2 or less.

Also, $R_8$ is preferably a monovalent organic group having an unsubstituted lactone structure or sultone structure, or a monovalent organic group having a lactone structure or sultone structure having a methyl group, a cyano group or an alkoxycarbonyl group as a substituent, and more preferably a monovalent organic group having a lactone structure (cyano lactone) having a cyano group as a substituent.

Specific examples of the repeating unit having a group having a lactone structure or a sultone structure are shown below, but the present invention is not limited thereto.

(In the formulae, Rx represents H, $CH_3$, $CH_2OH$, or $CF_3$)

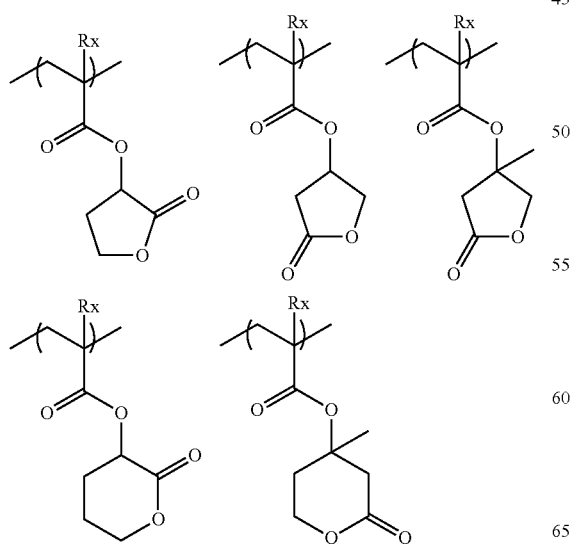

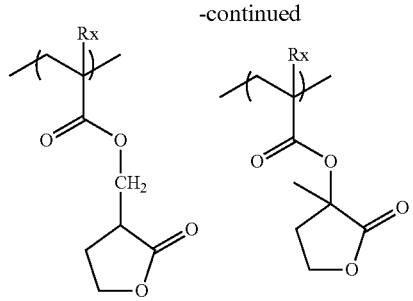

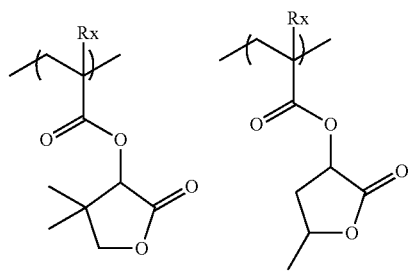

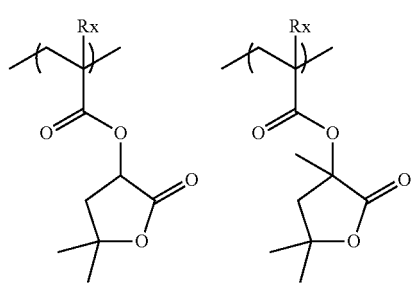

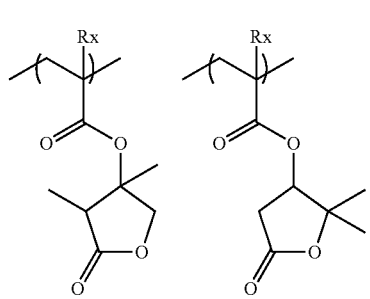

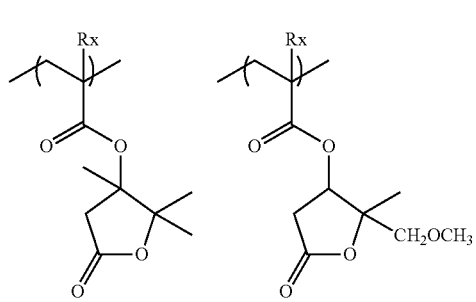

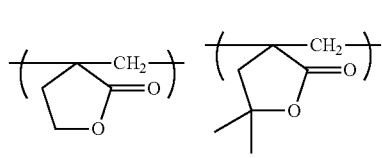

(In the formulae, Rx represents H, CH₃, CH₂OH, or CF₃)
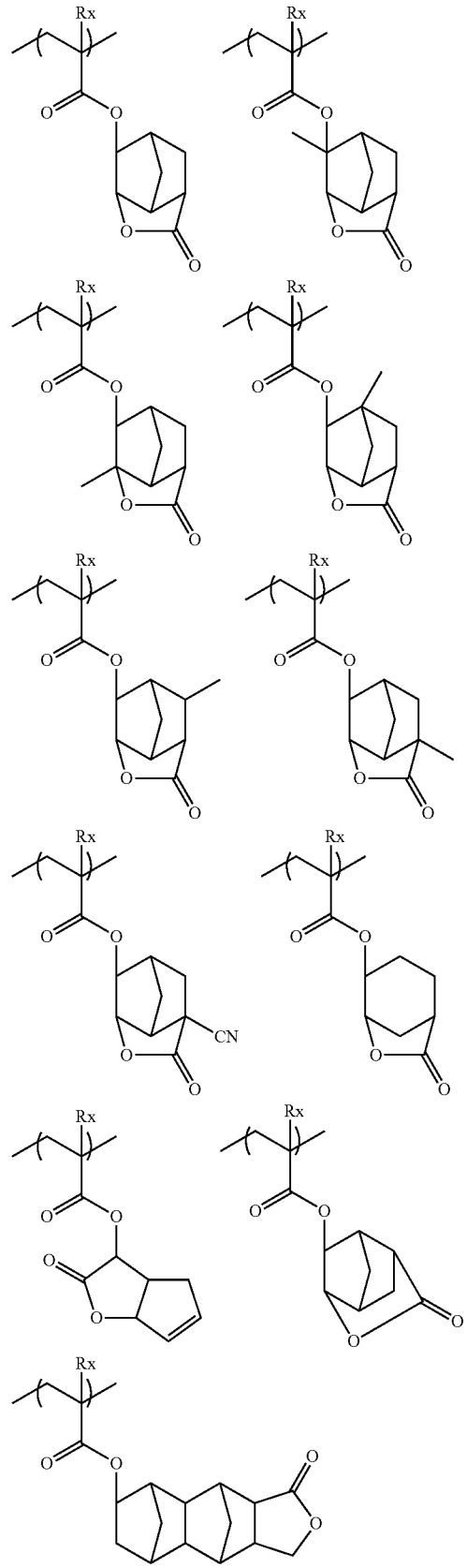
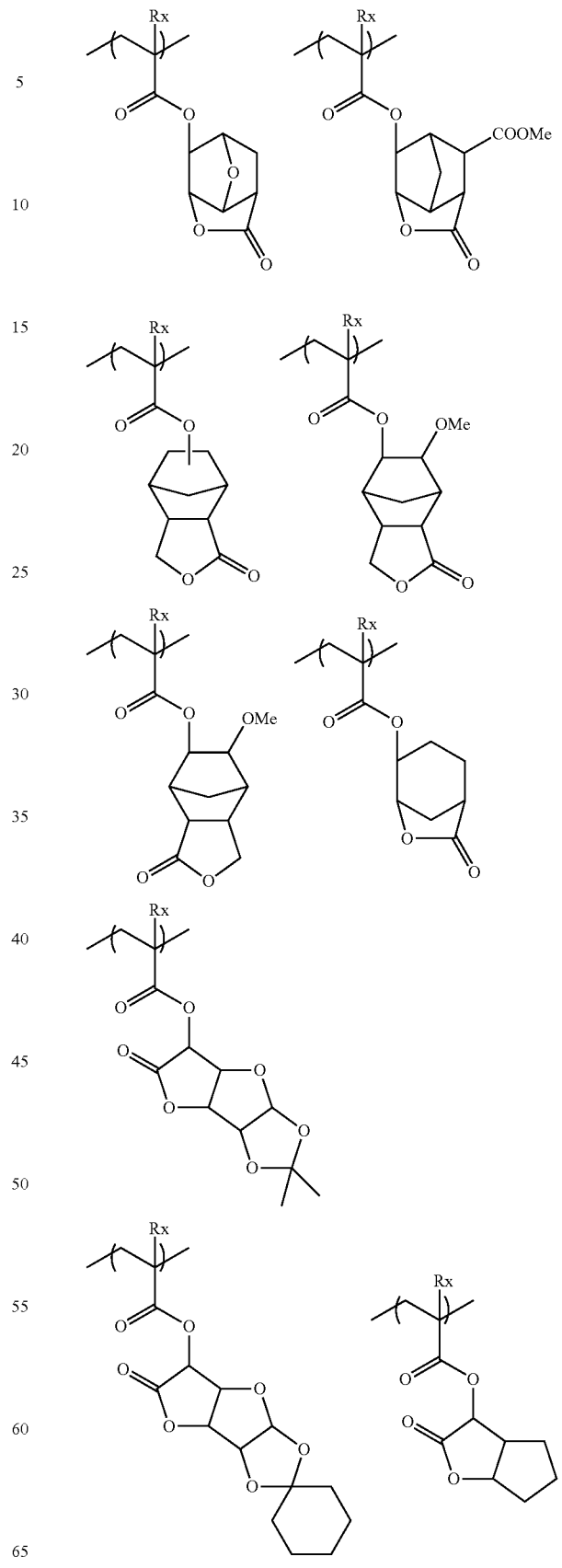

29
-continued
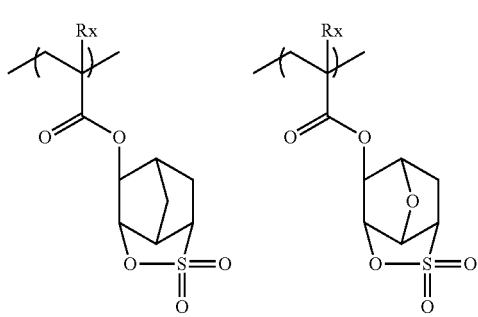
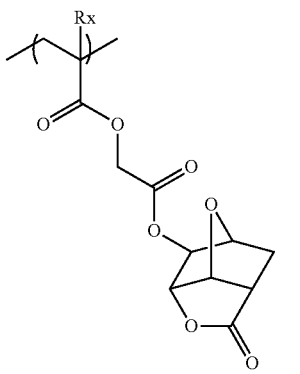
(In the formulae, Rx represents H, CH$_3$, CH$_2$OH, or CF$_3$)
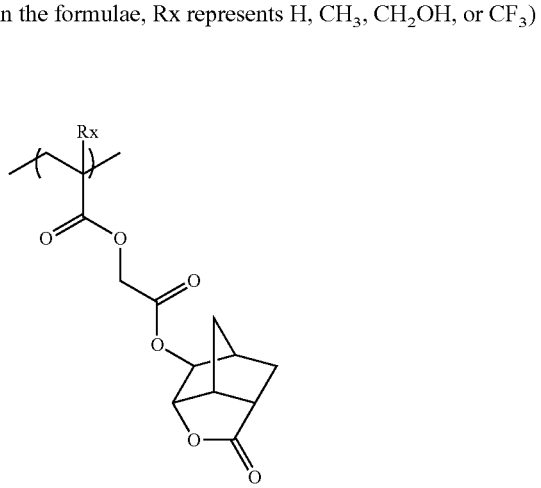
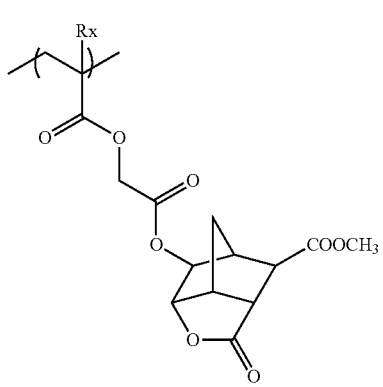
30
-continued
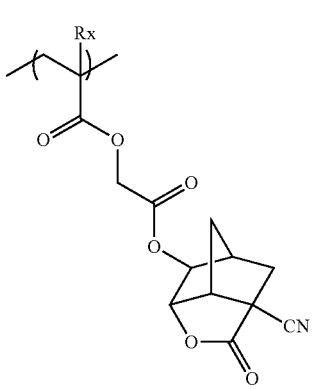
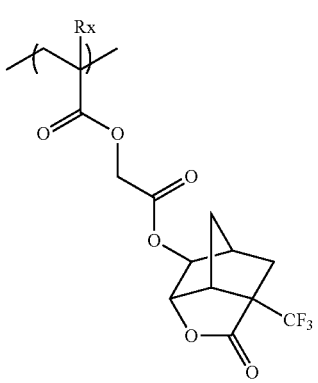
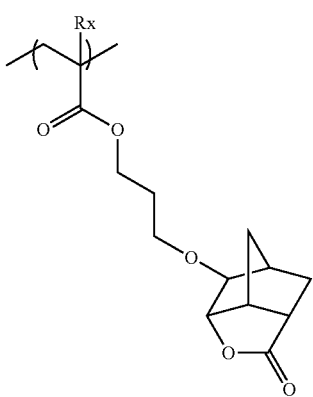

31
-continued
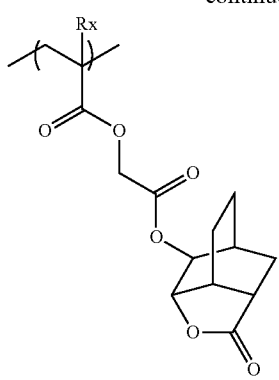
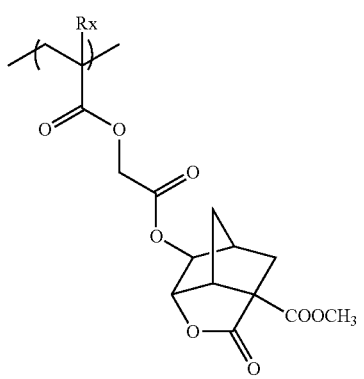
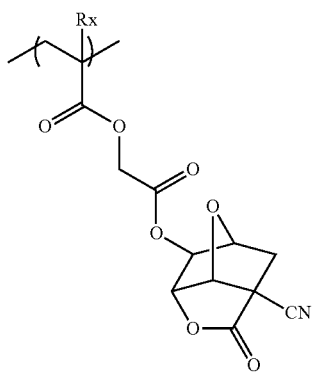
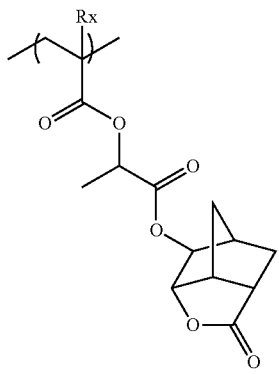
32
-continued
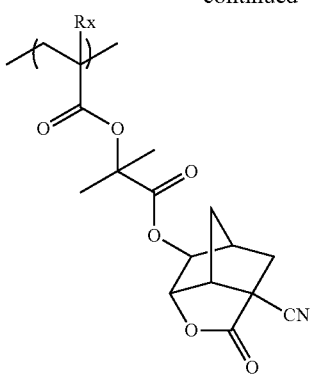
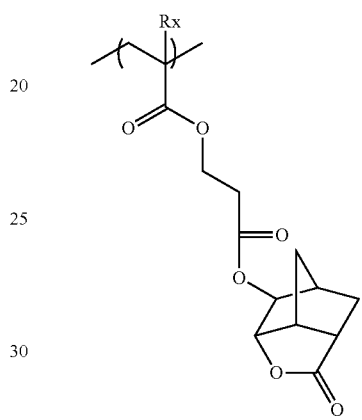
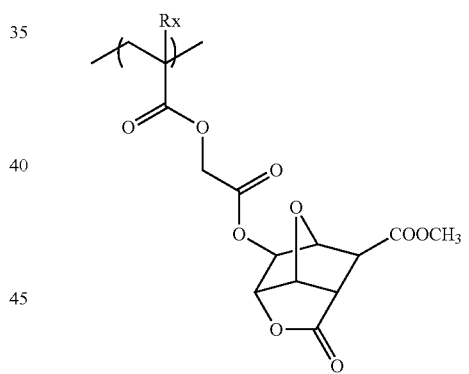
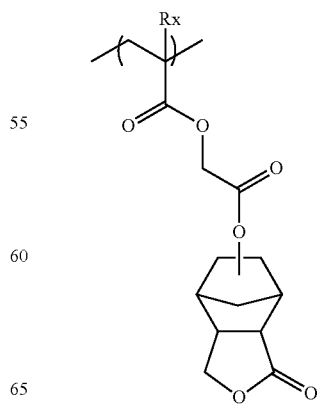

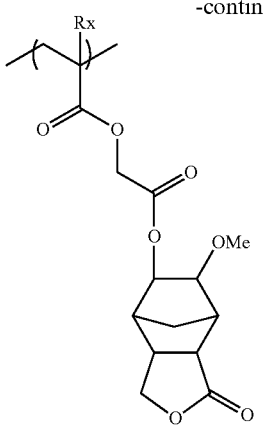

In order to enhance the effects of the present invention, it is also possible to use two or more repeating units having a lactone structure or a sultone structure in combination.

In the case where the specific resin contains a repeating unit having a lactone structure or a sultone structure, the content of the repeating unit having a lactone structure or a sultone structure is preferably 5 to 60 mol %, more preferably 5 to 55 mol %, and still more preferably 10 to 50 mol %, with respect to the total repeating units in the specific resin.

Further, the specific resin may have a repeating unit having a carbonate structure (cyclic carbonate ester structure).

The repeating unit having a cyclic carbonate ester structure is preferably a repeating unit represented by General Formula (A-1).

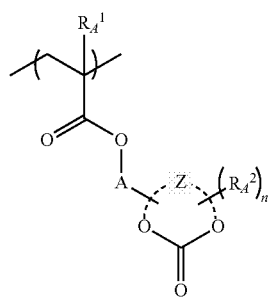

(A-1)

In General Formula (A-1), $R_A^1$ represents a hydrogen atom or an alkyl group.

In the case where n is 2 or more, $R_A^2$'s each independently represent a substituent.

A represents a single bond or a divalent linking group.

Z represents an atomic group forming a monocyclic or polycyclic structure together with the group represented by —O—C(=O)—O— in the formula.

n represents an integer of 0 or more.

General Formula (A-1) will be described in detail below.

The alkyl group represented by $R_A^1$ may have a substituent such as a fluorine atom. $R_A^1$ preferably represents a hydrogen atom, a methyl group, or a trifluoromethyl group and more preferably a methyl group.

The substituent represented by $R_A^2$ is, for example, an alkyl group, a cycloalkyl group, a hydroxyl group, an alkoxy group, an amino group, or an alkoxycarbonylamino group.

Preferred is an alkyl group having 1 to 5 carbon atoms, examples of which include a linear alkyl group having 1 to 5 carbon atoms such as a methyl group, an ethyl group, a propyl group, or a butyl group; and a branched alkyl group having 3 to 5 carbon atoms such as an isopropyl group, an isobutyl group, or a t-butyl group. The alkyl group may have a substituent such as a hydroxyl group.

n is an integer of 0 or more representing the number of substituents. n is, for example, preferably 0 to 4 and more preferably 0.

Examples of the divalent linking group represented by A include an alkylene group, a cycloalkylene group, an ester bond, an amide bond, an ether bond, a urethane bond, a urea bond, and a combination thereof. The alkylene group is preferably an alkylene group having 1 to 10 carbon atoms and more preferably an alkylene group having 1 to 5 carbon atoms, examples of which include a methylene group, an ethylene group, and a propylene group.

In one embodiment of the present invention, A is preferably a single bond or an alkylene group.

Examples of the monocyclic ring containing a —O—C(=O)—O—, represented by Z, include a 5- to 7-membered ring in a cyclic carbonate ester represented by General Formula (a) in which $n_A$=2 to 4, preferably a 5- or 6-membered ring ($n_A$=2 or 3), and more preferably a 5-membered ring ($n_A$=2).

Examples of the polycyclic ring containing a —O—C(=O)—O—, represented by Z, may include a structure in which a cyclic carbonate ester represented by General Formula (a) and one or two or more other ring structures are combined together to form a fused ring, or a structure which forms a spiro ring. The "other ring structures" capable of forming a fused ring or a spiro ring may be an alicyclic hydrocarbon group, or an aromatic hydrocarbon group, or a heterocyclic ring.

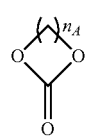

(a)

Monomers corresponding to the repeating unit represented by General Formula (A-1) can be synthesized by a conventionally known method described in, for example, Tetrahedron Letters, Vol. 27, No. 32 p. 3741 (1986), Organic Letters, Vol. 4, No. 15 p. 2561 (2002), or the like.

The specific resin may contain one kind of the repeating unit represented by General Formula (A-1) or two or more kinds thereof.

In the specific resin, the content of the repeating unit having a cyclic carbonate ester structure (preferably, the repeating unit represented by General Formula (A-1)) is preferably 3 to 80 mol %, more preferably 3 to 60 mol %, still more preferably 3 to 45 mol %, particularly preferably 3 to 30 mol %, and most preferably 10 to 15 mol %, with respect to the total repeating units constituting the specific resin. By setting the content of the repeating unit to such a range, a developability, a low defectivity, a low Line Width Roughness (LWR), a low Post Exposure Bake (PEB) temperature dependence, a profile, and the like as a resist may be improved.

Specific examples of the repeating unit represented by General Formula (A-1) (repeating units (A-1a) to (A-1w)) are shown below, but the present invention is not limited thereto.

Further, $R_A^1$ in the following specific examples has the same definition as $R_A^1$ in General Formula (A-1).
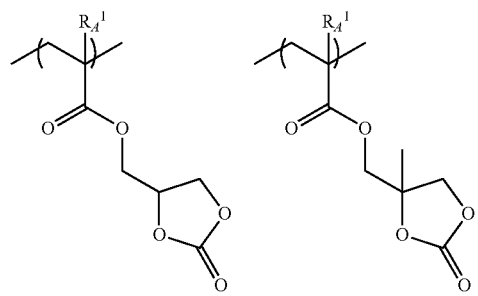
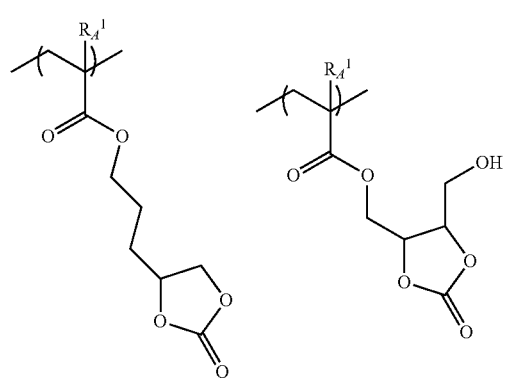
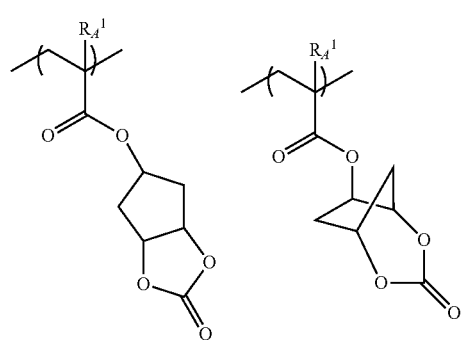
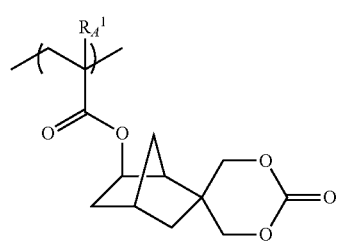
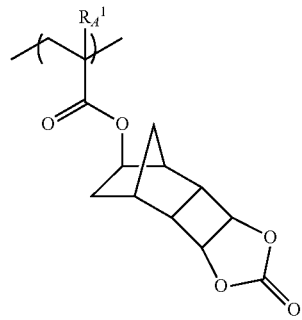
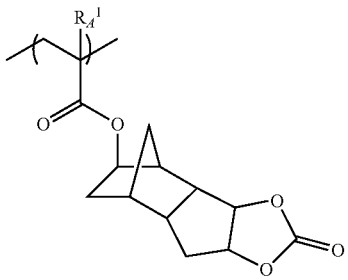
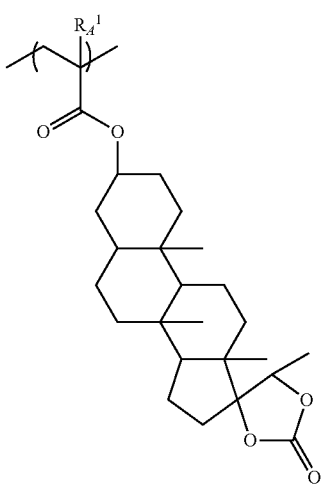
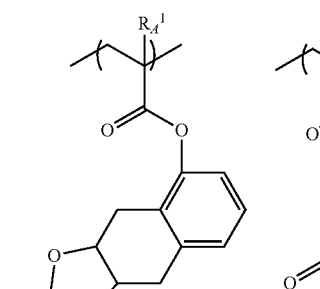
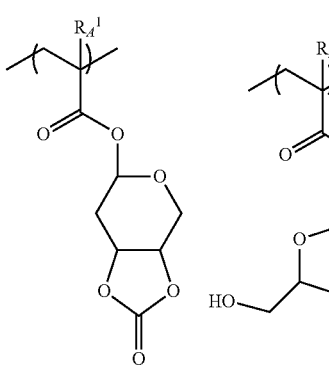

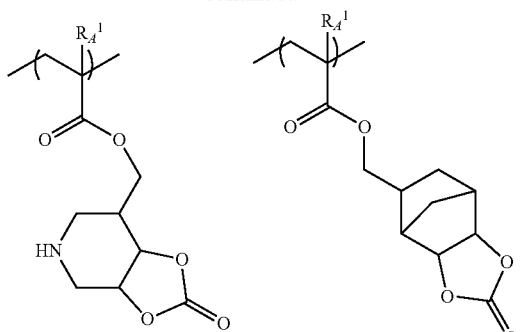

It is preferred that the specific resin has a repeating unit having a hydroxyl group or a cyano group other than the repeating units represented by General Formulae (AI) and (III). Thus, the adhesiveness to a substrate and the affinity to a developer are improved. The repeating unit having a hydroxyl group or a cyano group is preferably a repeating unit having an alicyclic hydrocarbon structure substituted with a hydroxyl group or a cyano group and preferably has no acid-decomposable group. In the alicyclic hydrocarbon structure substituted with a hydroxyl group or a cyano group, the alicyclic hydrocarbon structure is preferably an adamantyl group, a diadamantyl group, or a norbornane group. The preferred alicyclic hydrocarbon structure substituted with a hydroxyl group or a cyano group is preferably structures represented by the following general formulae.

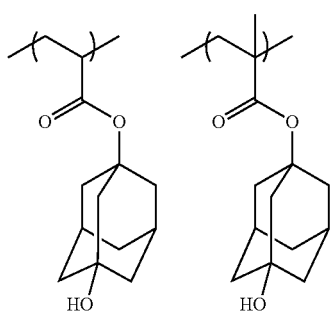

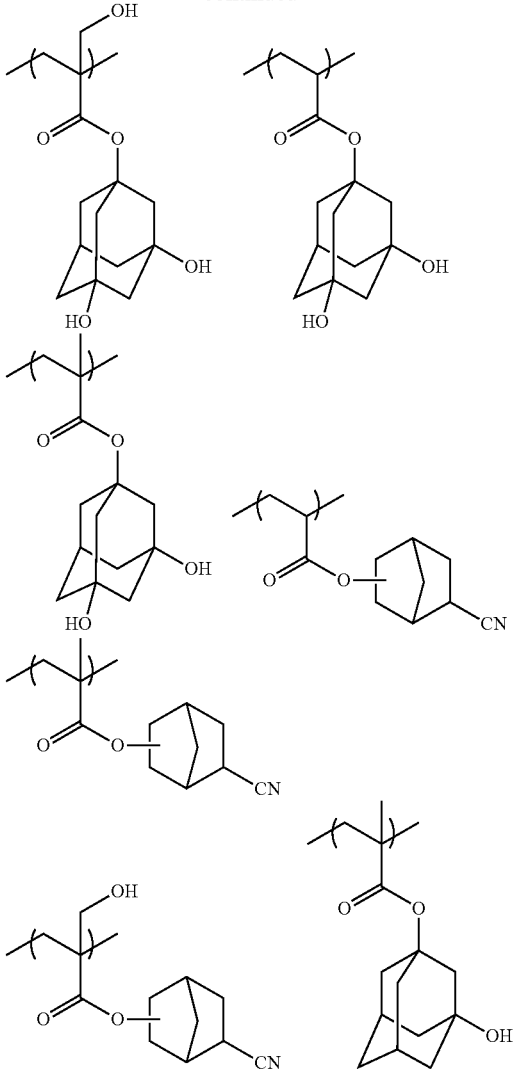

The content of the repeating unit having a hydroxyl group or a cyano group is preferably 5 to 40 mol %, more preferably 5 to 30 mol %, and still more preferably 10 to 25 mol %, with respect to the total repeating units in the specific resin.

Specific examples of the repeating unit having a hydroxyl group or a cyano group include repeating units disclosed in paragraph "0340" of US2012/0135348A, but the present invention is not limited thereto.

The specific resin used in the actinic ray-sensitive or radiation-sensitive resin composition of the present invention may contain a repeating unit having an alkali-soluble group. Examples of the alkali-soluble group include a carboxyl group, a sulfonamido group, a sulfonylimido group, a bisulfonylimido group, and an aliphatic alcohol substituted at its α-position with an electron-withdrawing group (for example, a hexafluoroisopropanol group). The specific resin more preferably contains a repeating unit having a carboxyl group. The incorporation of the repeating unit having an alkali-soluble group leads to increased resolution in contact hole applications. The repeating unit having an alkali-soluble group is preferably any of a repeating unit in which the alkali-soluble group is directly bonded to the main chain of a resin such as a repeating unit formed of acrylic acid or methacrylic acid, a repeating unit in which the alkali-soluble group is bonded through a linking group to the main chain of a resin, and a repeating unit in which the alkali-soluble group is introduced at the terminal of a polymer chain by the use of a polymerization initiator or chain transfer agent having an alkali-soluble group at the time of polymerization. The linking group may have a monocyclic or polycyclic cyclohydrocarbon structure. The repeating unit formed of acrylic acid or methacrylic acid is particularly preferred.

The content of the repeating unit having an alkali-soluble group is preferably 0 to 20 mol %, more preferably 3 to 15 mol %, and still more preferably 5 to 10 mol %, with respect to the total repeating units in the specific resin.

Specific examples of the repeating unit having an alkali-soluble group include repeating units disclosed in paragraph "0344" of US2012/0135348A, but the present invention is not limited thereto.

The specific resin of the present invention may contain a repeating unit which further has an alicyclic hydrocarbon structure having no polar group (for example, the above-mentioned alkali-soluble group, hydroxyl group, or cyano group) and does not exhibit acid decomposability. An example of such a repeating unit may be a repeating unit represented by General Formula (IV).

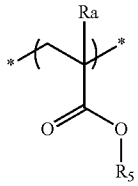

In General Formula (IV), $R_5$ represents a hydrocarbon group having at least one cyclic structure and having no polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group, or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms and more preferably a cyclopentyl group or a cyclohexyl group.

The polycyclic hydrocarbon group includes a ring-aggregated hydrocarbon group and a bridged cyclic hydrocarbon group, and examples of the ring-aggregated hydrocarbon group include a bicyclohexyl group and a perhydronaphthalenyl group. Examples of the bridged cyclic hydrocarbon ring include a bicyclic hydrocarbon ring such as a pinane ring, a bornane ring, a norpinane ring, a norbornane ring, or a bicyclooctane ring (a bicyclo[2.2.2]octane ring, a bicyclo[3.2.1]octane ring, or the like), a tricyclic hydrocarbon ring such as a homobledane ring, an adamantane ring, a tricyclo[5.2.1.0$^{2,6}$]decane ring, or a tricyclo[4.3.1.1$^{2,5}$]undecane ring, and a tetracyclic hydrocarbon ring such as a tetracyclo[4.4.0.1$^{2,5}$.1$^{7,10}$]dodecane ring or a perhydro-1,4-methano-5,8-methanonaphthalene ring. Furthermore, the bridged cyclic hydrocarbon ring also includes a fused cyclic hydrocarbon ring, for example, a fused ring obtained by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring.

Preferred examples of the bridged cyclic hydrocarbon ring include a norbornyl group, an adamantyl group, a bicyclooctanyl group, and a tricyclo[5,2,1,0$^{2,6}$]decanyl group. More preferred examples of the bridged cyclic hydrocarbon ring include a norbornyl group and an adamantyl group.

The alicyclic hydrocarbon groups may have a substituent, and preferred examples of the substituent include a halogen atom, an alkyl group, a hydroxyl group with a hydrogen atom being substituted, and an amino group with a hydrogen atom being substituted. Preferred examples of the halogen atom include a bromine atom, a chlorine atom, and a fluorine atom, and preferred examples of the alkyl group include a methyl group, an ethyl group, an n-butyl group, and a t-butyl group. The aforementioned alkyl group may further have a substituent, and examples of the substituent, which the alkyl group may further have, include a halogen atom, an alkyl group, a hydroxyl group with a hydrogen atom being substituted, and an amino group with a hydrogen atom being substituted.

Examples of the substituent for hydrogen atom include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include a methoxymethyl group, a methoxythiomethyl group, a benzyloxymethyl group, a t-butoxymethyl group, and a 2-methoxyethoxymethyl group, preferred examples of the substituted ethyl group include a 1-ethoxyethyl group and a 1-methyl-1-methoxyethyl group, preferred examples of the acyl group include an aliphatic acyl group having 1 to 6 carbon atoms, such as a formyl group, an acetyl group, a propionyl group, a butyryl group, an isobutyryl group, a valeryl group, or a pivaloyl group, and examples of the alkoxycarbonyl group include an alkoxycarbonyl group having 1 to 4 carbon atoms.

The specific resin may or may not contain a repeating unit which has a polar group-free alicyclic hydrocarbon structure and does not exhibit acid decomposability, and in the case where the specific resin contains such a repeating unit, the content of the repeating unit is preferably 1 to 40 mol % and more preferably 2 to 20 mol %, with respect to the total repeating units in the specific resin.

Specific examples of the repeating unit which has a polar group-free alicyclic hydrocarbon structure and does not exhibit acid decomposability include repeating units disclosed in paragraph "0354" of US2012/0135348A, but the present invention is not limited thereto.

The specific resin used in the method of the present invention may have, in addition to the above-described repeating structural units, various repeating structural units for the purpose of controlling dry etching resistance, suitability for a standard developer, adhesiveness to a substrate, and resist profile, and further resolution, heat resistance, sensitivity and the like, which are properties generally required for a resist. Examples of the repeating structural units include, but are not limited to, repeating structural units corresponding to the monomers described below.

Accordingly, the performances required for the specific resin used in the method of the present invention, particularly (1) solubility in a coating solvent, (2) film formability (glass transition temperature), (3) alkali developability, (4) film reduction (selection of a hydrophilic, hydrophobic or alkali-soluble group), (5) adhesiveness of unexposed portion to a substrate, and (6) dry etching resistance, and the like may be finely adjusted.

Examples of the monomer include a compound having one addition-polymerizable unsaturated bond selected from acrylic acid esters, methacrylic acid esters, acrylamides, methacrylamides, allyl compounds, vinyl ethers, vinyl esters, and the like.

In addition, as long as it is an addition-polymerizable unsaturated compound that is copolymerizable with the monomers corresponding to the above-described various repeating structural units, such a compound may be copolymerized.

The molar ratio of respective repeating structural units contained in the specific resin is appropriately set in order to control dry etching resistance, suitability for a standard developer, adhesiveness to a substrate, and resist profile of the resist, and further resolution, heat resistance, sensitivity, and the like which are performances generally required for the resist.

When the composition of the present invention is for ArF exposure, from the viewpoint of transparency to ArF light, the specific resin preferably substantially has no aromatic group. More specifically, in the total repeating units of the specific resin, the repeating unit having an aromatic group is preferably 5 mol % or less, more preferably 3 mol % or less, and ideally 0 mol %, that is, the specific resin still more preferably has no repeating unit having an aromatic group. Further, the specific resin preferably has a monocyclic or polycyclic alicyclic hydrocarbon structure.

Further, the specific resin preferably contains no fluorine atom and no silicon atom from the viewpoint of compatibility with a hydrophobic resin (D) to be described later.

The specific resin is preferably a resin in which the total repeating units consist of a (meth)acrylate-based repeating unit. In this case, any of a resin in which the total repeating units consist of a methacrylate-based repeating unit, a resin in which the total repeating units consist of an acrylate-based repeating unit, and a resin in which the total repeating units consist of a methacrylate-based repeating unit and an acrylate-based repeating unit may be used, but it is preferred that the acrylate-based repeating unit is 50 mol % or less of the total repeating units.

The specific resin can be synthesized in accordance with a conventional method (for example, radical polymerization). Examples of the general synthesis method include a bulk polymerization method in which polymerization is carried out by dissolving monomer species and an initiator in a solvent and heating the solution, and a dropwise addition polymerization method in which a solution of monomer species and an initiator is added dropwise to a heating solvent over 1 hour to 10 hours, with the dropwise addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents which dissolve the composition of the present invention, such as propylene glycol monomethyl ether acetate, propylene glycol monomethyl ether, and cyclohexanone, which will be described hereinafter. It is more preferred to carry out polymerization using the same solvent as the solvent used in the composition of the present invention. Thus, generation of particles during storage can be suppressed.

The polymerization reaction is preferably carried out under an inert gas atmosphere such as nitrogen or argon. As the polymerization initiator, a commercially available radical initiator (an azo-based initiator, peroxide, or the like) is used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methyl propionate). The initiator is added or added in portionwise, as desired. After the reaction has been completed, the reaction mixture is poured into a solvent, and then a desired polymer is recovered by a method such as powder or solid recovery. The concentration of the reactant is 5 to 50 mass % and preferably 10 to 30 mass %. The reaction temperature is usually 10° C. to 150° C., preferably 30° C. to 120° C., and more preferably 60° C. to 100° C.

As described above, the content of Si atoms in the specific resin is 1.0 to 30 mass %.

However, in the case where the above-mentioned repeating unit having an Si atom has a structure in which the polar group is protected by a leaving group which is capable of decomposing and leaving by the action of an acid and the leaving group has an Si atom, the content of Si atoms in the specific resin does not include the amount of Si atoms in the leaving group. That is, even if there are Si atoms in the leaving group, the amount of Si atoms is not included in the content of Si atoms in the specific resin.

For example, although the third repeating unit from the left of Comparative Resin 2 to be described later has an Si atom derived from a trimethylsilyl (TMS) group, since the repeating unit has a structure in which the polar group (—COOH) is protected with the following leaving group (*: bonding position), the amount of Si atoms derived from TMS in the leaving group is not included in the content of Si atoms in the specific resin.

The content of Si atoms in the specific resin is preferably 3 to 25 mass % and particularly preferably 5 to 20 mass %.

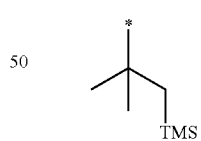

The weight-average molecular weight of the specific resin is preferably 1,000 to 200,000, more preferably 2,000 to 20,000, still more preferably 3,000 to 15,000, and particularly preferably 3,000 to 11,000. By setting the weight-average molecular weight to 1,000 to 200,000, it is possible to prevent deterioration of heat resistance and dry etching resistance and it is also possible to prevent deterioration of developability and deterioration of film formability due to an increase in viscosity.

A specific resin having a dispersity (molecular weight distribution) of usually 1.0 to 3.0, preferably 1.0 to 2.6, more preferably 1.0 to 2.0, and particularly preferably 1.1 to 2.0 is used. A resin having a smaller molecular weight distribution can bring about superior resolution, resist shape, smoothness in the side wall of a resist pattern, and roughness.

In the present specification, the weight-average molecular weight (Mw) and dispersity are values in terms of standard polystyrene, as determined by gel permeation chromatography (GPC) under the following conditions.

Column: TSK gel Multipore HXL-M (manufactured by Tosoh Corporation, 7.8 mmID×30.0 cm)
Development solvent: tetrahydrofuran (THF)
Column temperature: 40° C.
Flow rate: 1 ml/min
Sample injection volume: 10 μl
Apparatus: HLC-8120 (manufactured by Tosoh Corporation)

The content of the specific resin in the total solid content of the composition of the present invention is 20 mass % or more, preferably 40 mass % or more, more preferably 60 mass % or more, and still more preferably 80 mass % or more. The upper limit is not particularly limited but it is preferably 90 mass % or less.

In the present invention, the specific resin may be used alone or in combination of a plurality thereof.

[2] Compound capable of generating acid upon irradiation with actinic rays or radiation The composition of the present invention contains a compound capable of generating an acid upon irradiation with actinic rays or radiation (hereinafter, also referred to as an "acid generator"). The acid generator is not particularly limited, but it is preferably a compound capable of generating an organic acid upon irradiation with actinic rays or radiation.

The acid generator that can be used may be appropriately selected from known compounds capable of generating an acid upon irradiation with actinic rays or radiation, and mixtures thereof, which have been used in a photocationic polymerization photoinitiator, a photoradical polymerization photoinitiator, a dye photodecolorizer, a photodiscolorizer, a microresist, or the like, examples of which include the compounds described in paragraphs <0039> to <0103> of JP2010-61043A and the compounds described in paragraphs <0284> to <0389> of JP2013-4820A, but the present invention is not limited thereto.

Examples of the acid generator include a diazonium salt, a phosphonium salt, a sulfonium salt, an iodonium salt, imidosulfonate, oxime sulfonate, diazodisulfone, disulfone, and o-nitrobenzyl sulfonate.

Preferred examples of the acid generator contained in the composition of the present invention include a compound (specific acid generator) capable of generating an acid upon irradiation with actinic rays or radiation, which is represented by General Formula (3).

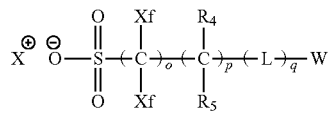

(3)

(Anion)
In General Formula (3)
Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in the case where there are a plurality of $R_4$'s and $R_5$'s, the $R_4$'s and $R_5$'s may be respectively the same or different.

L represents a divalent linking group, and in the case where there is a plurality of L's, the L's may be the same or different.

W represents an organic group containing a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms in the alkyl group is preferably 1 to 10 and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. In particular, it is preferred that both Xf's are a fluorine atom.

$R_4$ and $R_5$ each independently represent a hydrogen atom, a fluorine atom, an alkyl group, or an alkyl group substituted with at least one fluorine atom, and in the case where there are a plurality of $R_4$'s and $R_5$'s, the $R_4$'s and $R_5$'s may be respectively the same or different.

The alkyl group as $R_4$ and $R_5$ may have a substituent and preferably has 1 to 4 carbon atoms. $R_4$ and $R_5$ are preferably a hydrogen atom.

Specific examples and preferred embodiments of the alkyl group substituted with at least one fluorine atom are the same as the specific examples and preferred embodiments of Xf in General Formula (3).

L represents a divalent linking group and in the case where there is a plurality of L's, the L's may be the same or different.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), and a divalent linking group formed by combining a plurality of these groups. Among them, COO—, —OCO—, —CONH—, —NHCO—, —CO—, —O—, —SO$_2$—, —COO-alkylene group-, —OCO-alkylene group-, —CONH-alkylene group- or —NHCO-alkylene group- is preferred, and —COO—, —OCO—, —CONH—, —SO$_2$—, —COO-alkylene group- or —OCO-alkylene group- is more preferred.

W represents an organic group containing a cyclic structure. In particular, a cyclic organic group is preferred.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among them, an alicyclic group with a bulky structure having 7 or more carbon atoms, such as a norbornyl group, a tricyclodecanyl group, a tetracyclodecanyl group, a tetracyclododecanyl group, and an adamantyl group, is preferred from the viewpoint of suppression of diffusion in the film during a post-exposure baking (PEB) step and improvement of Mask Error Enhancement Factor (MEEF).

The aryl group may be monocyclic or polycyclic. Examples of the aryl group include a phenyl group, a naphthyl group, a phenanthryl group, and an anthryl group. Among them, a naphthyl group having a relatively low light absorbance at 193 nm is preferred.

The heterocyclic group may be monocyclic or polycyclic, but a polycyclic heterocyclic group may further suppress the diffusion of an acid. In addition, the heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring having no aromaticity include a tetrahydropyran ring, a lactone ring, a sultone ring, and a decahydroisoquinoline ring. The heterocyclic ring in the heterocyclic group is particularly preferably a furan ring, a thiophene ring, a pyridine ring, or a decahydroisoquinoline ring. Furthermore, examples of the lactone ring or the sultone ring include the above-described lactone structure and sultone structure exemplified in the resin.

The cyclic organic group may have a substituent. Examples of the substituent include an alkyl group (which may be linear or branched, and preferably has 1 to 12 carbon atoms), a cycloalkyl group (which may be monocyclic, polycyclic or spirocyclic, and preferably has 3 to 20 carbon atoms), an aryl group (which preferably has 6 to 14 carbon atoms), a hydroxyl group, an alkoxy group, an ester group, an amido group, a urethane group, a ureido group, a thioether group, a sulfonamido group, and a sulfonate ester group. Furthermore, the carbon constituting the cyclic organic group (the carbon contributing to ring formation) may be carbonyl carbon.

o represents an integer of 1 to 3. p represents an integer of 0 to 10. q represents an integer of 0 to 10.

In one embodiment, it is preferred that o in General Formula (3) is an integer of 1 to 3, p is an integer of 1 to 10, and q is 0. Xf is preferably a fluorine atom, and both of $R_4$ and $R_5$ are preferably a hydrogen atom, and W is preferably a polycyclic hydrocarbon group. o is more preferably 1 or 2 and still more preferably 1. p is more preferably an integer of 1 to 3, still more preferably 1 or 2, and particularly preferably 1. W is more preferably a polycyclic cycloalkyl group and still more preferably an adamantyl group or a diamantyl group.

In General Formula (3), $SO^{3-}$—$CF_2$—$CH_2$—OCO—, $SO^{3-}$—$CF_2$—CHF—$CH_2$—OCO—, $SO^{3-}$—$CF_2$—OCO—, $SO^{3-}$—$CF_2$—$CF_2$—$CH_2$—, or $SO^{3-}$—$CF_2$—CH(CF_3)—OCO— is preferred as a partial structure other than W.

(Cation)

In General Formula (3), $X^+$ represents a cation.

$X^+$ is not particularly limited as long as it is a cation, but a preferred embodiment thereof may be, for example, a cation (a moiety other than $Z^-$) in General Formula (ZI), (ZII) or (ZIII) to be described later.

PREFERRED EMBODIMENT

The preferred embodiment of the specific acid generator may be, for example, a compound represented by General Formula (ZI), (ZII), or (ZIII)

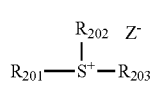

(ZI)

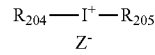

(ZII)

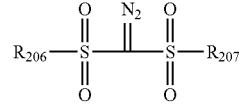

(ZIII)

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30 and preferably 1 to 20.

Furthermore, two of $R_{201}$ to $R_{203}$ may be bonded to each other to form a ring structure, and the ring may contain an oxygen atom, a sulfur atom, an ester bond, an amide bond, or a carbonyl group. The group formed by bonding of two of $R_{201}$ to $R_{203}$ may be, for example, an alkylene group (for example, a butylene group or a pentylene group).

$Z^-$ represents an anion in General Formula (3), and specifically represents the following anion.

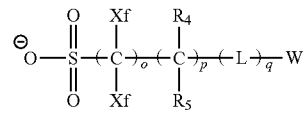

Examples of the organic group represented by $R_{201}$, $R_{202}$, and $R_{203}$ include corresponding groups in the compounds (ZI-1), (ZI-2), (ZI-3), and (ZI-4) to be described below.

Meanwhile, a compound having a plurality of structures represented by General Formula (ZI) may be used. For example, it is possible to use a compound having a structure in which at least one of $R_{201}$, $R_{202}$, or $R_{203}$ in a compound represented by General Formula (ZI) is bonded to at least one of $R_{201}$, $R_{202}$, or $R_{203}$ in another compound represented by General Formula (ZI) through a single bond or a linking group.

Examples of a more preferred (ZI) component include compounds (ZI-1), (ZI-2), (ZI-3), and (ZI-4) to be described below.

First, a compound (ZI-1) will be described.

The compound (ZI-1) is an arylsulfonium compound in which at least one of $R_{201}$, $R_{202}$, or $R_{203}$ in General Formula (ZI) is an aryl group, that is, a compound having arylsulfonium as a cation.

In the arylsulfonium compound, all of $R_{201}$ to $R_{203}$ may be an aryl group or some of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group and more preferably a phenyl group. The aryl group may be an aryl group having a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, the two or more aryl group may be the same or different.

The alkyl group or the cycloalkyl group, which the arylsulfonium compound has, if necessary, is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, alkyl group or cycloalkyl group of $R_{201}$ to $R_{203}$ may have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

Next, a compound (ZI-2) will be described.

The compound (ZI-2) is a compound in which $R_{201}$ to $R_{203}$ in General Formula (ZI) each independently represent an organic group having no aromatic ring. Here, the aromatic ring also includes an aromatic ring containing a heteroatom.

The organic group containing no aromatic ring as $R_{201}$ to $R_{203}$ has generally 1 to 30 carbon atoms and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferable examples of the alkyl group and cycloalkyl group of $R_{201}$ to $R_{203}$ include a linear or branched alkyl group having 1 to 10 carbon atoms (for example, a methyl group, an ethyl group, a propyl group, a butyl group, or a pentyl group), and a cycloalkyl group having 3 to 10 carbon atoms (a cyclopentyl group, a cyclohexyl group, or a norbornyl group).

$R_{201}$ to $R_{203}$ may be further substituted with a halogen atom, an alkoxy group (for example, having 1 to 5 carbon atoms), a hydroxyl group, a cyano group, or a nitro group.

Next, a compound (ZI-3) will be described.

The compound (ZI-3) is a compound represented by General Formula (ZI-3) and is a compound having a phenacylsulfonium salt structure.

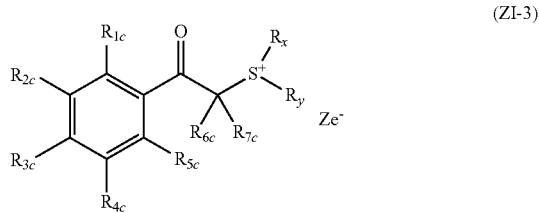

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}$ to $R_{5c}$, $R_{5c}$ and $R_{bc}$, $R_{bc}$ and $R_{7c}$, $R_{5c}$ and $R_x$, and $R_x$ and $R_y$ may be respectively bonded to each other to form a ring structure, and the ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocyclic ring, and a polycyclic fused ring formed by combining two or more of these rings. The ring structure includes a 3- to 10-membered ring and is preferably a 4- to 8-membered ring and more preferably a 5- or 6-membered ring.

Examples of the group formed by bonding of any two or more of $R_{1c}$ to $R_{5c}$, $R_{bc}$ and $R_{7c}$, and $R_x$ and $R_y$ to each other include a butylene group and a pentylene group.

The group formed by bonding of $R_{5c}$ and $R_{bc}$, and $R_{5c}$ and $R_x$ to each other is preferably a single bond or an alkylene group, and examples of the alkylene group include a methylene group and an ethylene group.

$Zc^-$ represents an anion in General Formula (3), which is specifically as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) in the present invention include the cations described in paragraph <0036> of the specification of US2012/0076996A.

Next, a compound (ZI-4) will be described.

The compound (ZI-4) is represented by General Formula (ZI-4).

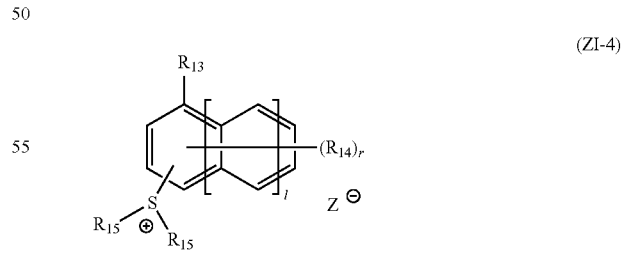

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In the case where a plurality of $R_{14}$'s is present, $R_{14}$'s each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. When two $R_{15}$'s are bonded to each other to form a ring, the ring skeleton may contain a heteroatom such as an oxygen atom or a nitrogen atom. In one embodiment, it is preferred that two $R_{15}$'s are an alkylene group and are bonded to each other to form a ring structure.

l represents an integer of 0 to 2.

r represents an integer of 0 to 8.

$Z^-$ represents an anion in General Formula (3), which is specifically as described above.

In General Formula (ZI-4), the alkyl group of $R_{13}$, $R_{14}$, and $R_{15}$ is preferably a linear or branched alkyl group having 1 to 10 carbon atoms, which is preferably a methyl group, an ethyl group, an n-butyl group, or a t-butyl group.

Examples of the cation of the compound represented by General Formula (ZI-4) in the present invention include the cations described in paragraphs <0121>, <0123> and <0124> of JP2010-256842A and paragraphs <0127>, <0129> and <0130> of JP2011-76056A.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group and more preferably a phenyl group. The aryl group of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

The alkyl group and the cycloalkyl group in $R_{204}$ to $R_{207}$ are preferably a linear or branched alkyl group having 1 to 10 carbon atoms (for example, a methyl group, an ethyl group, a propyl group, a butyl group, or a pentyl group) and a cycloalkyl group having 3 to 10 carbon atoms (for example, a cyclopentyl group, a cyclohexyl group, or a norbornyl group).

The aryl group, the alkyl group and the cycloalkyl group of $R_{204}$ to $R_{207}$ may have a substituent. Examples of the substituent which may be possessed by the aryl group, the alkyl group and the cycloalkyl group of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), which is specifically as described above.

The acid generator (which includes a specific acid generator. The same shall apply hereinafter) may be in the form of a low molecular weight compound or may be in the form of being incorporated into a portion of a polymer. Further, a form of a low molecular weight compound and a form of being incorporated into a portion of a polymer may be used in combination.

In the case where the acid generator is in the form of a low molecular weight compound, the molecular weight thereof is preferably 580 or more, more preferably 600 or more, still more preferably 620 or more, and particularly preferably 640 or more. The upper limit of the molecular weight is not particularly limited, but it is preferably 3,000 or less, more preferably 2,000 or less, and still more preferably 1,000 or less.

In the case where the acid generator is in the form of being incorporated into a portion of a polymer, the acid generator may be incorporated into a portion of the above-described resin which may be incorporated into a resin different therefrom.

The acid generator may be synthesized by a known method, and can be synthesized, for example, according to the method described in JP2007-161707A.

The acid generator may be used alone or in combination of two or more thereof.

The content of the acid generator (total content of the acid generators in the case where plural kinds thereof are present) in the composition is preferably 0.1 to 30 mass %, more preferably 0.5 to 25 mass %, still more preferably 3 to 20 mass %, and particularly preferably 3 to 15 mass %, based on the total solid content of the composition.

In the case where the compound represented by General Formula (ZI-3) or (ZI-4) is included as the acid generator, the content of the acid generator (total content of the acid generators in the case where plural kinds thereof are present) contained in the composition is preferably 1.5 to 35 mass %, more preferably 5 to 35 mass %, still more preferably 8 to 30 mass %, even more preferably 9 to 30 mass %, and particularly preferably 9 to 25 mass %, based on the total solid content of the composition.

[3] Hydrophobic Resin

The composition of the present invention may contain a hydrophobic resin (hereinafter, also referred to as a "hydrophobic resin (D)" or simply a "resin (D)"). Incidentally, it is preferred that the hydrophobic resin (D) is different from the specific resin.

It is preferred that the hydrophobic resin (D) is designed to be unevenly distributed to the interface, but in contrast to a surfactant, the hydrophobic resin (D) is not necessarily required to have a hydrophilic group in the molecule thereof, and may not contribute to uniform mixing of polar/nonpolar materials.

The effect of adding a hydrophobic resin includes control of the static/dynamic contact angle of the resist film surface with respect to water, improved followability of the immersion liquid, suppression of outgas sing, and the like.

From the viewpoint of uneven distribution to the film surface layer, it is preferred that the hydrophobic resin (D) contains one or more of a "fluorine atom", a "silicon atom" and a "$CH_3$ partial structure contained in the side chain portion of the resin", and it is more preferred that the hydrophobic resin (D) contains two or more thereof.

In the case where the hydrophobic resin (D) contains a fluorine atom and/or a silicon atom, the fluorine atom and/or silicon atom in the hydrophobic resin (D) may be contained in the main chain of the resin or may be contained in the side chain of the resin.

In the case where the hydrophobic resin (D) contains a fluorine atom, the resin preferably contains a fluorine atom-containing alkyl group, a fluorine atom-containing cycloalkyl group or a fluorine atom-containing aryl group, as a fluorine atom-containing partial structure.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom and which may further have a substituent other than a fluorine atom.

The fluorine atom-containing cycloalkyl group and the fluorine atom-containing aryl group are respectively a cycloalkyl group in which one hydrogen atom is substituted with a fluorine atom and an aryl group which contains a fluorine atom, each of which may further have a substituent other than a fluorine atom.

Preferred examples of the fluorine atom-containing alkyl group, the fluorine atom-containing cycloalkyl group, and the fluorine atom-containing aryl group include groups represented by General Formulae (F2) to (F4), but the present invention is not limited thereto.

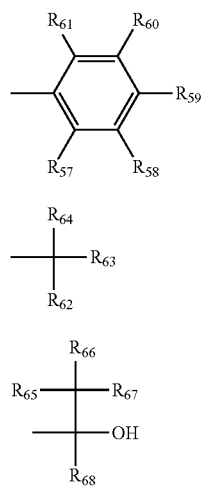

In General Formulae (F2) to (F4), $R_{57}$ to $R_{68}$ each independently represent a hydrogen atom, a fluorine atom, or an alkyl group (linear or branched), provided that at least one of $R_{57}$, $R_{58}$, $R_{59}$, $R_{60}$, or $R_{61}$, at least one of $R_{62}$, $R_{63}$, or $R_{64}$, and at least one of $R_{65}$, $R_{66}$, $R_{67}$, or $R_{68}$ each independently represent a fluorine atom or an alkyl group (preferably having 1 to 4 carbon atoms) in which at least one hydrogen atom is substituted with a fluorine atom.

It is preferred that all of $R_{57}$ to $R_{61}$ and $R_{65}$ to $R_{67}$ are a fluorine atom. $R_{62}$, $R_{63}$, and $R_{68}$ are preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be bonded to each other to form a ring.

The hydrophobic resin (D) may contain a silicon atom. The resin preferably has an alkylsilyl structure (preferably a trialkylsilyl group) or a cyclic siloxane structure, as a silicon atom-containing partial structure.

Examples of the repeating unit having a fluorine atom or a silicon atom include those exemplified in paragraph [0519] of US2012/0251948A1.

As mentioned above, it is also preferred that the hydrophobic resin (D) contains a $CH_3$ partial structure in the side chain portion thereof.

As used herein, the $CH_3$ partial structure that the hydrophobic resin (D) has in the side chain portion thereof (hereinafter simply referred to as "side chain $CH_3$ partial structure") is intended to include a $CH_3$ partial structure that an ethyl group, a propyl group, or the like has.

On the other hand, a methyl group directly bonded to the main chain of the hydrophobic resin (D) (for example, α-methyl group in the repeating unit having a methacrylic acid structure) makes only a small contribution to surface localization of the hydrophobic resin (D) owing to influence of the main chain, and therefore it is not included in the $CH_3$ partial structure in the present invention.

More specifically, in the case where the hydrophobic resin (D) contains a repeating unit derived from a monomer having a polymerizable moiety with a carbon-carbon double bond, such as a repeating unit represented by, for example, the following General Formula (M), if each of $R_{11}$ to $R_{14}$ is $CH_3$ itself, such $CH_3$ is not included in the $CH_3$ partial structure contained in the side chain in the present invention.

On the other hand, it is assumed that the $CH_3$ partial structure existing from the C—C main chain through some atom corresponds to the $CH_3$ partial structure in the present invention. For example, in the case where $R_{11}$ is an ethyl group ($CH_2CH_3$), it is assumed to have "one" $CH_3$ partial structure in the present invention.

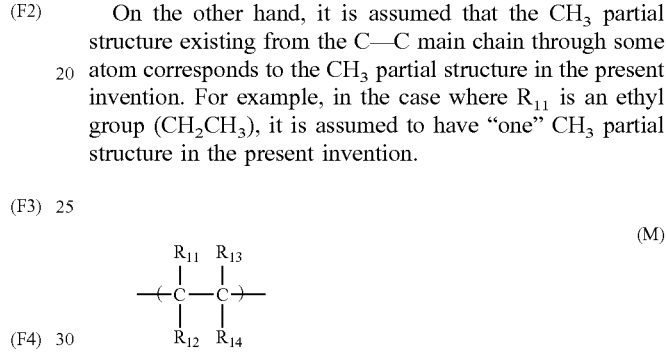

In General Formula (M), $R_{11}$ to $R_{14}$ each independently represent a side chain portion.

Examples of $R_{11}$ to $R_{14}$ of the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

It is preferred that the hydrophobic resin (D) is a resin containing a repeating unit having a $CH_3$ partial structure in the side chain portion thereof, and it is more preferred that such a repeating unit includes at least one repeating unit (x) of a repeating unit represented by General Formula (II) and a repeating unit represented by General Formula (III).

Hereinafter, the repeating unit represented by General Formula (II) will be described in detail.

In General Formula (II), $X_{b1}$ represents a hydrogen atom, an alkyl group, a cyano group, or a halogen atom, and $R_2$ represents an organic group which has one or more $CH_3$ partial structures and is stable to an acid. Here, more specifically, the organic group stable to an acid is preferably an organic group which does not have an "acid-decomposable group" described in the resin P.

The alkyl group of $X_{b1}$ is preferably an alkyl group having 1 to 4 carbon atoms, and examples thereof include a methyl group, an ethyl group, a propyl group, a hydroxymethyl group, and trifluoromethyl group, among which a methyl group is preferred.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of $CH_3$ partial structures contained in the organic group having one or more $CH_3$ partial structures and stable to an acid, which is represented by $R_2$, is preferably 2 or more and 10 or less and more preferably 2 or more and 8 or less.

Preferred specific examples of the repeating unit represented by General Formula (II) are shown below, but the present invention is not limited thereto.

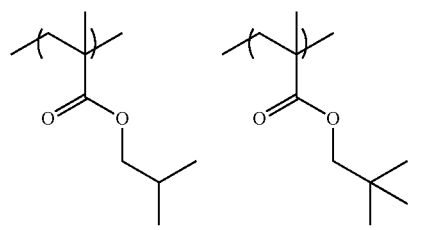

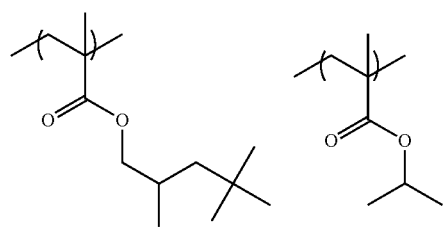

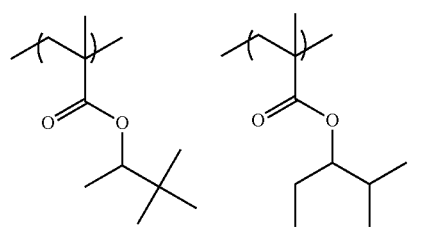

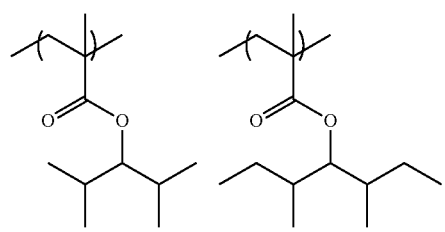

-continued

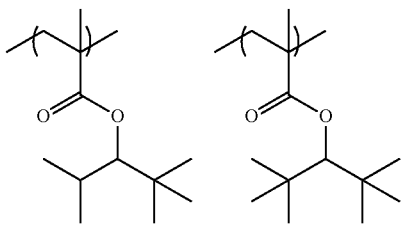

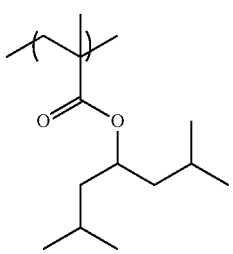

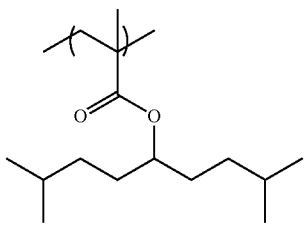

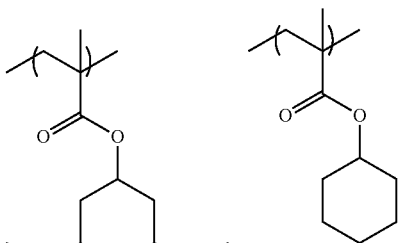

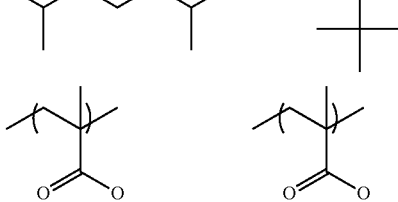

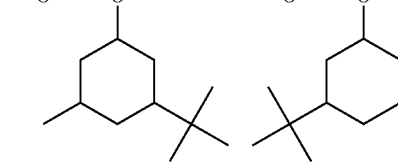

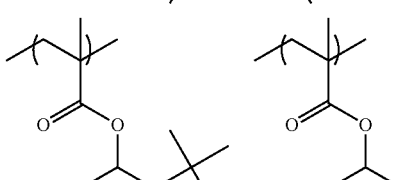

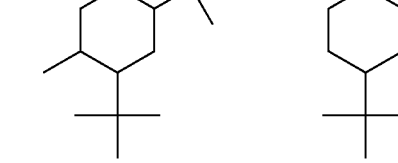

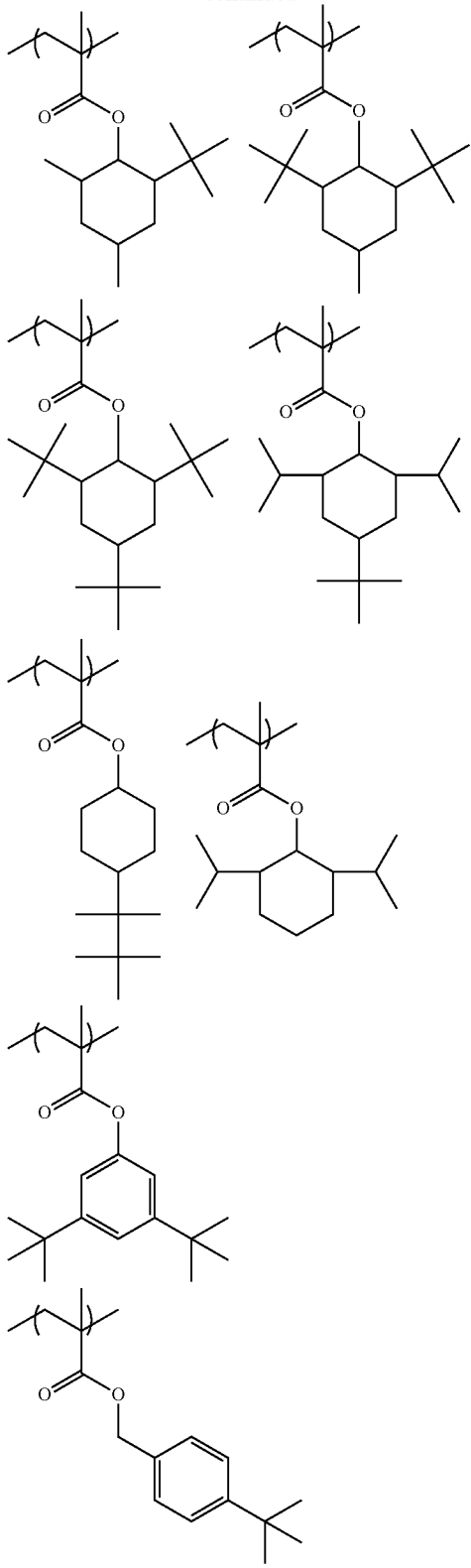

The repeating unit represented by General Formula (II) is preferably a repeating unit which is stable to an acid (non-acid-decomposable), and more specifically, it is a repeating unit which is free of a group capable of decomposing by the action of an acid to generate a polar group.

Hereinafter, the repeating unit represented by General Formula (III) will be described in detail.

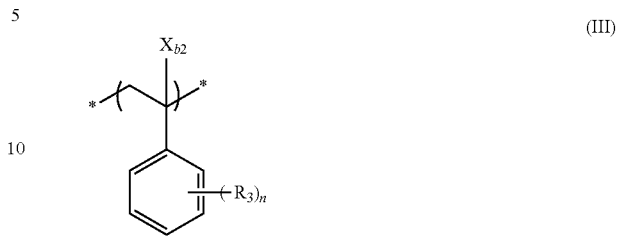

In General Formula (III), $X_{b2}$ represents a hydrogen atom, an alkyl group, a cyano group, or a halogen atom, $R_3$ represents an organic group which has one or more $CH_3$ partial structures and is stable to an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group. A hydrogen atom is preferred.

$X_{b2}$ is preferably a hydrogen atom.

$R_3$ is an organic group that is stable to an acid, so more specifically it is preferably an organic group which does not have an "acid-decomposable group" described in the resin P.

An example of $R_3$ may be an alkyl group having one or more $CH_3$ partial structures.

The number of the $CH_3$ partial structures contained in the organic group having one or more $CH_3$ partial structures and stable to an acid, which is represented by $R_3$, is preferably 1 or more and 10 or less, more preferably 1 or more and 8 or less, and still more preferably 1 or more and 4 or less.

n represents an integer of 1 to 5, preferably an integer of 1 to 3, and more preferably 1 or 2.

Preferred specific examples of the repeating unit represented by General Formula (III) are shown below, but the present invention is not limited thereto.

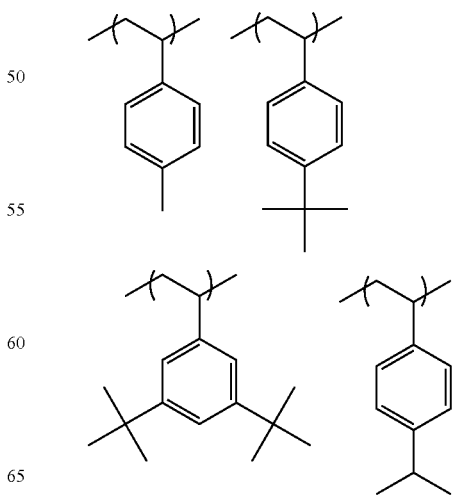

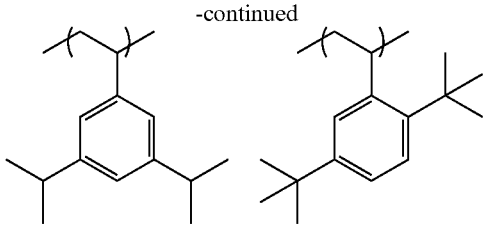

The repeating unit represented by General Formula (III) is preferably a repeating unit which is stable to an acid (non-acid-decomposable) and more specifically, it is preferably a repeating unit which is free of a group capable of decomposing by the action of an acid to generate a polar group.

In the case where the hydrophobic resin (D) contains a $CH_3$ partial structure in the side chain portion thereof and moreover in particular in the case where the hydrophobic resin (D) has no fluorine atom and no silicon atom, the content of at least one repeating unit (x) of the repeating unit represented by General Formula (II) and the repeating unit represented by General Formula (III) is preferably 90 mol % or more and more preferably 95 mol % or more, with respect to the total repeating units of the hydrophobic resin (D). Such a content is usually 100 mol % or less with respect to the total repeating units of the hydrophobic resin (D).

When the hydrophobic resin (D) contains at least one repeating unit (x) of the repeating unit represented by General Formula (II) and the repeating unit represented by General Formula (III) in an amount of 90 mol % or more with respect to the total repeating units of the hydrophobic resin (D), surface free energy of the hydrophobic resin (D) increases. As a result, it becomes difficult for the hydrophobic resin (D) to be unevenly distributed on the surface of the resist film and the static/dynamic contact angle of the resist film with respect to water is improved with certainty, thus resulting in improved followability of the immersion liquid.

In addition, the hydrophobic resin (D) may have at least one group selected from the group consisting of the following (x) to (z) in the case of containing (i) a fluorine atom and/or a silicon atom as well as in the case of containing (ii) a $CH_3$ partial structure in the side chain portion:

(x) an acid group,
(y) a lactone structure-containing group, an acid anhydride group, or an acid imide group,
(z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the acid group include a fluorinated alcohol group (preferably hexafluoroisopropanol), a sulfonimide group, and a bis(alkylcarbonyl)methylene group.

The repeating unit having (x) an acid group may be, for example, a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the terminal of the polymer chain by using an acid group-containing polymerization initiator or chain transfer agent at the polymerization. All of these cases are preferable. The repeating unit having (x) an acid group may have at least any one of a fluorine atom or a silicon atom.

The content of the repeating unit having (x) an acid group is preferably 1 to 50 mol %, more preferably 3 to 35 mol %, and still more preferably 5 to 20 mol %, with respect to the total repeating units in the hydrophobic resin (D).

Specific examples of the repeating unit having (x) an acid group are shown below, but the present invention is not limited thereto. In the formulae, Rx represents a hydrogen atom, $CH_3$, $CF_3$, or $CH_2OH$.

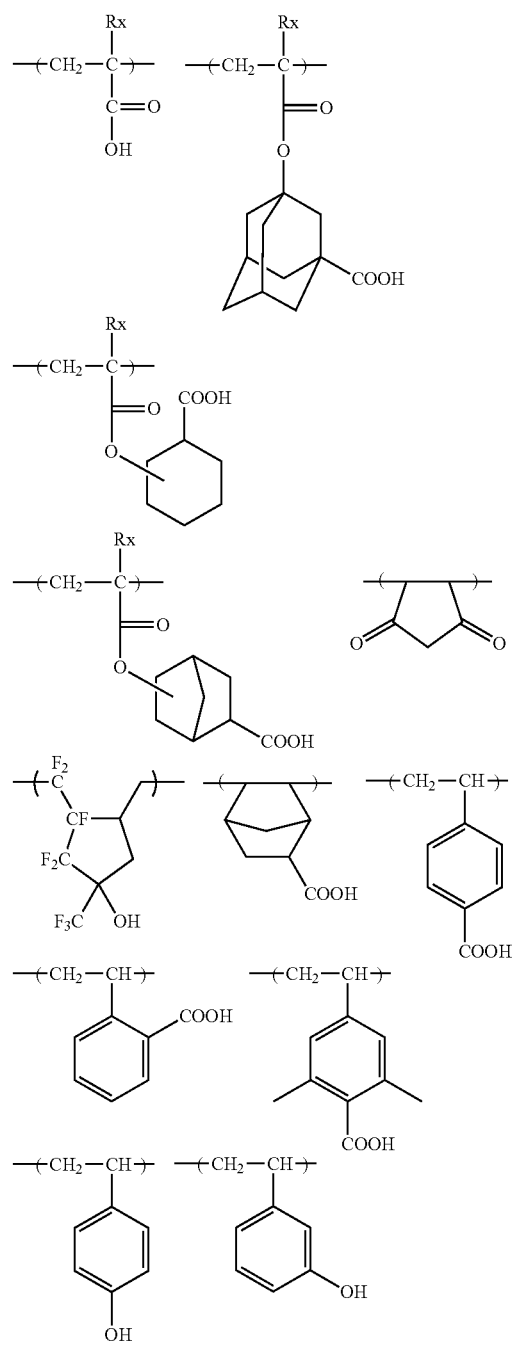

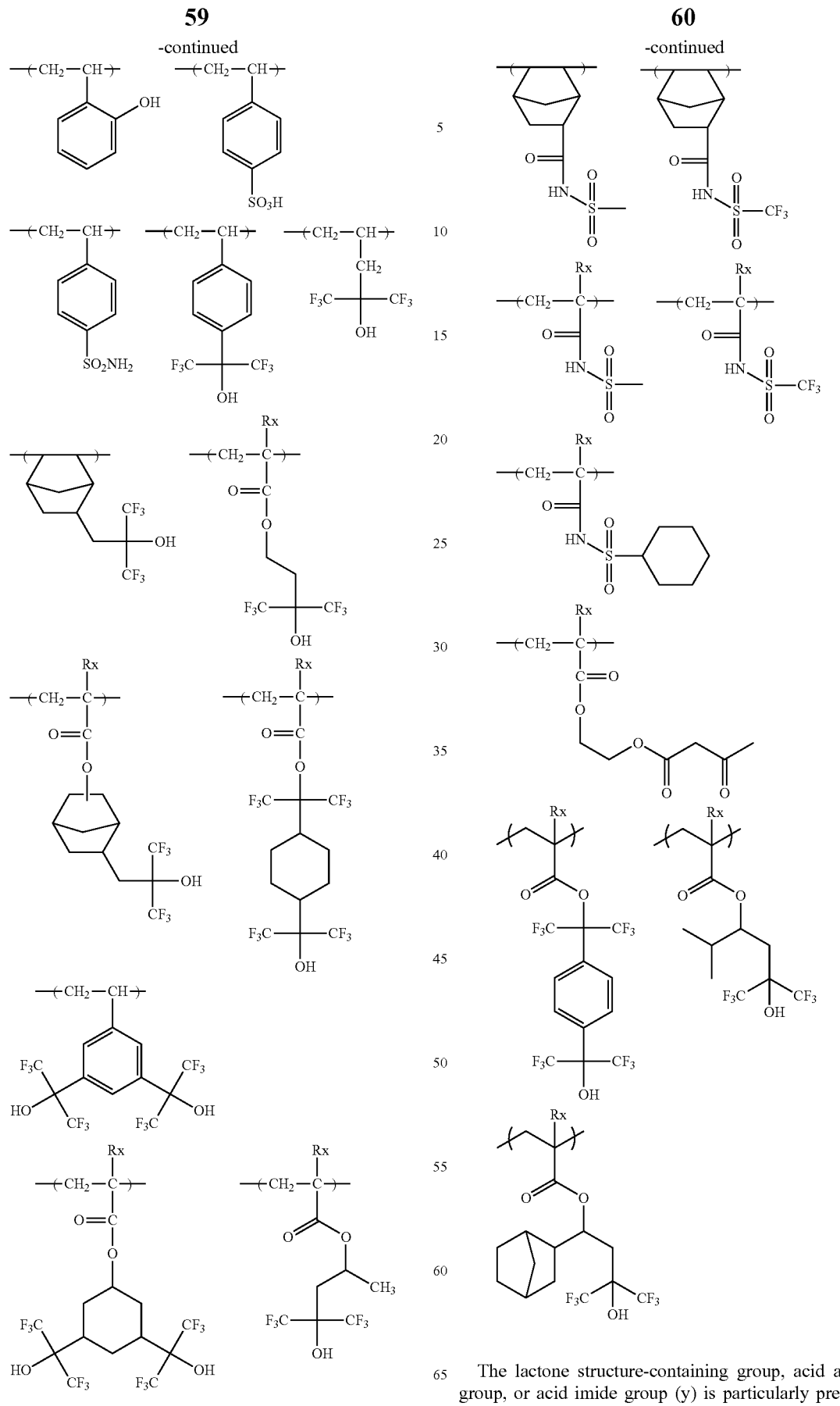
The lactone structure-containing group, acid anhydride group, or acid imide group (y) is particularly preferably a lactone structure-containing group.

The repeating unit containing such a group is, for example, a repeating unit in which the group is directly bonded to the main chain of the resin, such as a repeating unit of an acrylic acid ester or a methacrylic acid ester. This repeating unit may be a repeating unit in which the group is bonded to the main chain of the resin through a linking group. Alternatively, in this repeating unit, the group may be introduced into the terminal of the resin by using a polymerization initiator or chain transfer agent containing the group at the time of polymerization.

Examples of the repeating unit having a lactone structure-containing group are the same as those of the repeating unit having a lactone structure described in the section of Specific resin.

The content of the repeating unit having a lactone structure-containing group, acid anhydride group or acid imide group is preferably 1 to 100 mol %, more preferably 3 to 98 mol %, and still more preferably 5 to 95 mol %, based on the total repeating units in the hydrophobic resin (D).

Examples of the repeating unit having (z) a group capable of decomposing by the action of an acid, contained in the hydrophobic resin (D), include those of the repeating unit having an acid-decomposable group described in the section of Specific resin. The repeating unit having (z) a group capable of decomposing by the action of an acid may contain at least any one of a fluorine atom or a silicon atom. In the hydrophobic resin (D), the content of the repeating unit having (z) a group capable of decomposing by the action of an acid is preferably 1 to 80 mol %, more preferably 10 to 80 mol %, and still more preferably 20 to 60 mol %, with respect to the total repeating units in the resin (D).

The hydrophobic resin (D) may further have other repeating units than the repeating units described above.

The fluorine atom-containing repeating unit preferably accounts for 10 to 100 mol % and more preferably 30 to 100 mol %, based on the total repeating units contained in the hydrophobic resin (D). The silicon atom-containing repeating unit preferably accounts for 10 to 100 mol % and more preferably 20 to 100 mol %, based on the total repeating units contained in the hydrophobic resin (D).

On the other hand, in particular, in the case where the hydrophobic resin (D) contains a $CH_3$ partial structure in the side chain portion thereof, it is also preferred that the hydrophobic resin (D) has a form substantially free of both a fluorine atom and a silicon atom. In addition, it is preferred that the hydrophobic resin (D) is consisting substantially of a repeating unit whose constituent atom is only an atom selected from the group consisting of a carbon atom, an oxygen atom, a hydrogen atom, a nitrogen atom, and a sulfur atom.

The weight-average molecular weight of the hydrophobic resin (D) in terms of standard polystyrene is preferably 1,000 to 100,000 and more preferably 1,000 to 50,000.

As for the hydrophobic resin (D), one resin may be used or a plurality of resins may be used in combination.

The content of the hydrophobic resin (D) in the composition is preferably 0.01 to 10 mass % and more preferably 0.05 to 8 mass %, with respect to the total solid content in the composition of the present invention.

In the hydrophobic resin (D), the content of residual monomer or oligomer components is 0.01 to 5 mass % and more preferably 0.01 to 3 mass %. The molecular weight distribution (Mw/Mn, also referred to as "dispersity") is preferably in the range of 1 to 5 and more preferably in the range of 1 to 3.

As the hydrophobic resin (D), various commercial products may be used, or the resin may be synthesized by a conventional method (for example, radical polymerization).

[4] Acid diffusion control agent

The composition of the present invention preferably contains an acid diffusion control agent. The acid diffusion control agent acts as a quencher that traps acids generated from the acid generator or the like at the time of exposure and inhibits a reaction of the acid-decomposable resin in the unexposed area due to excess generated acids. As the acid diffusion control agent, a basic compound, a low molecular weight compound which has a nitrogen atom and a group capable of leaving by the action of an acid, a basic compound whose basicity decreases or disappears upon irradiation with actinic rays or radiation, or an onium salt which becomes a relatively weak acid with respect to the acid generator can be used.

Preferred examples of the basic compound include compounds having a structure represented by General Formulae (A) to (E).

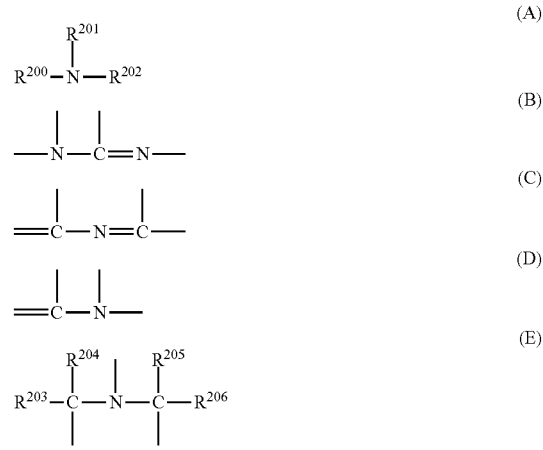

In General Formulae (A) and (E), $R^{200}$, $R^{201}$, and $R^{202}$ may be the same or different and each represent a hydrogen atom, an alkyl group (preferably having 1 to 20 carbon atoms), a cycloalkyl group (preferably having 3 to 20 carbon atoms), or an aryl group (having 6 to 20 carbon atoms). Here, $R^{201}$ and $R^{202}$ may be bonded to each other to form a ring.

$R^{203}$, $R^{204}$, $R^{205}$, and $R^{206}$ may be the same or different and each represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in General Formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in <0379> of US2012/0219913A1.

Preferable examples of the basic compound include an amine compound having a phenoxy group, an ammonium salt compound having a phenoxy group, an amine compound having a sulfonic acid ester group, and an ammonium salt compound having a sulfonic acid ester group.

These basic compounds may be used either alone or in combination of two or more thereof.

The composition of the present invention may or may not contain a basic compound and in the case of containing the basic compound, the content thereof is usually 0.001 to 10 mass % and preferably 0.01 to 5 mass %, based on the solid content of the composition.

The ratio of the acid generator to the basic compound in the composition is acid generator/basic compound (molar ratio) of preferably 2.5 to 300, more preferably 5.0 to 200, and still more preferably 7.0 to 150.

A low molecular weight compound having a nitrogen atom and a group capable of leaving by the action of an acid (hereinafter, also referred to as "compound (C)") is preferably an amine derivative having a group capable of leaving by the action of an acid on a nitrogen atom.

The group capable of leaving by the action of an acid is preferably an acetal group, a carbonate group, a carbamate group, a tertiary ester group, a tertiary hydroxyl group, or a hemiaminal ether group and particularly preferably a carbamate group or a hemiaminal ether group.

The molecular weight of the compound (C) is preferably 100 to 1,000, more preferably 100 to 700, and particularly preferably 100 to 500.

The compound (C) may contain a carbamate group having a protective group on a nitrogen atom. The protective group constituting the carbamate group may be represented by General Formula (d-1).

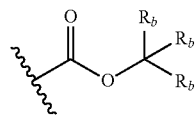

(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be bonded to each other to form a ring.

The alkyl group, cycloalkyl group, aryl group or aralkyl group represented by $R_b$ may be substituted with a functional group such as a hydroxyl group, a cyano group, an amino group, a pyrrolidino group, a piperidino group, a morpholino group, or an oxo group, an alkoxy group, or a halogen atom. The same shall also apply to the alkoxyalkyl group represented by $R_b$.

$R_b$ is preferably a linear or branched alkyl group, a cycloalkyl group, or an aryl group, and more preferably a linear or branched alkyl group or a cycloalkyl group.

Examples of the ring formed by bonding of two $R_b$'s to each other include an alicyclic hydrocarbon group, an aromatic hydrocarbon group, a heterocyclic hydrocarbon group and a derivative thereof.

The specific structure of the group represented by General Formula (d-1) includes, but is not limited to, the structure disclosed in paragraph <0466> of US2012/0135348A1.

The compound (C) particularly preferably has a structure represented by General Formula (6).

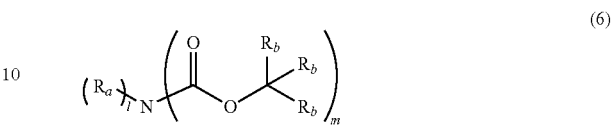

(6)

In General Formula (6), $R_a$ represents a hydrogen atom, an alkyl group, a cycloalkyl group, an aryl group, or an aralkyl group. When 1 is 2, two $R_a$'s may be the same or different and may be bonded to each other to form a heterocyclic ring together with a nitrogen atom in the formula. The heterocyclic ring may contain a heteroatom other than a nitrogen atom in the formula.

$R_b$ has the same definition as $R_b$ in General Formula (d-1), and a preferred example thereof is also the same.

1 is an integer of 0 to 2, m is an integer of 1 to 3, and 1+m=3.

In General Formula (6), the alkyl group, cycloalkyl group, aryl group, or aralkyl group represented by $R_a$ may be substituted with the same group as the group previously described as a group by which the alkyl group, cycloalkyl group, aryl group, or aralkyl group represented by $R_b$ may be substituted.

Specific examples of the alkyl group, cycloalkyl group, aryl group, or aralkyl group represented by $R_a$ (the alkyl group, cycloalkyl group, aryl group, or aralkyl group may be substituted with the above-described group) include the same groups as the specific examples as described above with respect to $R_b$.

Specific examples of the particularly preferred compound (C) in the present invention include, but are not limited to, the compounds disclosed in paragraph <0475> of US2012/0135348A1.

The compound represented by General Formula (6) can be synthesized in accordance with JP2007-298569A, JP2009-199021A, and the like.

In the present invention, the low molecular weight compound (C) having a group capable of leaving by the action of an acid on a nitrogen atom may be used alone or in combination of two or more thereof.

The content of the compound (C) in the composition of the present invention is preferably 0.001 to 20 mass %, more preferably 0.001 to 10 mass %, and still more preferably 0.01 to 5 mass %, based on the total solid content of the composition.

The basic compound whose basicity is reduced or lost upon irradiation with actinic rays or radiation (hereinafter, also referred to as "compound (PA)") is a compound which has a functional group with proton acceptor properties, and decomposes upon irradiation with actinic rays or radiation to exhibit deterioration in proton acceptor properties, no proton acceptor properties, or a change from the proton acceptor properties to acid properties.

The functional group with proton acceptor properties refers to a functional group having a group or an electron which is capable of electrostatically interacting with a proton, and, for example, means a functional group with a macrocyclic structure, such as a cyclopolyether, or a functional group containing a nitrogen atom with an unshared electron pair not contributing to π-conjugation. The nitrogen atom with an unshared electron pair not contributing to π-conjugation is, for example, a nitrogen atom having a partial structure represented by the formula shown in FIG. 1.

Preferred examples of the partial structure of the functional group with proton acceptor properties include crown ether, azacrown ether, primary to tertiary amine, pyridine, imidazole, and pyrazine structures.

The compound (PA) decomposes upon irradiation with actinic rays or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties refers to a change of proton acceptor properties due to the proton being added to the functional group with proton acceptor properties, and specifically refers to a decrease in the equilibrium constant at chemical equilibrium when a proton adduct is generated from the compound (PA) having the functional group with proton acceptor properties and the proton.

The proton acceptor properties can be confirmed by carrying out pH measurement.

In the present invention, the acid dissociation constant pKa of the compound generated by the decomposition of the compound (PA) upon irradiation of actinic rays or radiation preferably satisfies 13<pKa<−1, more preferably −13<pKa<−1, and still more preferably −13<pKa<−3.

In the present invention, the acid dissociation constant pKa refers to an acid dissociation constant pKa in an aqueous solution, for example, any of those listed in Chemical Handbook (II) (Revised 4$^{th}$ Edition, 1993, edited by The Chemical Society of Japan, published by Maruzen Co., Ltd.). A lower value of pKa indicates higher acid strength. Specifically, the acid dissociation constant pKa in an aqueous solution can be actually measured through the determination of the acid dissociation constant at 25° C. using an infinitely diluted aqueous solution. Alternatively, the values based on a database of heretofore known literature values and Hammett's substituent constants can be determined by calculation by means of the following software package 1. All the pKa values appearing in the present specification are those determined by calculation by means of this software package.

Software package 1: Advanced Chemistry Development (ACD/Labs) Software V8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

In General Formula (PA-1),

Q represents —SO$_3$H, —CO$_2$H, or —W$_1$NHW$_2$Rf in which Rf represents an alkyl group (preferably having 1 to 20 carbon atoms), a cycloalkyl group (preferably having 3 to 20 carbon atoms), or an aryl group (preferably having 6 to 30 carbon atoms), and W$_1$ and W$_2$ each independently represent —SO$_2$— or —CO—.

A represents a single bond or a divalent linking group.

X represents —SO$_2$— or —CO—.

n represents 0 or 1.

B represents a single bond, an oxygen atom, or —N(R$_x$)R$_y$— in which R$_x$ represents a hydrogen atom or a monovalent organic group, and R$_y$ represents a single bond or a divalent organic group, provided that R$_x$ may be bonded to R$_y$ to form a ring or may be bonded to R to form a ring.

R represents a monovalent organic group containing a functional group with proton acceptor properties.

The compound (PA) is preferably an ionic compound. The functional group with proton acceptor properties may be contained in an anionic moiety or a cationic moiety, and it is preferred that the functional group is contained in an anionic moiety.

Furthermore, in the present invention, compounds (PA) other than a compound which generates the compound represented by General Formula (PA-1) can also be appropriately selected. For example, a compound containing a proton acceptor site at the cationic moiety thereof may be used as an ionic compound. More specific examples thereof include a compound represented by General Formula (7).

In the formula, A represents a sulfur atom or an iodine atom.

m represents 1 or 2 and n represents 1 or 2, provided that m+n=3 when A is a sulfur atom and m+n=2 when A is an iodine atom.

R represents an aryl group.

R$_N$ represents an aryl group substituted with a functional group with proton acceptor properties.

X$^−$ represents a counter anion.

Specific examples of X$^−$ include the same anions as those of the anion of the acid generator.

Preferred specific examples of the aryl group of R and R$_N$ include a phenyl group.

Specific examples of the functional group with proton acceptor properties contained in R$_N$ are the same as those of the functional group with proton acceptor properties in General Formula (PA-1).

Specific examples of the ionic compound having a proton acceptor site at a cationic moiety include the compounds exemplified in <0291> of US2011/0269072A1.

Further, such compounds can be synthesized, for example, with reference to the methods described in JP2007-230913A and JP2009-122623A.

The compound (PA) may be used alone or in combination of two or more thereof.

The content of the compound (PA) is preferably 0.1 to 10 mass % and more preferably 1 to 8 mass %, based on the total solid content of the composition.

In the composition of the present invention, an onium salt which becomes a relatively weak acid with respect to the acid generator can be used as an acid diffusion control agent.

In the case of using a mixture of an acid generator and an onium salt generating an acid which is a relatively weak acid with respect to the acid generated from the acid generator, in the case where the acid generated from the acid generator upon irradiation with actinic rays or radiation collides with an onium salt having an unreacted weak acid anion, a weak acid is released by salt exchange, and as a result, an onium salt having a strong acid anion is generated. In this process, a strong acid is exchanged into a weak acid having lower catalytic capacity, and thus, apparently, the acid is deactivated, and control of acid diffusion can be carried out.

The onium salt which becomes a relatively weak acid with respect to an acid generator is preferably a compound represented by each of General Formulae (d1-1) to (d1-3).

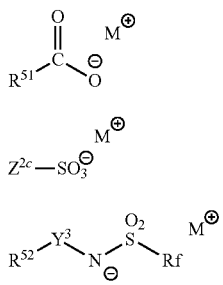

In the formulae, $R^{51}$ is a hydrocarbon group which may have a substituent, $Z^{2c}$ is a hydrocarbon group having 1 to 30 carbon atoms which may have a substituent (here, the carbon adjacent to S is not substituted with a fluorine atom), $R^{52}$ is an organic group, $Y^3$ is a linear, branched, or cyclic alkylene group or arylene group, Rf is a hydrocarbon group containing a fluorine atom, and $M^+$'s are each independently a sulfonium cation or an iodonium cation.

Preferred examples of the sulfonium cation or iodonium cation represented by $M^+$ include a sulfonium cation exemplified in General Formula (ZI) and an iodonium cation exemplified in General Formula (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to an acid generator may be (C) a compound (hereinafter, also referred to as a "compound (CA)") which has a cationic moiety and an anionic moiety in the same molecule and further, in which the cationic moiety and the anionic moiety are linked to each other through a covalent bond.

The compound (CA) is preferably a compound represented by any one of General Formulae (C-1) to (C-3).

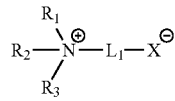

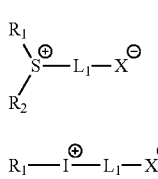

In General Formulae (C-1) to (C-3), $R_1$, $R_2$, and $R_3$ represent a substituent having 1 or more carbon atoms, $L_1$ represents a divalent linking group that links a cationic moiety with an anionic moiety, or a single bond, —$X^-$ represents an anionic moiety selected from —COO$^-$, —SO$_3^-$, —SO$_2^-$, and —N$^-$—R$_4$. $R_4$ represents a monovalent substituent having a carbonyl group: —C(=O)—, a sulfonyl group: —S(=O)$_2$—, or a sulfinyl group: S(=O)— at a site for linking to an adjacent N atom, $R_1$, $R_2$, $R_3$, $R_4$, and $L_1$ may be bonded to one another to form a ring structure. Further, in (C-3), two of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, among which an alkyl group, a cycloalkyl group, and an aryl group are preferred.

Examples of $L_1$ as a divalent linking group include a linear or branched alkylene group, a cycloalkylene group, an arylene group, a carbonyl group, an ether bond, an ester bond, an amide bond, a urethane bond, a urea bond, and a group formed by a combination of two or more of these groups. $L_1$ is more preferably an alkylene group, an arylene group, an ether bond, an ester bond, or a group formed by a combination of two or more of these groups.

Preferred examples of the compound represented by General Formula (C-1) include the compounds exemplified in paragraphs [0037] to [0039] of JP2013-6827A and paragraphs [0029] of JP2013-8020A.

Preferred examples of the compound represented by General Formula (C-2) include the compounds exemplified in paragraphs [0012] to [0013] of JP2012-189977A.

Preferred examples of the compound represented by General Formula (C-3) include the compounds exemplified in paragraphs [0029] to [0031] of JP2012-252124A.

The content of the onium salt which becomes a relatively weak acid with respect to the acid generator is preferably 0.5 to 10.0 mass %, more preferably 0.5 to 8.0 mass %, and still more preferably 1.0 to 8.0 mass %, based on the solid content of the composition.

[5] Solvent

The composition of the present invention usually contains a solvent.

Examples of the solvent that can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include those described in, for example, paragraphs <0441> to <0455> of US2008/0187860A.

In the present invention, a mixed solvent obtained by mixing a solvent containing a hydroxyl group in the structure thereof and a solvent containing no hydroxyl group in the structure thereof may be used as the organic solvent.

As the solvent containing a hydroxyl group and the solvent containing no hydroxyl group, the above-described exemplary compounds may be appropriately selected. The solvent containing a hydroxyl group is preferably alkylene glycol monoalkyl ether or alkyl lactate and more preferably propylene glycol monomethyl ether (PGME, also known as 1-methoxy-2-propanol), ethyl lactate, or methyl 2-hydroxyisobutyrate. Further, the solvent containing no hydroxyl group is preferably alkylene glycol monoalkyl ether acetate, alkyl alkoxypropionate, a monoketone compound which may contain a ring, a cyclic lactone, or alkyl acetate, among which propylene glycol monomethyl ether acetate (PGMEA, also known as 1-methoxy-2-acetoxypropane), ethyl ethoxypropionate, 2-heptanone, γ-butyrolactone, cyclohexanone, and butyl acetate are particularly preferred, and propylene glycol monomethyl ether acetate, ethyl ethoxypropionate, and 2-heptanone are most preferred.

The mixing ratio (by mass) of the solvent containing a hydroxyl group to the solvent containing no hydroxyl group is 1/99 to 99/1, preferably 10/90 to 90/10, and more preferably 20/80 to 60/40. A mixed solvent in which the solvent containing no hydroxyl group is contained in an amount of 50 mass % or more is particularly preferred from the viewpoint of coating uniformity.

The solvent preferably includes propylene glycol monomethyl ether acetate and is preferably a solvent of only propylene glycol monomethyl ether acetate or a mixed solvent of two or more kinds of solvents containing propylene glycol monomethyl ether acetate.

[6] Surfactant

The composition of the present invention may or may not contain a surfactant, and in the case where the composition contains a surfactant, it is more preferred that the composition contains any one of fluorine- and/or silicon-based surfactants (a fluorine-based surfactant, a silicon-based surfactant, and a surfactant having both a fluorine atom and a silicon atom), or two or more thereof.

By virtue of incorporating a surfactant, the composition of the present invention can provide a resist pattern with good sensitivity, resolution and adhesiveness as well as little development defects when using an exposure light source of 250 nm or less, particularly 220 nm or less.

Examples of the fluorine-based and/or silicon-based surfactant include the surfactants described in paragraph <0276> of US2008/0248425A.

Further, in the present invention, a surfactant other than the fluorine-based and/or silicon-based surfactant, described in paragraph <0280> of US2008/0248425A, may be used.

These surfactants may be used alone or in combination of several thereof.

In the case where the composition of the present invention contains a surfactant, the amount of the surfactant used is preferably 0.0001 to 2 mass % and more preferably 0.0005 to 1 mass %, with respect to the total solid content of the composition.

Meanwhile, by setting the addition amount of surfactant to 10 ppm or less with respect to the total amount of the composition (excluding the solvent), the surface uneven distribution of the hydrophobic resin is increased, and accordingly, the surface of the resist film may be made to be more hydrophobic, thereby enhancing the water followability at the time of liquid immersion exposure.

[7] Other additives

The composition of the present invention may or may not contain onium carboxylate. Examples of the onium carboxylate include those described in paragraphs <0605> to <0606> of US2008/0187860A.

The onium carboxylate can be synthesized by reacting sulfonium hydroxide, iodonium hydroxide, ammonium hydroxide, and carboxylic acid with silver oxide in a suitable solvent.

In the case where the composition of the present invention contains an onium carboxylate, the content thereof is generally 0.1 to 20 mass %, preferably 0.5 to 10 mass %, and more preferably 1 to 7 mass %, with respect to the total solid content of the composition.

The composition of the present invention may further contain an acid amplifier, a dye, a plasticizer, a photosensitizer, a light absorber, an alkali-soluble resin, a dissolution inhibitor, a compound for accelerating dissolution in a developer (for example, a phenol compound having a molecular weight of 1,000 or less, or a carboxyl group-containing alicyclic or aliphatic compound), or the like, if desired.

The phenol compound having a molecular weight of 1,000 or less may be readily synthesized by those skilled in the art with reference to the method disclosed in, for example, JP 1992-122938A (JP-H04-122938A), JP1990-28531A (JP-H02-28531A), U.S. Pat. No. 4,916,210A, EP219294B, and the like.

Specific examples of the carboxyl group-containing alicyclic or aliphatic compound include, but are not limited to, a carboxylic acid derivative having a steroid structure, such as cholic acid, deoxycholic acid, or lithocholic acid, an adamantane carboxylic acid derivative, adamantane dicarboxylic acid, cyclohexane carboxylic acid, and cyclohexane dicarboxylic acid.

The solid content concentration of the composition of the present invention is usually 1.0 to 10 mass %, preferably 2.0 to 5.7 mass %, and more preferably 2.0 to 5.3 mass %. When the solid content concentration is set to the above-specified range, the resist solution can be uniformly applied onto a substrate, and in addition, a resist pattern with excellent line width roughness (LWR) can be formed. The reasons therefor are not clearly known, but it is probably considered that by setting the solid content concentration to 10 mass % or less and preferably 5.7 mass % or less, the material, particularly the photoacid generator, in the resist solution is prevented from aggregation, and as a result, a uniform resist film can be formed.

The solid content concentration refers to a weight percentage of the weight of the resist components excluding the solvent, with respect to the total weight of the composition.

The method for preparing the composition of the present invention is not particularly limited, but it is preferred that the above-mentioned individual components are dissolved in a predetermined organic solvent, preferably the above-mentioned mixed solvent, and then filtered using a filter. The filter used in the filtration using a filter is preferably a filter made of polytetrafluoroethylene, polyethylene, or nylon having a pore size of 0.1 μm or less, more preferably 0.05 μm or less, and still more preferably 0.03 μm or less. In the filtration using a filter, for example, circulatory filtration may be carried out as described in JP2002-62667A or filtration with the serial or parallel connection of plural kinds of filters may be carried out. Further, the composition may be filtered a plurality of times. In addition, the composition may be subjected to a deaeration treatment or the like before or after the filtration using a filter.

The composition of the present invention is related to an actinic ray-sensitive or radiation-sensitive resin composition whose properties change by a reaction upon irradiation with actinic rays or radiation. More specifically, the present invention relates to an actinic ray-sensitive or radiation-sensitive resin composition which is used for a production process of a semiconductor such as an IC, a production process of a circuit board of, for example, a liquid crystal or a thermal head, a production process of a mold structure for imprinting, other photofabrication processes, a lithographic printing plate, and an acid-curable composition.

[Procedure of Step (1)]

Although the procedure of the step (1) is not particularly limited, there is a method of applying the composition of the present invention onto a substrate and subjecting it to a curing treatment if necessary (coating method), a method of forming a resist film on a temporary support and transferring the resist film onto a substrate, or the like. Among them, a coating method is preferable because it is excellent in productivity.

The substrate is not particularly limited, and an inorganic substrate such as silicon, $SiO_2$ or SiN, a coating-type inorganic substrate such as Spin on Glass (SOG), or a substrate commonly used in a production process of a semiconductor such as an IC, a production process of a circuit board of, for example, a liquid crystal or a thermal head, or other lithography processes of photofabrication may be used. Further, if necessary, an anti-reflection film may be formed between the resist film and the substrate. As the anti-reflection film, a known organic or inorganic anti-reflection film may be appropriately used. The pattern forming method of the present invention may be combined with, for example, a two-layer resist process as disclosed in JP2008-083384A, or a process having multiple exposures and developments as disclosed in WO2011/122336A. In the case of combining the present invention with the process disclosed in WO2011/122336A, it is preferred to apply the pattern forming method of the present invention as the second negative-type pattern forming method in claim 1 of WO2011/122336A.

[Resist Film]

The thickness of the resist film is not particularly limited, but it is preferably 1 to 500 nm and more preferably 1 to 100 nm, from the viewpoint of capable of forming a fine pattern with higher precision. Such a film thickness can be obtained by setting the solid content concentration in the composition within an appropriate range so as to have an appropriate viscosity and thereby improving coatability and film formability.

[Step (2): Exposure Step]

The step (2) is a step of irradiating (exposing) the film (resist film) formed in the step (1) with actinic rays or radiation.

The light used in the exposure is not particularly limited and examples thereof include an infrared light, a visible light, an ultraviolet light, a far ultraviolet light, an extreme ultraviolet light, an X-ray, and an electron beam. The light is, for example, a far ultraviolet light having a wavelength of preferably 250 nm or less, more preferably 220 nm or less, and still more preferably 1 nm to 200 nm.

More specific examples thereof include a KrF excimer laser (248 nm), an ArF excimer laser (193 nm), an $F_2$ excimer laser (157 nm), an X-ray, an EUV (13 nm), and an electron beam, among which a KrF excimer laser, an ArF excimer laser, an EUV, or an electron beam is preferred and an ArF excimer laser is more preferred.

A liquid immersion exposure method can be applied to the exposure step. It is possible to combine the liquid immersion exposure method with a super-resolution technique such as a phase shift method or a modified illumination method. The liquid immersion exposure may be carried out, for example, according to the method described in paragraphs <0594> to <0601> of JP2013-242397A.

In the case where the receding contact angle of a resist film formed by using the composition of the present invention is extremely small, the resist film cannot be appropriately used in the case of carrying out the exposure through a liquid immersion medium, and the effect of reducing water mark defects cannot be sufficiently exhibited. In order to realize a preferable receding contact angle, it is preferred to incorporate the hydrophobic resin (D) into the composition. Alternatively, an immersion liquid sparingly soluble film (hereinafter, also referred to as "top coat") formed by the hydrophobic resin (D) may be provided on the upper layer of the resist film. A top coat may be provided on a resist containing the hydrophobic resin (D). Functions necessary for the top coat are coating suitability to the upper layer portion of the resist film and poor solubility in an immersion liquid. It is preferred that the top coat is unmixable with the composition film and can be uniformly coated on the composition film upper layer.

The top coat is not particularly limited, and a conventionally known top coat can be formed by a conventionally known method.

[Composition for Forming Upper Layer Film (Top Coat Composition)]

Next, an upper layer film forming composition (top coat composition) for forming a top coat which is an upper layer film will be described.

The top coat composition used for the pattern forming method is preferably a composition containing, in particular, a resin and a compound to be described later and a solvent. By using such a composition, the top coat is uniformly formed on the resist film, so that each item of critical dimension uniformity (CDU), exposure latitude (EL), and Depth Of Focus (DOF) can be further improved.

<Solvent>

In order to form a good pattern without dissolving the resist film, it is preferred that the top coat composition of the present invention contains a solvent which does not dissolve the resist film, and it is more preferred that a solvent having a different component from the organic developer is used.

From the viewpoint of prevention of elution into the immersion liquid, it is preferred that the solvent has low solubility in an immersion liquid and it is more preferred that the solvent has low solubility in water. In the present specification, the phrase "low solubility in an immersion liquid" means that it is insoluble in an immersion liquid. Similarly, the phrase "low solubility in water" means that it is water insoluble. From the viewpoint of volatility and coatability, the boiling point of the solvent is preferably 90° C. to 200° C.

The expression "low solubility in an immersion liquid" means that, taking the solubility in water as an example, the reduction rate of the film thickness after applying a top coat composition onto a silicon wafer and drying it to form a film and then immersing the silicon wafer in pure water at 23° C. for 10 minutes, followed by drying is within 3% of the initial film thickness (typically 50 nm).

From the viewpoint of uniformly applying the top coat, a solvent is preferably used in such a manner that the solid content concentration is 0.01 to 20 mass %, more preferably 0.1 to 15 mass %, and most preferably 1 to 10 mass %.

The solvent that can be used is not particularly limited as long as it dissolves a resin to be described later and does not dissolve the resist film, and preferred examples thereof include an alcohol-based solvent, an ether-based solvent, an ester-based solvent, a fluorine-based solvent, and a hydrocarbon-based solvent. It is more preferable to use a non-fluorine-based alcohol-based solvent. As a result, the non-solubility for the resist film is further improved, and in the case where the top coat composition is applied onto the resist film, the top coat can be formed more uniformly without dissolving the resist film. The viscosity of the solvent is preferably 5 centipoise (cP) or less, more preferably 3 cP or less, still more preferably 2 cP or less, and particularly preferably 1 cP or less. Conversion of centipoise into Pascal seconds can be made according to the following equation. 1000 cP=1 Pa·s.

From the viewpoint of coatability, the alcohol-based solvent is preferably a monohydric alcohol and more preferably a monohydric alcohol having 4 to 8 carbon atoms. As the monohydric alcohol having 4 to 8 carbon atoms, a linear, branched or cyclic alcohol can be used. A linear or branched alcohol is preferred. Examples of the alcohol-based solvent include alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; and glycol ethers such as ethylene glycol monomethyl ether, propylene glycol monomethyl ether, diethylene glycol monomethyl ether, triethylene glycol monoethyl ether, and methoxymethylbutanol; among which alcohols and glycol ethers are preferred, and 1-butanol, 1-hexanol, 1-pentanol, 3-methyl-1-butanol, 4-methyl-1-pentanol, 4-methyl-2-pentanol, and propylene glycol monomethyl ether are more preferred.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoro-anisole, 2,3-difluoro anisole, perfluorohexane, perfluoroheptane, perfluoro-2-pentanone, perfluoro-2-butyl tetrahydrofuran, perfluorotetrahydrofuran, perfluorotributylamine, and perfluorotetrapentyl amine, among which a fluorinated alcohol or a fluorinated hydrocarbon-based solvent may be preferably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, 2,3,4-trimethylpentane, decane, and undecane.

Examples of the ether-based solvent include dioxane, tetrahydrofuran, and isoamyl, besides the foregoing glycol ether-based solvents. Among the ether-based solvents, an ether-based solvent having a branched structure is preferred.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate. Among the ester-based solvents, an ester-based solvent having a branched structure is preferred.

These solvents may be used alone or in combination of two or more thereof.

In the case of mixing solvents other than the foregoing solvents, the mixing ratio thereof is usually 0 to 30 mass %, preferably 0 to 20 mass %, and more preferably 0 to 10 mass %, with respect to the total solvent amount of the top coat composition. By mixing solvents other than the foregoing solvents, solubility for a resist film, solubility of a resin in the top coat composition, properties of elution from a resist film, and the like can be appropriately adjusted.

<Resin Having C Log P(Poly) of 3.0 or More>

The top coat composition preferably contains a resin having a C log P(Poly) of 3.0 or more (also referred to as resin (X)).

Here, the C log P(Poly) is the sum of the products of the C log P value of each monomer corresponding to each repeating unit contained in the resin and the molar fraction of each repeating unit. The monomer corresponds to a repeating unit means that the repeating unit is a repeating unit obtained by polymerizing the monomer. In the case where two or more resins having different values of C log P(Poly) are blended, the value of C log P(Poly) of each resin is converted into a mass average.

For C log P of the monomer, the calculated value of Chem Draw Ultra 8.0 Apr. 23, 2003 (Cambridge Corporation) is used.

The C log P(Poly) of the resin can be determined according to the following equation.

$C \log P(\text{Poly}) = C \log P \text{ of monomer } A \times \text{composition ratio of repeating unit } A + C \log P \text{ of monomer } B \times \text{composition ratio of repeating unit } B + \ldots$ In the above equation, the resin contains repeating units A and B, the monomer A and the repeating unit A correspond to each other, and the monomer B and the repeating unit B correspond to each other.

The resin having a C log P(Poly) of 3.0 or more preferably has C log P(Poly) of 3.8 or more and more preferably C log P(Poly) of 4.0 or more. In addition, C log P(Poly) of the resin is preferably 10 or less and more preferably 7 or less.

The resin having a C log P(Poly) of 3.0 or more preferably contains a repeating unit obtained by polymerizing a monomer represented by General Formula (2).

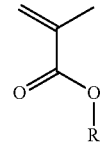

General Formula (2)

In General Formula (2), R represents an alkyl group having 5 to 20 carbon atoms, a cycloalkyl group having 5 to 20 carbon atoms, or an aryl group.

It is preferred that the resin having a C log P(Poly) of 3.0 or more contains at least one repeating unit having four methyl groups.

Specific examples of the monomer corresponding to the repeating unit contained in the resin having a C log P(Poly) of 3.0 or more are shown below, but the present invention is not limited thereto. Since it may be sufficient if the resin has a C log P(Poly) of 3.0 or more, it is not necessary that the C log P of the monomer corresponding to the total repeating units is 3.0 or more. That is, the resin may contain a repeating unit obtained by polymerizing a monomer having a C log P of less than 3.0.

XM-1
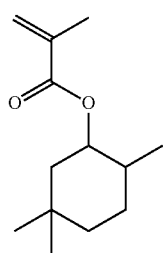
ClogP; 4.70
XM-2
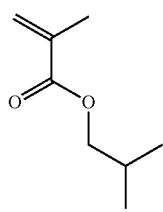
ClogP; 2.56
XM-3
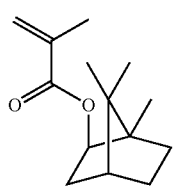
ClogP; 4.97
XM-4
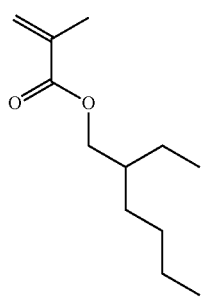
ClogP; 4.68
XM-5
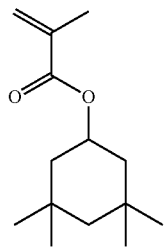
ClogP; 5.21
XM-6
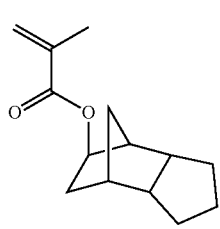
ClogP; 4.29
XM-7
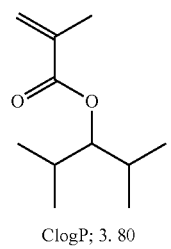
ClogP; 3.80
XM-8
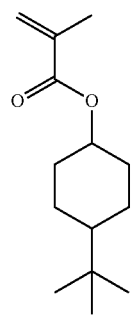
ClogP; 4.98
XM-9
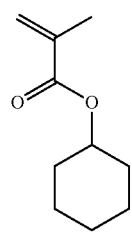
ClogP; 3.14
XM-10
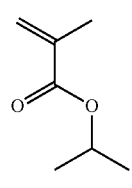
ClogP; 1.94
XM-11
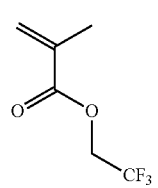
ClogP; 1.40
XM-12
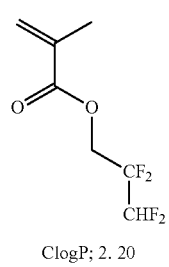
ClogP; 2.20

XM-13
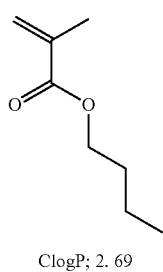
ClogP; 2.69
Specific examples of combinations of monomers used in the resin having a C log P(Poly) of 3.0 or more and composition ratios (mole fractions) thereof are shown below, but the present invention is not limited thereto.
(X-1)
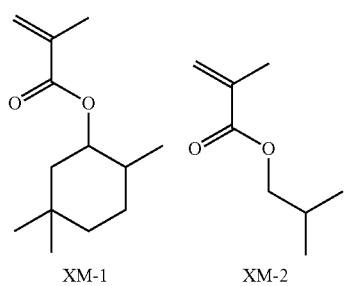
XM-1     XM-2
80:20
ClogP(Poly); 4.3
(X-2)
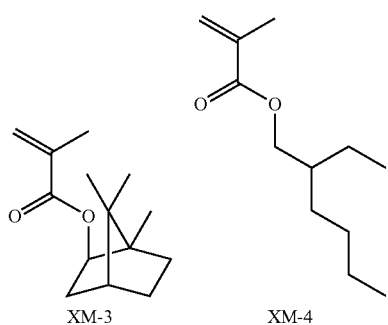
XM-3     XM-4
90:10
ClogP(Poly); 4.9
(X-3)
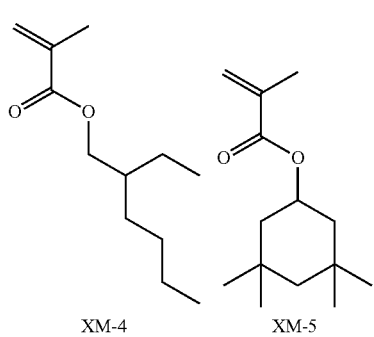
XM-4     XM-5
30:70
ClogP(Poly); 5.1
(X-4)
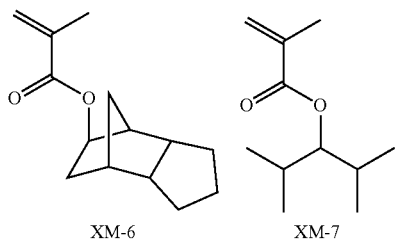
XM-6     XM-7
60:40
ClogP(Poly); 4.1
(X-5)
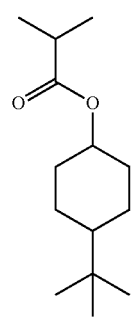
XM-8
100
ClogP(Poly); 5.0
(X-6)
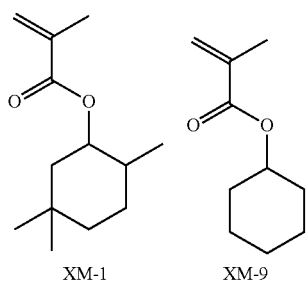
XM-1     XM-9
80:20
ClogP(Poly); 4.4
(X-7)
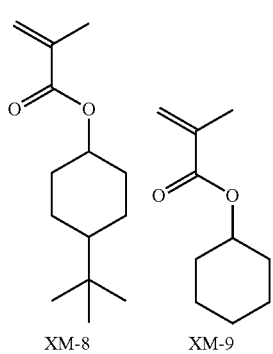
XM-8     XM-9
30:70
ClogP(Poly); 3.7

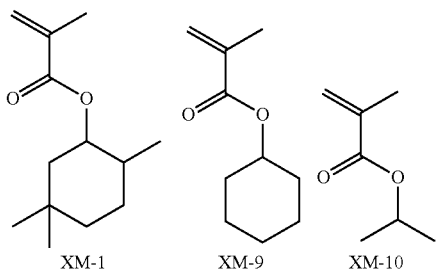

(X-8)

XM-1  XM-9  XM-10
50:30:20
ClogP(Poly); 3.7

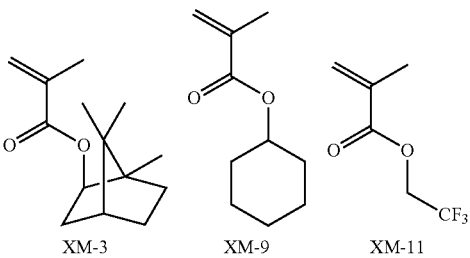

(X-12)

XM-3  XM-9  XM-11
40:20:40
ClogP (Poly); 3.2

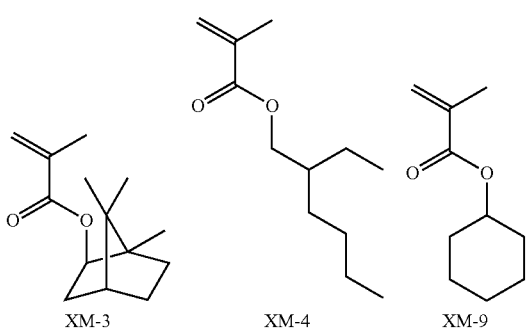

(X-9)

XM-3  XM-4  XM-9
40:30:30
ClogP(Poly); 4.3

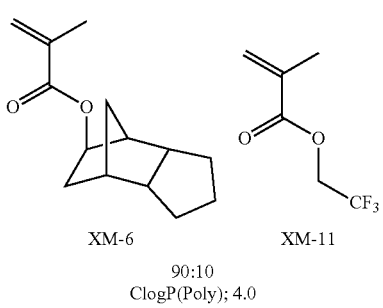

(X-10)

XM-6  XM-11
90:10
ClogP(Poly); 4.0

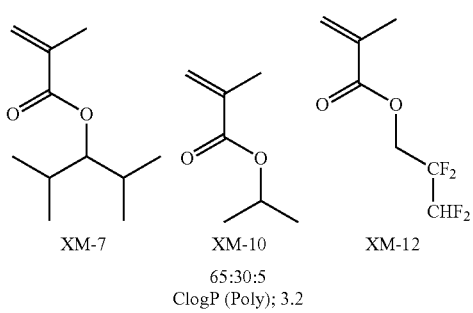

(X-11)

XM-7  XM-10  XM-12
65:30:5
ClogP (Poly); 3.2

The resin having a C log P(Poly) of 3.0 or more may be a resin containing a repeating unit having an acid-decomposable group. Examples of the acid-decomposable group are the same as those described above.

The resin having a C log P(Poly) of 3.0 or more is preferably dissolved in a solvent in the top coat composition.

The resin having a C log P(Poly) of 3.0 or more represents a resin having a weight-average molecular weight of 3,000 to 200,000, in which the weight-average molecular weight is preferably 5,000 to 100,000, more preferably 5,500 to 50,000, and still more preferably 6,000 to 20,000.

The weight-average molecular weight of the resin having a C log P(Poly) of 3.0 or more is measured as a value in terms of polystyrene by a gel permeation chromatography (GPC) method.

The conditions of GPC are as follows.
Column: TSK gel Multipore HXL-M (manufactured by Tosoh Corporation, 7.8 mmID×30.0 cm)
Development solvent: tetrahydrofuran (THF)
Column temperature: 40° C.
Flow rate: 1 ml/min
Sample injection volume: 10 µl
Apparatus: HLC-8120 (manufactured by Tosoh Corporation)

As the resin in the top coat composition of the present invention, various commercially available products may be used. Alternatively, the resin can be synthesized in accordance with a conventional method (for example, radical polymerization). Examples of the general synthesis method include a bulk polymerization method in which polymerization is carried out by dissolving monomer species and an initiator in a solvent and heating the solution, and a dropwise addition polymerization method in which a solution of monomer species and an initiator is added dropwise to a heating solvent over 1 hour to 10 hours, with the dropwise addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents which dissolve the resist composition of the present invention, such as propylene glycol monomethyl ether acetate, propylene glycol monomethyl ether, and cyclohexanone.

The polymerization reaction is preferably carried out under an inert gas atmosphere such as nitrogen or argon. As the polymerization initiator, a commercially available radical initiator (an azo-based initiator, peroxide, or the like) is used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methyl propionate). A chain transfer agent may also be used, if desired. The concentration of the reactant is usually 5 to 50 mass %, preferably 20 to 50 mass %, and more preferably 30 to 50 mass %. The reaction temperature is usually 10° C. to 150° C., preferably 30° C. to 120° C., and more preferably 60° C. to 100° C.

After the completion of reaction, the reaction product is allowed to cool to room temperature and purified. The purification may be carried out by applying a conventional method such as a liquid-liquid extraction method by washing with water or combining suitable solvents to remove the residual monomer and oligomer components, a purification method in the solution state which includes conducting ultrafiltration to thereby extract and remove only components having a specific molecular weight or less, a reprecipitation method which includes dropwise adding a resin solution to a poor solvent, thus solidifying the resin in the poor solvent and removing the residual monomers and the like, or a purification method in the solid state which includes filtering a resin slurry and washing with a poor solvent. For example, the resin is precipitated as a solid by bringing the reaction solution into contact with a solvent in which the resin is sparingly soluble or insoluble (poor solvent) and which is in a volumetric amount of 10 times or less, preferably 10 to 5 times the volume of the reaction solution.

The solvent used at the operation of precipitation or reprecipitation from the polymer solution (precipitation or reprecipitation solvent) may be sufficient if it is a poor solvent for the polymer, and the solvent used may be appropriately selected according to the kind of the polymer from, for example, a hydrocarbon (an aliphatic hydrocarbon such as pentane, hexane, heptane, or octane; an alicyclic hydrocarbon such as cyclohexane or methylcyclohexane; or an aromatic hydrocarbon such as benzene, toluene, or xylene), a halogenated hydrocarbon (a halogenated aliphatic hydrocarbon such as methylene chloride, chloroform, or carbon tetrachloride; and a halogenated aromatic hydrocarbon such as chlorobenzene or dichlorobenzene), a nitro compound (nitromethane, nitroethane, or the like), a nitrile (acetonitrile, benzonitrile, or the like), an ether (a chain-like ether such as diethyl ether, diisopropyl ether, or dimethoxyethane; or a cyclic ether such as tetrahydrofuran or dioxane), a ketone (acetone, methyl ethyl ketone, diisobutyl ketone, or the like), an ester (ethyl acetate, butyl acetate, or the like), a carbonate (dimethyl carbonate, diethyl carbonate, ethylene carbonate, propylene carbonate, or the like), an alcohol (methanol, ethanol, propanol, isopropyl alcohol, butanol, or the like), a carboxylic acid (acetic acid, or the like), water, and a mixed solvent containing the foregoing solvents. Among these, the precipitation or reprecipitation solvent is preferably a solvent containing at least an alcohol (particularly, methanol or the like) or water. In such a solvent containing at least a hydrocarbon, the ratio of the alcohol (particularly, methanol or the like) to other solvents (for example, esters such as ethyl acetate, and ethers such as tetrahydrofuran) is approximately, for example, the former/the latter (ratio by volume, at 25° C.)=10/90 to 99/1, preferably the former/the latter (ratio by volume, at 25° C.)=30/70 to 98/2, more preferably the former/the latter (ratio by volume, at 25° C.)=50/50 to 97/3.

The amount of the precipitation or reprecipitation solvent used may be appropriately selected by taking into account the efficiency, yield and the like, but it is generally 100 to 10,000 parts by mass, preferably 200 to 2,000 parts by mass, more preferably 300 to 1,000 parts by mass, with respect to 100 parts by mass of the polymer solution.

The nozzle bore diameter at the time of feeding the polymer solution into a precipitation or reprecipitation solvent (poor solvent) is preferably 4 mmφ or less (for example, 0.2 to 4 mmφ), and the feeding rate (drip rate) of the polymer solution into the poor solvent is, for example, about 0.1 to 10 m/sec and preferably about 0.3 to 5 m/sec in terms of the linear velocity.

The precipitation or reprecipitation operation is preferably carried out under stirring. Examples of the stirring blade which can be used for stirring include a disc turbine, a fan turbine (including paddle), a curved vane turbine, a feathering turbine, a Pfaudler type, a bull margin type, an angled vane fan turbine, a propeller, a multistage type, an anchor type (or horseshoe type), a gate type, a double ribbon, and a screw. The stirring is preferably further carried out for 10 minutes or more, more preferably 20 minutes or more, even after the completion of feeding of the polymer solution. In the case where the stirring time is short, the monomer content in the polymer particles may not be sufficiently reduced. The mixing and stirring of the polymer solution and the poor solvent may also be carried out using a line mixer in place of the stirring blade.

The temperature during the precipitation or reprecipitation may be appropriately selected by taking into account the efficiency or operability, but the temperature is usually about 0° C. to 50° C., preferably in the vicinity of room temperature (for example, about 20° C. to 35° C.). The precipitation or reprecipitation operation may be carried out using a commonly used mixing vessel such as stirring tank according to a known method such as batch system and continuous system.

The precipitated or reprecipitated particulate polymer is usually subjected to commonly used solid-liquid separation such as filtration or centrifugation, then dried and used. The filtration is carried out using a solvent-resistant filter element preferably under pressure. The drying is carried out under atmospheric pressure or reduced pressure (preferably under reduced pressure) at a temperature of about 30° C. to 100° C. and preferably about 30° C. to 50° C.

Incidentally, after the resin is once precipitated and separated, the resin may be dissolved again in a solvent and then brought into contact with a solvent in which the resin is sparingly soluble or insoluble.

That is, there may be used a method including, after the completion of the radical polymerization reaction above, precipitating a resin by bringing the polymer into contact with a solvent in which the polymer is sparingly soluble or insoluble (step I), separating the resin from the solution (step II), dissolving the resin again in a solvent to prepare a resin solution A (step III), precipitating a resin solid by bringing the resin solution A into contact with a solvent in which the resin is sparingly soluble or insoluble and which is in a volumetric amount of less than 10 times (preferably a volumetric amount of 5 times or less) the volume of the resin solution A (step IV), and separating the precipitated resin (step V).

As for the solvent used in the preparation of the resin solution A, a solvent similar to the solvent used for dissolving the monomer at the polymerization reaction may be used, and the solvent may be the same as or different from the solvent used at the polymerization reaction.

The resin having a C log P(Poly) of 3.0 or more may be used alone or in combination of plural kinds thereof.

The blending amount of the resin having a C log P(Poly) of 3.0 or more in the total top coat composition is preferably 50 to 99.9 mass %, more preferably 70 to 99.7 mass %, and still more preferably 80 to 99.5 mass %, based on the total solid content. The solid content concentration in the top coat composition is preferably 0.1 to 10.0 mass %, more preferably 0.5 to 8.0 mass %, and still more preferably 1.0 to 5.0 mass %.

It is preferred that the top coat composition further contains at least one compound selected from the group consisting of the following (A1) to (A4).

(A1) a basic compound or a base generator,
(A2) a compound containing a bond or group selected from the group consisting of an ether bond, a thioether bond, a hydroxyl group, a thiol group, a carbonyl bond, and an ester bond,
(A3) an ionic compound, and
(A4) a compound having a radical trapping group.

<(A1) Basic compound or base generator>

It is preferred that the top coat composition further contains at least one of a basic compound or a base generator (hereinafter, collectively referred to as "additive" or "compound (A1)" in some cases).

(Basic Compound)

The basic compound that can be contained in the top coat composition is preferably an organic basic compound and more preferably a nitrogen-containing basic compound. For example, those described as a basic compound that may be contained in the above-described resist composition can be used. Specifically, the compounds having the structure represented by any of General Formulae (A) to (E) are preferably mentioned.

For example, the compounds which are classified into the following (1) to (7) can be used.

(1) Compound represented by General Formula (BS-1)

(BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but it is usually 1 to 20 and preferably 1 to 12.

The number of carbon atoms in the cycloalkyl group as R is not particularly limited, but it is usually 3 to 20 and preferably 5 to 15.

The number of carbon atoms in the aryl group as R is not particularly limited, but it is usually 6 to 20 and preferably 6 to 10. Specific examples thereof include a phenyl group and a naphthyl group.

The number of carbon atoms in the aralkyl group as R is not particularly limited, but it is usually 7 to 20 and preferably 7 to 11. Specific examples thereof include a benzyl group.

A hydrogen atom in the alkyl group, cycloalkyl group, aryl group, or aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

At least two of R's in the compound represented by General Formula (BS-1) are preferably an organic group.

Specific examples of the compound represented by General Formula (BS-1) include tri-n-butyl amine, tri-isopropyl amine, tri-n-pentyl amine, tri-n-octyl amine, tri-n-decyl amine, triisodecyl amine, dicyclohexyl methyl amine, tetradecyl amine, pentadecyl amine, hexadecyl amine, octadecyl amine, didecyl amine, methyl octadecyl amine, dimethyl undecyl amine, N,N-dimethyl dodecyl amine, methyl dioctadecyl amine, N,N-dibutyl aniline, N,N-dihexyl aniline, 2,6-diisopropyl aniline, and 2,4,6-tri(t-butyl)aniline.

In addition, a preferred example of the basic compound represented by General Formula (BS-1) may be a basic compound in which at least one R is an alkyl group substituted with a hydroxy group. Specific examples thereof include triethanol amine and N,N-dihydroxyethyl aniline.

The alkyl group as R may have an oxygen atom in the alkyl chain. That is, an oxyalkylene chain may be formed. The oxyalkylene chain is preferably —$CH_2CH_2O$—. Specific examples thereof include tris(methoxyethoxyethyl)amine and the compound disclosed after line 60 of column 3 in the specification of U.S. Pat. No. 6,040,112A.

Examples of the basic compound represented by General Formula (BS-1) include the following compounds.

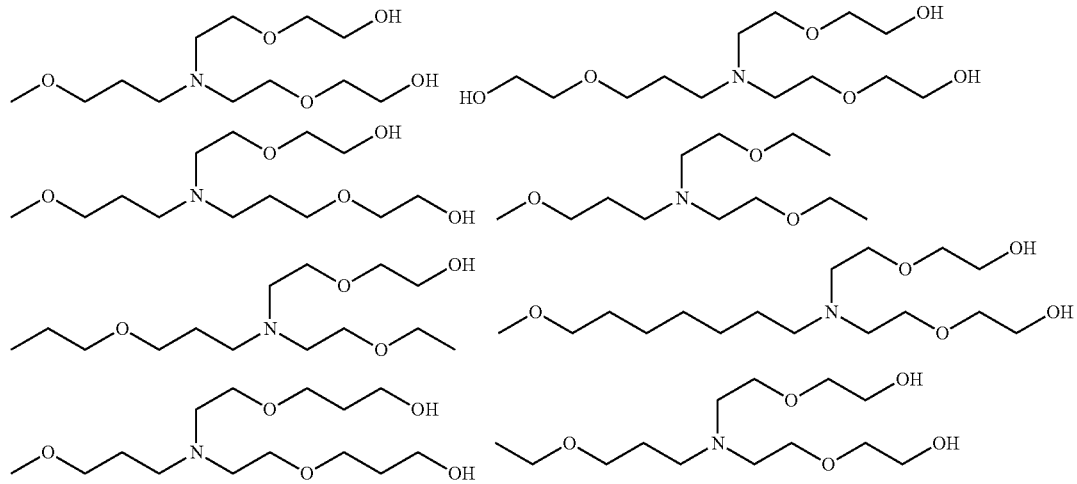

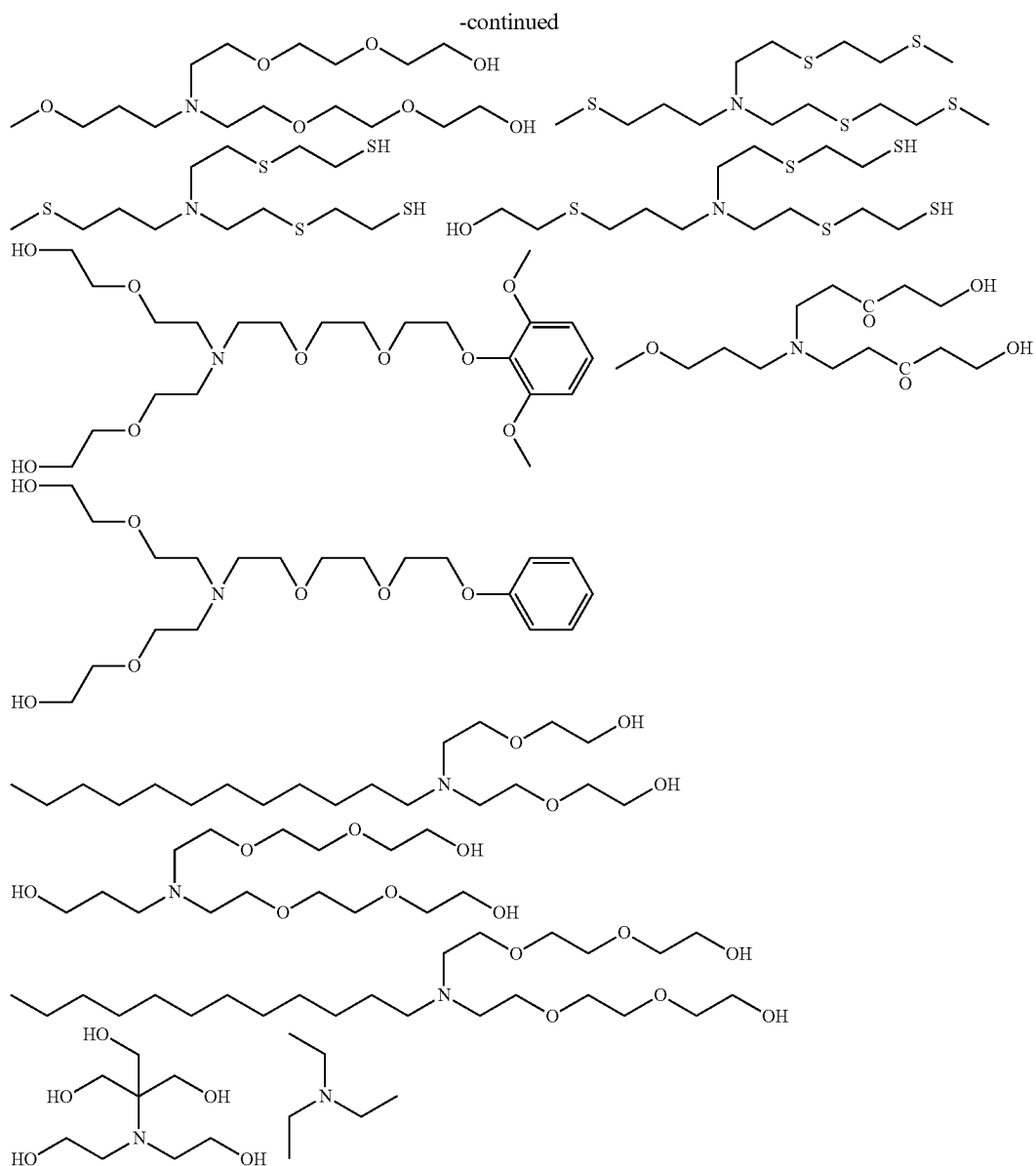

(2) Compound Having Nitrogen-Containing Heterocyclic Structure

The nitrogen-containing heterocyclic ring may have aromaticity or may not have aromaticity. The nitrogen-containing heterocyclic ring may have a plurality of nitrogen atoms. Furthermore, the nitrogen-containing heterocyclic ring may contain a heteroatom other than a nitrogen atom. Specific examples of the compound having a nitrogen-containing heterocyclic structure include a compound having an imidazole structure (2-phenylbenzimidazole, 2,4,5-triphenylimidazole, or the like), a compound having a piperidine structure [N-hydroxyethylpiperidine, bis(1,2,2,6,6-pentamethyl-4-piperidyl)sebacate, or the like], a compound having a pyridine structure (4-dimethylaminopyridine or the like), and a compound having an antipyrine structure (antipyrine, hydroxyantipyrine, or the like).

A compound having two or more ring structures may also be suitably used. Specific examples thereof include 1,5-diazabicyclo[4.3.0] non-5-ene and 1,8-diazabicyclo[5.4.0] undec-7-ene.

(3) Amine Compound Having Phenoxy Group

The amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

The compound more preferably has at least one oxyalkylene chain between the phenoxy group and the nitrogen atom. The number of oxyalkylene chains in one molecule is preferably 3 to 9 and more preferably 4 to 6. Among oxyalkylene chains, —$CH_2CH_2O$— is particularly preferred.

Specific examples of the amine compound having a phenoxy group include 2-[2-{2-(2,2-dimethoxy-phenoxyethoxy)ethyl}-bis-(2-methoxyethyl)-amine and the compounds (C1-1) to (C3-3) exemplified in paragraph <0066> of US2007/0224539A1.

The amine compound having a phenoxy group is obtained by, for example, heating a mixture of a primary or secondary amine having a phenoxy group and a haloalkyl ether to be reacted, adding an aqueous solution of a strong base such as sodium hydroxide, potassium hydroxide, or tetraalkylammonium thereto, and extracting the resultant product with an organic solvent such as ethyl acetate or chloroform. Alternatively, the amine compound having a phenoxy group may also be obtained by heating a primary or secondary amine and an haloalkyl ether having a phenoxy group at the terminal to be reacted, adding an aqueous solution of a strong base such as sodium hydroxide, potassium hydroxide, or tetraalkylammonium thereto, and extracting the resultant product with an organic solvent such as ethyl acetate or chloroform.

(4) Ammonium Salt

It is also possible to suitably use an ammonium salt as the basic compound. Examples of the anion of the ammonium salt include halide, sulfonate, borate, and phosphate. Among these, halide or sulfonate is particularly preferred.

The halide is particularly preferably chloride, bromide, or iodide.

The sulfonate is particularly preferably an organic sulfonate having 1 to 20 carbon atoms. Examples of the organic sulfonate include alkyl sulfonate and aryl sulfonate having 1 to 20 carbon atoms.

The alkyl group contained in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate.

Examples of the aryl group contained in the aryl sulfonate include a phenyl group, a naphthyl group, and an anthryl group. These aryl groups may have a substituent. The substituent is preferably, for example, a linear or branched alkyl group having 1 to 6 carbon atoms or a cycloalkyl group having 3 to 6 carbon atoms. Preferred specific examples of the substituent include a methyl group, an ethyl group, an n-propyl group, an isopropyl group, an n-butyl group, an i-butyl group, a t-butyl group, an n-hexyl group, and a cyclohexyl group. Examples of other substituents include an alkoxy group having 1 to 6 carbon atoms, a halogen atom, a cyano group, a nitro group, an acyl group, and an acyloxy group.

The ammonium salt may be hydroxide or carboxylate. In this case, the ammonium salt is particularly preferably tetraalkyl ammonium hydroxide having 1 to 8 carbon atoms (tetraalkyl ammonium hydroxide such as tetramethyl ammonium hydroxide, tetraethyl ammonium hydroxide, or tetra-(n-butyl) ammonium hydroxide).

Preferred examples of the basic compound include guanidine, aminopyridine, aminoalkyl pyridine, aminopyrrolidine, indazole, imidazole, pyrazole, pyrazine, pyrimidine, purine, imidazoline, pyrazoline, piperazine, aminomorpholine, and aminoalkyl morpholine. These compounds may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl) morpholine.

(5) Compound (PA) having functional group with proton acceptor properties and capable of decomposing upon irradiation with actinic rays or radiation to generate compound exhibiting deterioration in proton acceptor properties, no proton acceptor properties, or change from proton acceptor properties to acid properties The composition according to the present invention may further contain, as a basic compound, a compound having a functional group with proton acceptor properties and capable of decomposing upon irradiation with actinic rays or radiation to generate a compound exhibiting deterioration in proton acceptor properties, no proton acceptor properties, or a change from the proton acceptor properties to acid properties (hereinafter, also referred to as a compound (PA)).

The functional group with proton acceptor properties refers to a functional group having a group or an electron which is capable of electrostatically interacting with a proton, and, for example, means a functional group with a macrocyclic structure, such as a cyclopolyether, or a functional group containing a nitrogen atom with an unshared electron pair not contributing to π-conjugation.

The nitrogen atom with an unshared electron pair not contributing π-conjugation is, for example, a nitrogen atom having a partial structure represented by the formula shown in FIG. 1.

Preferred examples of the partial structure of the functional group with proton acceptor properties include crown ether, azacrown ether, primary to tertiary amine, pyridine, imidazole, and pyrazine structures.

The compound (PA) decomposes upon irradiation with actinic rays or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties refers to a change of proton acceptor properties due to the proton being added to the functional group with proton acceptor properties, and specifically refers to a decrease in the equilibrium constant at chemical equilibrium when a proton adduct is generated from the compound (PA) having the functional group with proton acceptor properties and the proton.

The proton acceptor properties can be confirmed by carrying out a pH measurement. In the present invention, the acid dissociation constant pKa of the compound generated by the decomposition of the compound (PA) upon irradiation of actinic rays or radiation preferably satisfies 13<pKa<−1, more preferably −13<pKa<−1, and still more preferably −13<pKa<−3.

In the present invention, the acid dissociation constant pKa refers to an acid dissociation constant pKa in an aqueous solution, for example, any of those listed in Chemical Handbook (II) (Revised 4$^{th}$ Edition, 1993, edited by The Chemical Society of Japan, published by Maruzen Co., Ltd.). A lower value of pKa indicates higher acid strength. Specifically, the acid dissociation constant pKa in an aqueous solution can be actually measured through the determination of the acid dissociation constant at 25° C. using an infinitely diluted aqueous solution. Alternatively, the values based on a database of heretofore known literature values and Hammett's substituent constants can be determined by calculation by means of the following software package 1. All the pKa values appearing in the present specification are those determined by calculation by means of this software package.

Software package 1: Advanced Chemistry Development (ACD/Labs) Software V8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

Q-A-(X)$_n$—B—R (PA-1)

In General Formula (PA-1),

Q represents —SO$_3$H, —CO$_2$H, or —X$_1$NHX$_2$Rf in which Rf represents an alkyl group, a cycloalkyl group, or an aryl group, and X$_1$ and X$_2$ each independently represent —SO$_2$— or —CO—.

A represents a single bond or a divalent linking group.

X represents —SO$_2$— or —CO—.

n represents 0 or 1.

B represents a single bond, an oxygen atom, or —N(Rx)Ry- in which Rx represents a hydrogen atom or a monovalent organic group, and Ry represents a single bond or a divalent organic group, provided that Rx may be bonded to Ry to form a ring or may be bonded to R to form a ring.

R represents a monovalent organic group containing a functional group with proton acceptor properties.

General Formula (PA-1) will be described in greater detail.

The divalent linking group in A is preferably a divalent linking group having 2 to 12 carbon atoms, and examples thereof include an alkylene group and a phenylene group. The divalent linking group is more preferably an alkylene group having at least one fluorine atom, preferably having 2 to 6 carbon atoms and more preferably 2 to 4 carbon atoms. The alkylene chain may contain a linking group such as an oxygen atom or a sulfur atom. In particular, the alkylene group is preferably an alkylene group in which 30 to 100% by number of hydrogen atoms are substituted with fluorine atoms, more preferably an alkylene group in which the carbon atoms bonded to the Q site have fluorine atoms, still more preferably a perfluoroalkylene group, and even still more preferably a perfluoroethylene group, a perfluoropropylene group, or a perfluorobutylene group.

The monovalent organic group in Rx is preferably a monovalent organic group having 1 to 30 carbon atoms, and examples thereof include an alkyl group, a cycloalkyl group, an aryl group, an aralkyl group, and an alkenyl group. These groups may further have a substituent.

The alkyl group in Rx may have a substituent and is preferably a linear or branched alkyl group having 1 to 20 carbon atoms, in which the alkyl chain may contain an oxygen atom, a sulfur atom, or a nitrogen atom.

The divalent organic group in Ry is preferably, for example, an alkylene group.

The ring structure that may be formed by bonding of Rx and Ry to each other is, for example, a 5- to 10-membered ring and particularly preferably a 6-membered ring, each of which contains a nitrogen atom.

Furthermore, the alkyl group having a substituent includes a group in which a cycloalkyl group is substituted particularly on a linear or branched alkyl group (for example, an adamantylmethyl group, an adamantylethyl group, a cyclohexylethyl group, or a camphor residue).

The cycloalkyl group in Rx may have a substituent and is preferably a cycloalkyl group having 3 to 20 carbon atoms, which may contain an oxygen atom in the ring.

The aryl group in Rx may have a substituent and is preferably an aryl group having 6 to 14 carbon atoms.

The aralkyl group in Rx may have a substituent and is preferably an aralkyl group having 7 to 20 carbon atoms.

The alkenyl group in Rx may have a substituent and includes, for example, a group having a double bond at an arbitrary position of the alkyl group described as Rx.

The functional group with proton acceptor properties in R is as defined above and includes a group containing, for example, a nitrogen-containing heterocyclic aromatic structure such as an azacrown ether, a primary to tertiary amine, pyridine, or imidazole.

The organic group containing such a structure preferably has 4 to 30 carbon atoms and examples thereof include an alkyl group, a cycloalkyl group, an aryl group, an aralkyl group, and an alkenyl group.

Examples of the alkyl group, cycloalkyl group, aryl group, aralkyl group, or alkenyl group in the alkyl group, cycloalkyl group, aryl group, aralkyl group, or alkenyl group, each containing the functional group with proton acceptor properties in R or an ammonium group, are the same as those of the alkyl group, cycloalkyl group, aryl group, aralkyl group, or alkenyl group described for Rx.

Examples of the substituent which the respective groups above may have include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). As for the cyclic structure in the aryl group, the cycloalkyl group, or the like, as well as the aminoacyl group, examples of the substituent further include an alkyl group (preferably having 1 to 20 carbon atoms).

When B is —N(Rx)Ry-, R and Rx are preferably bonded to each other to form a ring. The formation of a ring structure results in improved stability and the composition using this compound is also enhanced in the preservation stability thereof. The number of carbon atoms constituting the ring is preferably 4 to 20. The ring may be monocyclic or polycyclic and may contain an oxygen atom, a sulfur atom, or a nitrogen atom.

Examples of the monocyclic structure include a 4-, 5-, 6-, 7-, or 8-membered ring containing a nitrogen atom. Examples of the polycyclic structure include a structure consisting of a combination of two monocyclic structures or three or more monocyclic structures. The monocyclic structure or polycyclic structure may have a substituent, and preferred examples of the substituent include a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and an aminoacyl group (preferably having 2 to 20 carbon atoms). As for the cyclic structure in the aryl group, the cycloalkyl group, or the like, examples of the substituent further include an alkyl group (preferably having 1 to 15 carbon atoms). As for the aminoacyl group, examples of the substituent further include an alkyl group (preferably having 1 to 15 carbon atoms).

Rf in $—X_1NHX_2Rf$ represented by Q is preferably an alkyl group having 1 to 6 carbon atoms which may have a fluorine atom, and more preferably a perfluoroalkyl group having 1 to 6 carbon atoms. Preferably, at least one of $X_1$ or $X_2$ is $—SO_2—$, and more preferably, both of $X_1$ and $X_2$ are $—SO_2—$.

Among the compounds represented by General Formula (PA-1), a compound in which the Q site is a sulfonic acid can be synthesized by using a general sulfonamidation reaction. For example, this compound can be obtained by a method of selectively reacting one sulfonyl halide moiety of a bissulfonyl halide compound with an amine compound to form a sulfonamide bond and then hydrolyzing the other sulfonyl halide moiety, or a method of ring-opening a cyclic sulfonic anhydride through the reaction with an amine compound.

The compound (PA) is preferably an ionic compound. The functional group with proton acceptor properties may be contained in an anionic moiety or a cationic moiety, and it is preferred that the functional group is contained in an anionic moiety.

The compound (PA) is preferably any of the compounds represented by General Formulae (4) to (6).

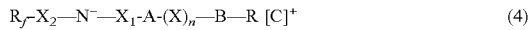  (4)

  (5)

  (6)

In General Formulae (4) to (6), A, X, n, B, R, Rf, $X_1$, and $X_2$ each have the same definition as in General Formula (PA-1).

$C^+$ represents a counter cation.

The counter cation is preferably an onium cation. More specifically, there may be mentioned a sulfonium cation (arylsulfonium compound) described as $S^+(R_{201})(R_{202})(R_{203})$ in General Formula (ZI) and those described in General Formula (ZII) in connection with the photoacid generator.

Specific examples of the compound (PA) include the compounds described in paragraphs <0743> to <0750> of JP2013-83966A, but the present invention is not limited thereto.

Furthermore, in the present invention, compounds (PA) other than a compound which generates the compound represented by General Formula (PA-1) can also be appropriately selected. For example, a compound containing a proton acceptor site at the cationic moiety thereof may be used as an ionic compound. More specific examples thereof include a compound represented by General Formula (7).

 (7)

In the formula, A represents a sulfur atom or an iodine atom.

m represents 1 or 2 and n represents 1 or 2, provided that m+n=3 when A is a sulfur atom and m+n=2 when A is an iodine atom.

R represents an aryl group.

$R_N$ represents an aryl group substituted with a functional group with proton acceptor properties.

$X^-$ represents a counter anion.

Specific examples of $X^-$ include the same anions as those of $X^-$ in General Formula (ZI). Preferred specific examples of the aryl group of R and $R_N$ include a phenyl group.

Specific examples of the functional group with proton acceptor properties contained in $R_N$ are the same as those of the functional group with proton acceptor properties in General Formula (PA-1).

In the top coat composition, the blending ratio of the compound (PA) in the total composition is preferably 0.1 to 10 mass % and more preferably 1 to 8 mass %, based on the total solid content.

(6) Guanidine Compound

The top coat composition may further contain, as a basic compound, a compound having a functional group with proton acceptor properties and capable of decomposing upon irradiation with actinic rays or radiation to generate a compound exhibiting deterioration in proton acceptor properties, no proton acceptor properties, or a change from the proton acceptor properties to acid properties (hereinafter, also referred to as a compound (PA)).

The guanidine compound exhibits strong basicity since the positive charge of a conjugate acid is dispersed and stabilized by three nitrogen atoms.

As for the basicity of the guanidine compound, the pKa of the conjugate acid is preferably 6.0 or greater, more preferably 7.0 to 20.0 in view of high neutralization reactivity with an acid and excellent roughness properties, and still more preferably 8.0 to 16.0.

Due to such strong basicity, the diffusibility of an acid is suppressed, which is thus capable of contributing to the formation of an excellent pattern shape.

In the present invention, log P is a logarithmic value of an n-octanol/water partition coefficient (P) and is an effective parameter capable of characterizing the hydrophilicity/hydrophobicity for a wide range of compounds. The partition coefficient is usually determined by computation but not from experiments and in the present invention, a value computed using a CS Chem Draw Ultra Ver. 8.0 software package (Crippen's fragmentation method).

In addition, the log P of the guanidine compound is preferably 10 or less. When the log P is the above-specified value or less, the guanidine compound can be uniformly contained in a resist film.

The log P of the guanidine compound is preferably within a range of 2 to 10, more preferably within a range of 3 to 8, and still more preferably within a range of 4 to 8.

In addition, the guanidine compound preferably does not have a nitrogen atom other than a guanidine structure.

Specific examples of the guanidine compound include the compounds described in paragraphs <0765> to <0768> of JP2013-83966A, but the present invention is not limited thereto.

(7) Low molecular weight compound having nitrogen atom and group capable of leaving by action of acid The top coat composition may contain a low molecular weight compound having a nitrogen atom and a group capable of leaving by the action of an acid (hereinafter, also referred to as a "low molecular weight compound (D) or "compound (D)"). The low molecular weight compound (D) preferably has basicity after the group capable of leaving by the action of an acid leaves.

The group capable of leaving by the action of an acid is not particularly limited, but it is preferably an acetal group, a carbonate group, a carbamate group, a tertiary ester group, a tertiary hydroxyl group, or a hemiaminal ether group and particularly preferably a carbamate group or a hemiaminal ether group.

The molecular weight of the low molecular weight compound (D) having a group capable of leaving by the action of an acid is preferably 100 to 1,000, more preferably 100 to 700, and particularly preferably 100 to 500.

The compound (D) is preferably an amine derivative having a group capable of leaving by the action of an acid on a nitrogen atom.

The compound (D) may contain a carbamate group having a protective group on a nitrogen atom. The protective group constituting the carbamate group may be represented by General Formula (d-1).

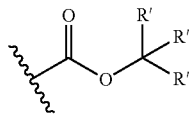

(d-1)

In General Formula (d-1),

R''s each independently represent a hydrogen atom, a linear or branched alkyl group, a cycloalkyl group, an aryl group, an aralkyl group, or an alkoxyalkyl group. R''s may be bonded to one other to form a ring.

R' is preferably a linear or branched alkyl group, a cycloalkyl group, or an aryl group. R' is more preferably a linear or branched alkyl group or a cycloalkyl group.

Specific structures of such a group are shown below.

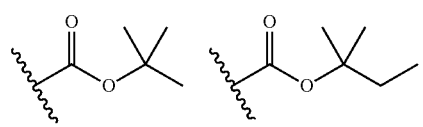

-continued

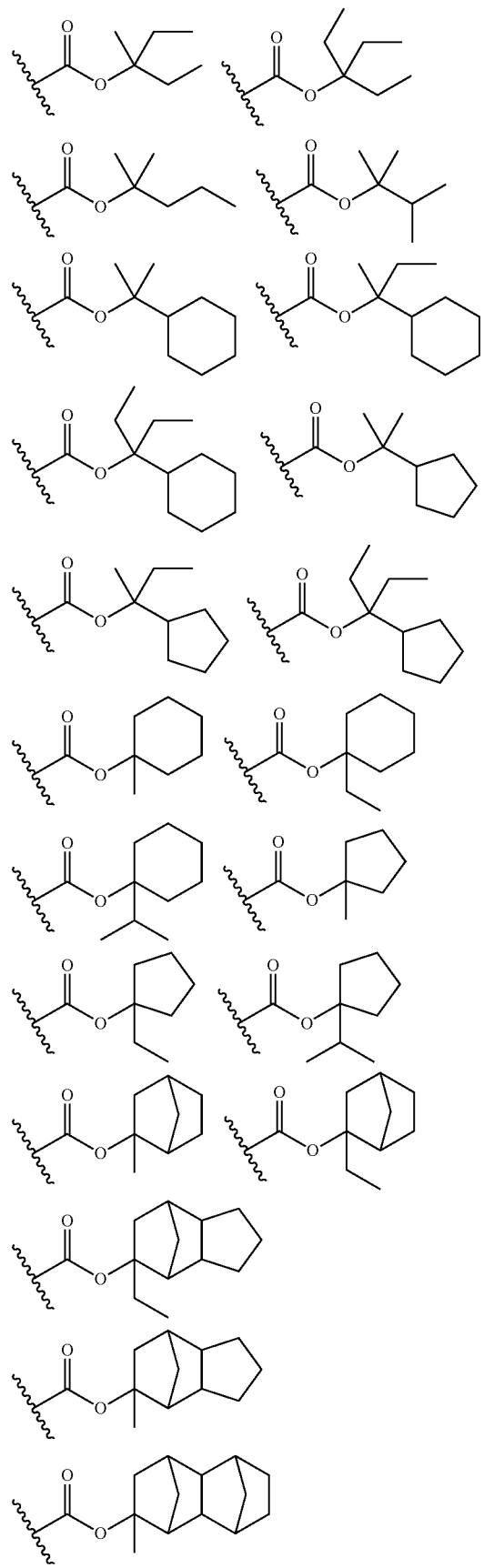

-continued

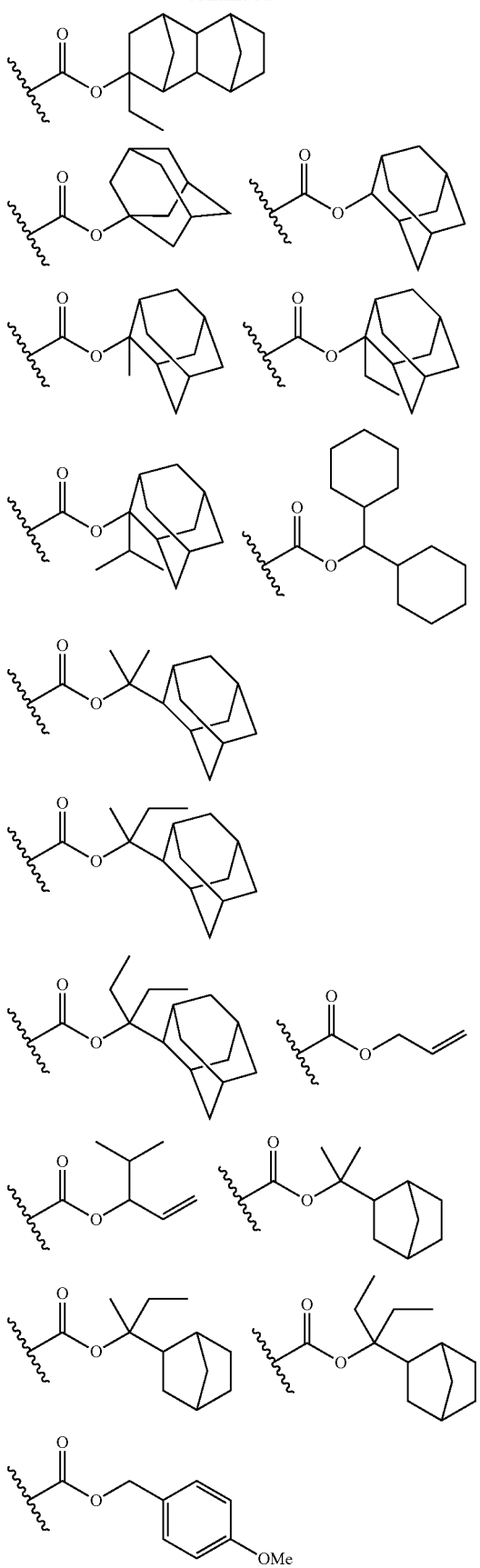

-continued

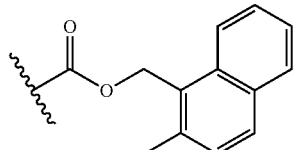
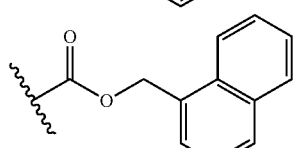
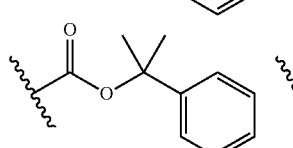
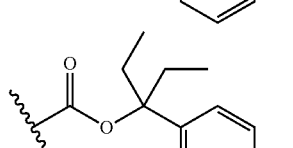
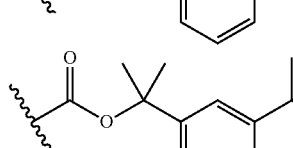
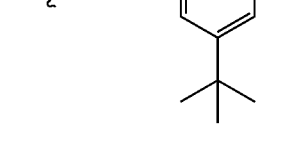
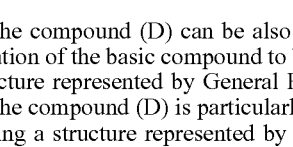

The compound (D) can be also constituted by any combination of the basic compound to be described later and the structure represented by General Formula (d-1).

The compound (D) is particularly preferably a compound having a structure represented by General Formula (J).

Furthermore, the compound (D) may correspond to the foregoing basic compound as long as it is a low molecular weight compound having a group capable of leaving by the action of an acid.

General Formula (J)

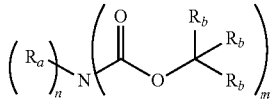

In General Formula (J), $R_a$ represents a hydrogen atom, an alkyl group, a cycloalkyl group, an aryl group, or an aralkyl group. Further, with n=2, two $R_a$'s may be the same as or different from each other, or the two $R_a$'s may be bonded to each other to form a divalent heterocyclic hydrocarbon group (preferably having 20 or less carbon atoms) or a derivative thereof.

$R_b$'s each independently represent a hydrogen atom, an alkyl group, a cycloalkyl group, an aryl group, an aralkyl group, or an alkoxyalkyl group. However, when one or more $R_b$'s in $—C(R_b)(R_b)(R_b)$ are a hydrogen atom, at least one of other $R_b$'s is a cyclopropyl group, a 1-alkoxyalkyl group, or an aryl group.

At least two $R_b$'s may be bonded to each other to form an alicyclic hydrocarbon group, an aromatic hydrocarbon group, a heterocyclic hydrocarbon group, or a derivative thereof.

n represents an integer of 0 to 2 and m represents an integer of 1 to 3, with n+m=3.

In General Formula (J), each of the alkyl group, cycloalkyl group, aryl group, and aralkyl group represented by $R_a$ and $R_b$ may be substituted with a functional group such as a hydroxyl group, a cyano group, an amino group, a pyrrolidino group, a piperidino group, a morpholino group, or an oxo group, an alkoxy group, or a halogen atom. The same shall also apply to the alkoxyalkyl group represented by $R_b$.

Examples of the alkyl group, cycloalkyl group, aryl group, and aralkyl group (each of the alkyl group, cycloalkyl group, aryl group, and aralkyl group may be substituted with the above-described functional group, an alkoxy group, or a halogen atom) of $R_a$ and/or $R_b$ include:

a group derived from a linear or branched alkane such as methane, ethane, propane, butane, pentane, hexane, heptane, octane, nonane, decane, undecane, or dodecane, or a group in which the group derived from an alkane is substituted with one or more kinds of or one or more groups of cycloalkyl groups such as a cyclobutyl group, a cyclopentyl group, and a cyclohexyl group;

a group derived from a cycloalkane such as cyclobutane, cyclopentane, cyclohexane, cycloheptane, cyclooctane, norbornane, adamantane, or noradamantane, or a group in which the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from an aromatic compound such as benzene, naphthalene or anthracene, or a group in which the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from a heterocyclic compound such as pyrrolidine, piperidine, morpholine, tetrahydrofuran, tetrahydropyran, indole, indoline, quinoline, perhydroquinoline, indazole, or benzimidazole, or a group in which the group derived from a heterocyclic compound is substituted with one or more kinds of or one or more groups of linear or branched alkyl groups or groups derived from an aromatic compound;

a group in which the group derived from a linear or branched alkane or the group derived from a cycloalkane is substituted with one or more kinds of or one or more groups of aromatic compound-derived groups such as a phenyl group, a naphthyl group, and an anthracenyl group; and a group in which the substituent above is substituted with a functional group such as a hydroxyl group, a cyano group, an amino group, a pyrrolidino group, a piperidino group, a morpholino group, or an oxo group.

In addition, examples of the divalent heterocyclic hydrocarbon group (preferably 1 to 20 carbon atoms) formed by bonding of $R_a$'s to each other or the derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, or 1,5,9-triazacyclododecane, or a group in which the group is derived from a heterocyclic compound is substituted with one or more kinds of or one or more groups of a group derived from a linear or branched alkane, a group derived from a cycloalkane, a group derived from an aromatic compound, a group derived from a heterocyclic compound, and a functional group such as a hydroxyl group, a cyano group, an amino group, a pyrrolidino group, a piperidino group, a morpholino group, or an oxo group.

Particularly preferred specific examples of the compound (D) in the present invention include the compounds described in paragraphs <0786> to <0788> of JP2013-83966A, but the present invention is not limited thereto.

The compound represented by General Formula (J) can be synthesized based on JP2007-298569A, JP2009-199021A, or the like.

In the present invention, the low molecular weight compound (D) may be used alone or in combination of two or more thereof.

Other examples of the compounds usable in the present invention include the compounds synthesized in Examples of JP2002-363146A, and the compounds described in paragraph "0108" of JP2007-298569A.

A photosensitive basic compound may be used as the basic compound. As the photosensitive basic compound, for example, the compounds described in JP2003-524799A, J. Photopolym. Sci & Tech. Vol. 8, pp. 543 to 553 (1995), and the like may be used.

As the basic compound, a compound referred to as a so-called photodegradable base may be used. Specific examples of the photodegradable base include onium salts of carboxylic acids, and onium salts of sulfonic acids which are not fluorinated at the α-position. Specific examples of photodegradable bases include those described in paragraph "0145" of WO2014/133048A1, JP2008-158339A, and JP399146B.

(Content of Basic Compound)

The content of the basic compound in the top coat composition is preferably 0.01 to 20 mass %, more preferably 0.1 to 10 mass %, and still more preferably 1 to 5 mass %, based on the solid content of the top coat composition.

(Base Generator)

Examples of the base generator (photobase generator) that can be contained in the top coat composition include the compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

In addition, the compounds described in JP2010-243773A may also be appropriately used.

Preferred specific examples of the photobase generator include, but are not limited to, 2-nitrobenzylcarbamate, 2,5-dinitrobenzylcyclohexylcarbamate, N-cyclohexyl-4-methylphenylsulfonamide, and 1,1-dimethyl-2-phenylethyl-N-isopropylcarbamate.

(Content of Base Generator)

The content of the base generator in the top coat composition is preferably 0.01 to 20 mass %, more preferably 0.1 to 10 mass %, and still more preferably 1 to 5 mass %, based on the solid content of the top coat composition.

<(A2) Compound Containing Bond or Group Selected from Group Consisting of Ether Bond, Thioether Bond, Hydroxyl Group, Thiol Group, Carbonyl Bond and Ester Bond>

A compound containing at least one group or bond selected from the group consisting of an ether bond, a thioether bond, a hydroxyl group, a thiol group, a carbonyl bond, and an ester bond (hereinafter, also referred to as compound (A2)) will be described below.

As described above, the compound (A2) is a compound containing at least one group or bond selected from the group consisting of an ether bond, a thioether bond, a hydroxyl group, a thiol group, a carbonyl bond, and an ester bond. Since an oxygen atom or a sulfur atom contained in these groups or bonds has an unshared electron pair, an acid can be trapped by the interaction with the acid diffusing from the actinic ray-sensitive or radiation-sensitive film.

In one embodiment of the top coat composition, the compound (A2) preferably has two or more groups or bonds selected from the above-mentioned group, more preferably three or more groups or bonds, and still more preferably four or more groups or bonds. In this case, groups or bonds selected from an ether bond, a thioether bond, a hydroxyl group, a thiol group, a carbonyl bond, and an ester bond, which are contained in a plural number in the compound (A2), may be the same as or different from each other.

The molecular weight of the compound (A2) is preferably 3,000 or less, more preferably 2,500 or less, still more preferably 2,000 or less, and particularly preferably 1,500 or less.

The number of carbon atoms contained in the compound (A2) is preferably 8 or more, more preferably 9 or more, and still more preferably 10 or more.

The number of carbon atoms contained in the compound (A2) is preferably 30 or less, more preferably 20 or less, and still more preferably 15 or less.

The compound (A2) is preferably a compound having a boiling point of 200° C. or higher, more preferably a compound having a boiling point of 220° C. or higher, and still more preferably a compound having a boiling point of 240° C. or higher.

The compound (A2) is preferably a compound having an ether bond, which preferably has two or more ether bonds, more preferably three or more ether bonds, and still more preferably four or more ether bonds.

In the top coat composition, it is more preferred that the compound (A2) contains a repeating unit containing an oxyalkylene structure represented by General Formula (1).

(1)

In the formula,
$R_{11}$ represents an alkylene group which may have a substituent,
n represents an integer of 2 or more, and
* represents a bond.

The number of carbon atoms in the alkylene group represented by $R_{11}$ in General Formula (1) is not particularly limited, but it is preferably 1 to 15, more preferably 1 to 5, still more preferably 2 or 3, and particularly preferably 2. In the case where the alkylene group has a substituent, the substituent is not particularly limited, but it is preferably, for example, an alkyl group (preferably having 1 to 10 carbon atoms).

n is preferably an integer of 2 to 20 and is more preferably 10 or less from the viewpoint of increasing DOF.

The average value of n is preferably 20 or less, more preferably 2 to 10, still more preferably 2 to 8, and particularly preferably 4 to 6 from the viewpoint of increasing DOF. Here, the "average value of n" refers to a value of n determined in such a manner that the weight-average molecular weight of the compound (A2) is measured by GPC and the general formula matches the obtained weight-average molecular weight. In the case where n is not an integer, it is a rounded-off value.

A plurality of $R_{11}$'s may be the same or different.

From the viewpoint of increasing DOF, the compound having a partial structure represented by General Formula (1) is preferably a compound represented by General Formula (1-1).

(1-1)

In the formula,
the definition, specific examples and preferred embodiments of $R_{11}$ are the same as $R_{11}$ in General Formula (1).
$R_{12}$ and $R_{13}$ each independently represent a hydrogen atom or an alkyl group. The number of carbon atoms in the alkyl group is not particularly limited, but it is preferably 1 to 15. $R_{12}$ and $R_{13}$ may be bonded to each other to form a ring.

m represents an integer of 1 or more. m is preferably an integer of 1 to 20, and is more preferably 10 or less from the viewpoint of increasing DOF.

From the viewpoint of increasing DOF, the average value of m is preferably 20 or less, more preferably 1 to 10, still more preferably 1 to 8, and particularly preferably 4 to 6. Here, the "average value of m" has the same definition as the "average value of n" described above.

In the case where m is 2 or more, a plurality of $R_{11}$'s may be the same or different.

In the top coat composition, the compound having a partial structure represented by General Formula (1) is preferably an alkylene glycol containing at least two ether bonds.

The compound (A2) may be a commercially available product or may be synthesized by a known method.

Specific examples of the compound (A2) are shown below, but the present invention is not limited thereto.

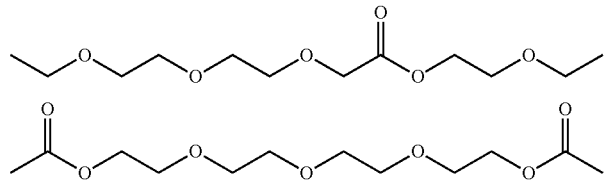

-continued
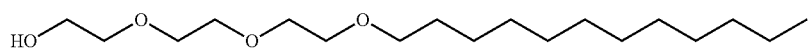
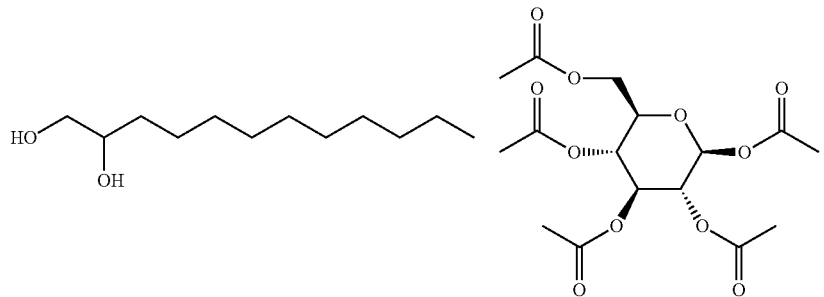
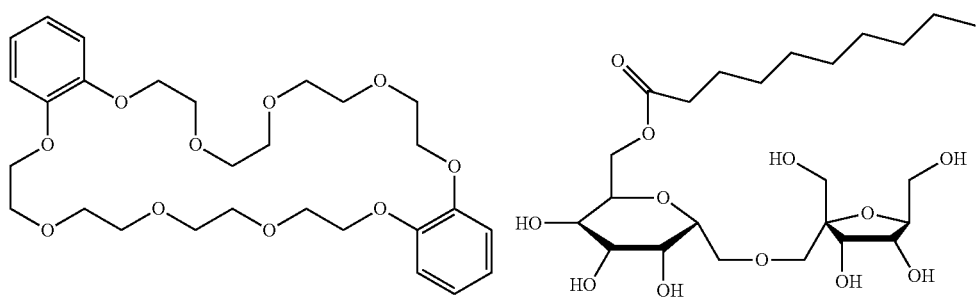
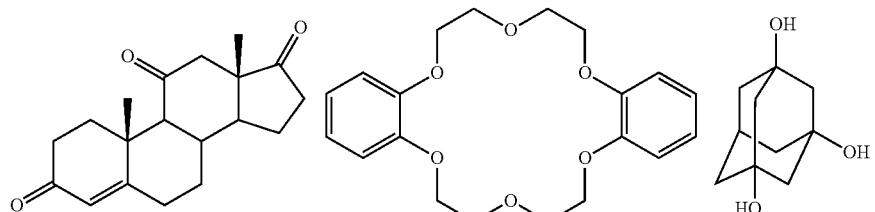
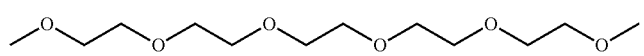
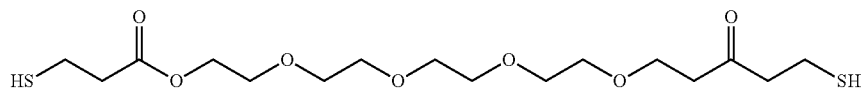
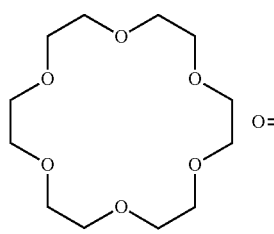
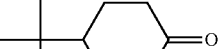
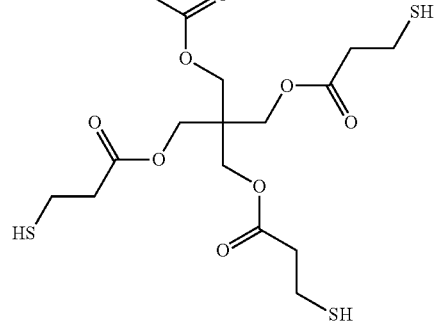
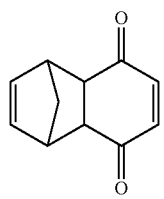
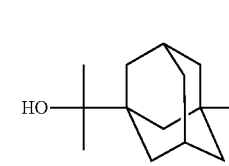
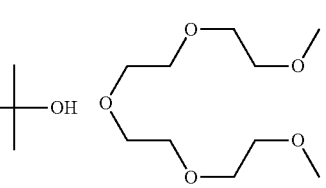
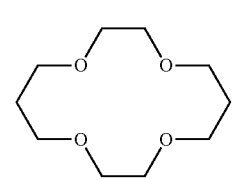

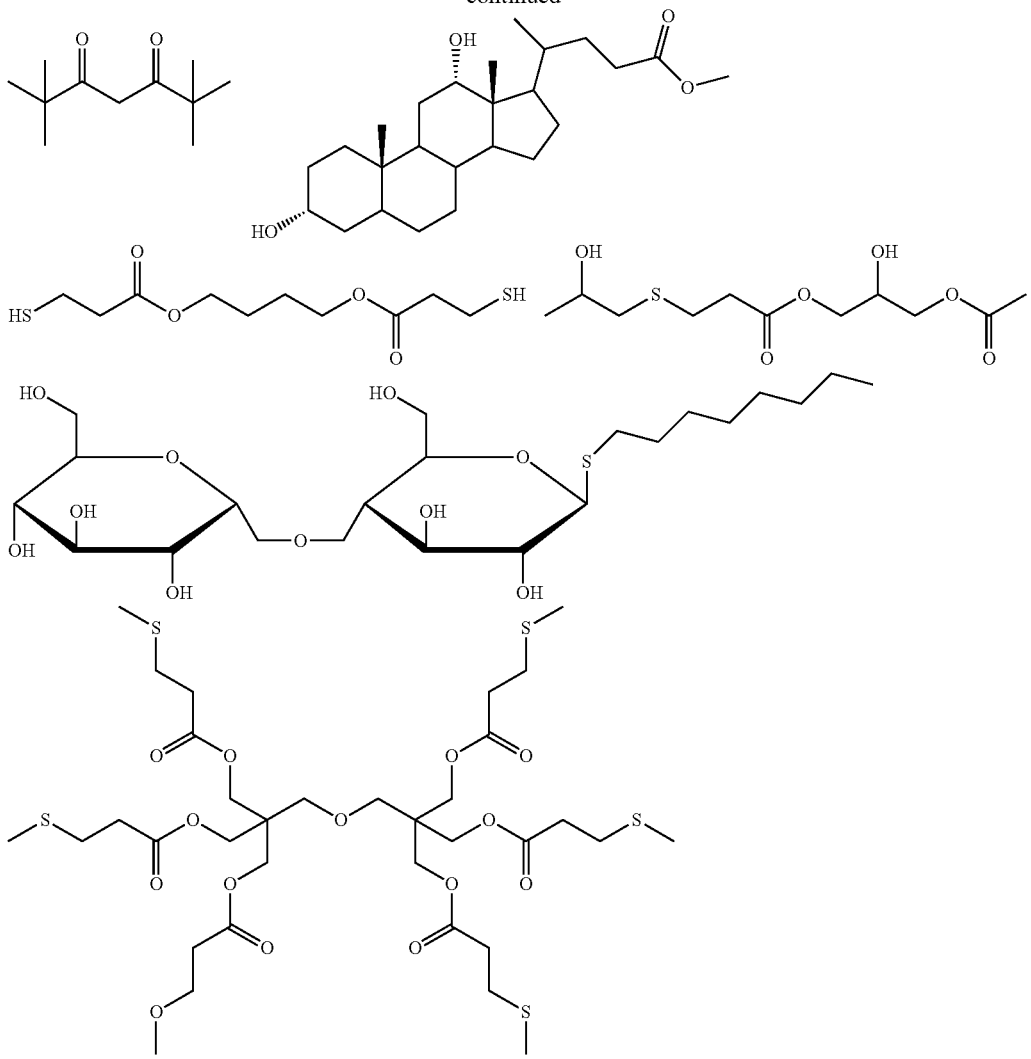

-continued

The content of the compound (A2) is preferably 0.1 to 30 mass %, more preferably 1 to 25 mass %, still more preferably 2 to 20 mass %, and particularly preferably 3 to 18 mass %, based on the total solid content in the upper layer film (top coat).

<(A3) Ionic Compound>

The top coat composition may contain an ionic compound which becomes a relatively weak acid with respect to the acid generator. The ionic compound is preferably an onium salt. In the case where the acid generated from the acid generator upon irradiation with actinic rays or radiation collides with an onium salt having an unreacted weak acid anion, a weak acid is released by salt exchange, and as a result, an onium salt having a strong acid anion is generated. In this process, a strong acid is exchanged into a weak acid having lower catalytic capacity, and thus, apparently, the acid is deactivated, and control of acid diffusion can be carried out.

The onium salt which becomes a relatively weak acid with respect to an acid generator is preferably a compound represented by each of General Formulae (d1-1) to (d1-3).

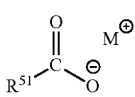 (d1-1)

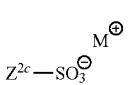 (d1-2)

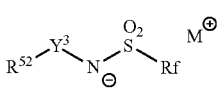 (d1-3)

In the formulae, $R^{51}$ is a hydrocarbon group which may have a substituent, $Z^{2c}$ is a hydrocarbon group having 1 to 30 carbon atoms which may have a substituent (here, the carbon adjacent to S is not substituted with a fluorine atom), $R^{52}$ is an organic group, $Y^3$ is a linear, branched, or cyclic alkylene group or arylene group, Rf is a hydrocarbon group containing a fluorine atom, and $M^+$'s are each independently a sulfonium cation or an iodonium cation.

Preferred examples of the sulfonium cation or iodonium cation represented by $M^+$ include a sulfonium cation exemplified in General Formula (ZI) and an iodonium cation exemplified in General Formula (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to an acid generator may be (C) a compound (hereinafter, also referred to as a "compound (CA)") which has a cationic moiety and an anionic moiety in the same molecule and further, in which the cationic moiety and the anionic moiety are linked to each other through a covalent bond.

The compound (CA) is preferably a compound represented by any one of General Formulae (C-1) to (C-3).

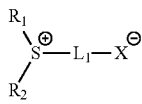

(C-1)

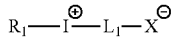

(C-2)

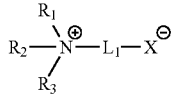

(C-3)

In General Formulae (C-1) to (C-3), $R_1$, $R_2$, and $R_3$ represent a substituent having 1 or more carbon atoms, $L_1$ represents a divalent linking group that links a cationic moiety with an anionic moiety, or a single bond, —X⁻ represents an anionic moiety selected from —COO⁻, —SO$_3$⁻, —SO$_2$⁻, and —N⁻—R$_4$. $R_4$ represents a monovalent substituent having a carbonyl group: —C(=O)—, a sulfonyl group: —S(=O)$_2$—, or a sulfinyl group: S(=O)— at a site for linking to an adjacent N atom, and $R_1$, $R_2$, $R_3$, $R_4$, and $L_1$ may be bonded to one another to form a ring structure. Further, in (C-3), two of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, among which an alkyl group, a cycloalkyl group, and an aryl group are preferred.

Examples of $L_1$ as a divalent linking group include a linear or branched alkylene group, a cycloalkylene group, an arylene group, a carbonyl group, an ether bond, an ester bond, an amide bond, a urethane bond, a urea bond, and a group formed by a combination of two or more of these groups. $L_1$ is more preferably an alkylene group, an arylene group, an ether bond, an ester bond, or a group formed by a combination of two or more of these groups.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] to [0013] of JP2012-189977A.

Preferred examples of the compound represented by General Formula (C-3) include the compounds exemplified in paragraphs [0029] to [0031] of JP2012-252124A.

(Content of Onium Salt)

The content of the onium salt in the top coat composition is preferably 0.5 mass % or more, more preferably 1 mass % or more, and still more preferably 2.5 mass % or more, based on the solid content of the top coat composition.

On the other hand, the upper limit of the content of the onium salt is preferably 25 mass % or less, more preferably 20 mass % or less, still more preferably 10 mass % or less, and particularly preferably 8 mass % or less, based on the solid content of the top coat composition.

<(A4) Compound Having Radical Trapping Group>

The compound having a radical trapping group (A4) is also referred to as a compound (A4).

The radical trapping group is a group that captures an active radical and stops the radical reaction. Examples of the radical trapping group include a group that reacts with an active radical and is converted into a stable free radical and a group having a stable free radical.

Examples of such a compound having a radical trapping group include hydroquinone, catechol, benzoquinone, a nitroxyl radical compound, an aromatic nitro compound, an N-nitroso compound, benzothiazole, dimethylaniline, phenothiazine, vinylpyrene, and derivatives thereof.

A specific example of the radical trapping group having no basicity is preferably at least one group selected from the group consisting of a hindered phenol group, a hydroquinone group, an N-oxyl free radical group, a nitroso group, and a nitrone group.

The number of radical trapping groups contained in the compound (A4) is not particularly limited, but in the case where the compound (A4) is a compound other than a polymer compound, the number of radical trapping groups is preferably 1 to 10 in one molecule, more preferably 1 to 5, and still more preferably 1 to 3.

On the other hand, in the case where the compound (A4) is a polymer compound having a repeating unit, the repeating unit having a radical trapping group preferably has 1 to 5 radical trapping groups and more preferably 1 to 3 radical trapping groups. The composition ratio of the repeating unit having a radical trapping group in the polymer compound is preferably 1 to 100 mol %, more preferably 10 to 100 mol %, and still more preferably 30 to 100 mol %.

The compound (A4) having a radical trapping group is preferably a compound having a nitrogen oxygen bond, and more preferably a compound represented by any one of General Formulae (1) to (3).

Note that the compound represented by General Formula (1) corresponds to a compound having an N-oxyl free radical group, the compound represented by General Formula (2) corresponds to a compound having a nitroso group, and the compound represented by General Formula (3) corresponds to a compound having a nitrone group.

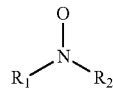

(1)

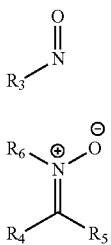

In General Formulae (1) to (3), $R_1$ to $R_6$ each independently represent an alkyl group, a cycloalkyl group, or an aryl group. In General Formula (1), $R_1$ and $R_2$ may be bonded to each other to form a ring, and in General Formula (3), at least two of $R_4$ to $R_6$ may be bonded to each other to form a ring.

The ring in which the alkyl group, cycloalkyl group, and aryl group represented by $R_1$ to $R_6$, the ring which may be formed by bonding of $R_1$ and $R_2$ to each other, and at least two of $R_4$ to $R_6$ may be bonded to one other to form may have a substituent.

Examples of the alkyl group represented by $R_1$ to $R_6$ include a linear or branched alkyl group having 1 to 10 carbon atoms, specific examples of which include a methyl group, an ethyl group, an n-propyl group, an i-propyl group, an n-butyl group, a 2-methylpropyl group, a 1-methylpropyl group, a t-butyl group, an n-pentyl group, a neopentyl group, and an n-hexyl group. Among them, a methyl group, an ethyl group, an n-butyl group, and a t-butyl group are preferred.

Examples of the cycloalkyl group represented by $R_1$ to $R_6$ include a cycloalkyl group having 3 to 15 carbon atoms, specific examples of which preferably include a cyclopropyl group, a cyclobutyl group, a cyclopentyl group, a cyclohexyl group, a cycloheptyl group, a cyclooctyl group, a norbornyl group, and an adamantyl group.

Examples of the aryl group represented by $R_1$ to $R_6$ include an aryl group having 6 to 14 carbon atoms, specific examples of which preferably include a phenyl group, a tolyl group, and a naphthyl group.

The ring which may be formed by $R_1$ and $R_2$ and the ring which may be formed by $R_4$ to $R_6$ are preferably a 5- to 10-membered ring and more preferably a 5- or 6-membered ring.

Examples of the substituent, which may be contained in the alkyl group, cycloalkyl group, and aryl group represented by $R_1$ to $R_6$, the ring which may be formed by bonding of $R_1$ and $R_2$ to each other, and the ring which may be formed by bonding of at least two of $R_4$ to $R_6$ may be bonded to each other, include a halogen atom (for example, a fluorine atom), a hydroxyl group, a carboxyl group, a cyano group, a nitro group, an amino group, an oxy group, an alkoxy group, an alkoxyalkyl group, an alkoxycarbonyl group, an alkoxycarbonyloxy group, an acylamide group (RCONH—: R is a substituted or unsubstituted alkyl group or phenyl group), —SO$_2$Na, and —P(=O)(OC$_2$H$_5$)$_2$.

Examples of the substituent, which may be contained in the cycloalkyl group and the aryl group represented by $R_1$ to $R_6$, may further include an alkyl group.

The compound represented by any one of General Formulae (1) to (3) may be in the form of a resin, and in this case, at least one of $R_1$, $R_2$, $R_3$, $R_4$, $R_5$, or $R_6$ may be bonded to the main chain or side chain of the resin.

Specific examples of the compound (A4) having a radical trapping group are shown below, but the present invention is not limited thereto.

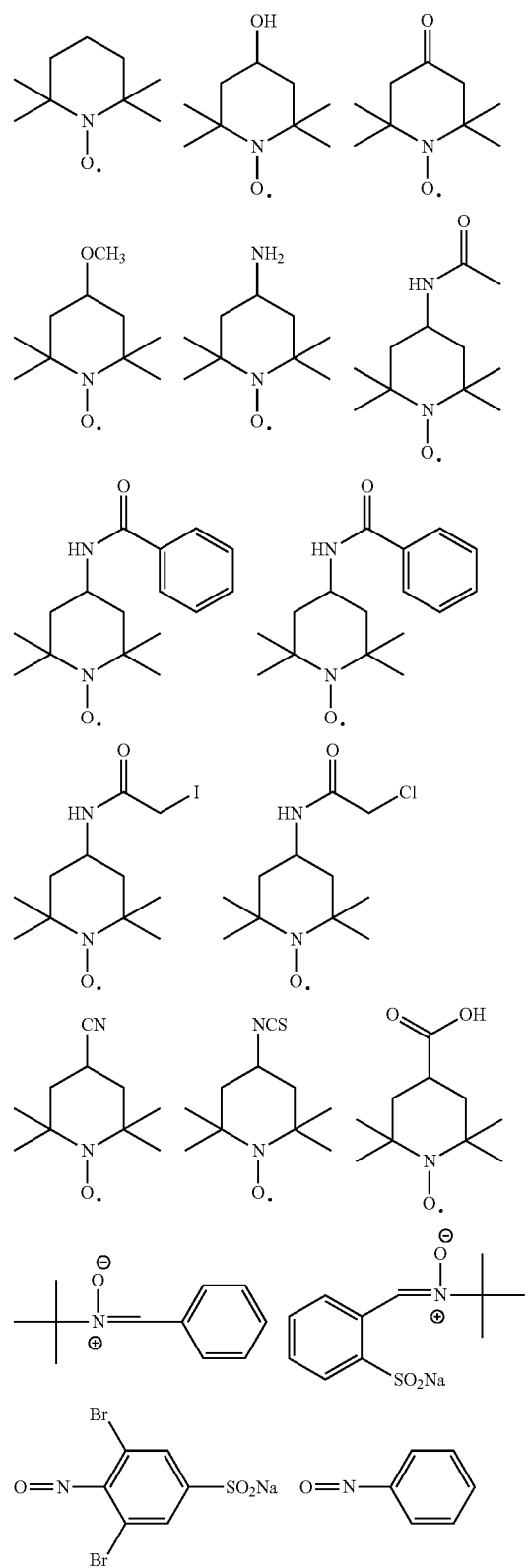

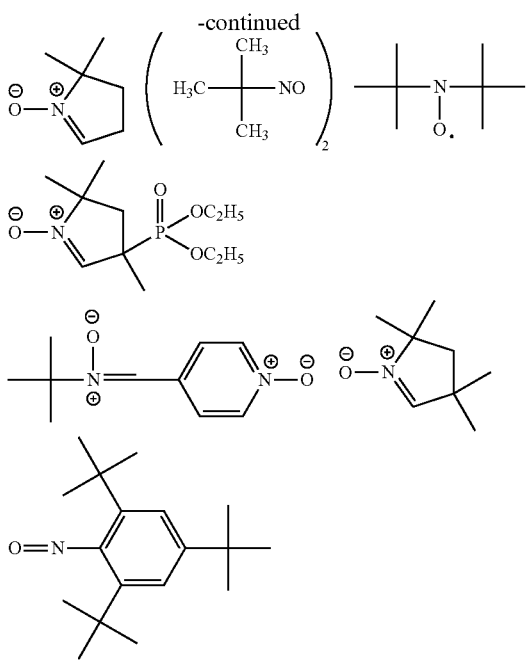

Further, as described above, the compound (A4) may be a polymer compound having a repeating unit. Specific examples of the repeating unit of the compound (A4) which is a polymer compound are shown below, but the present invention is not limited thereto.

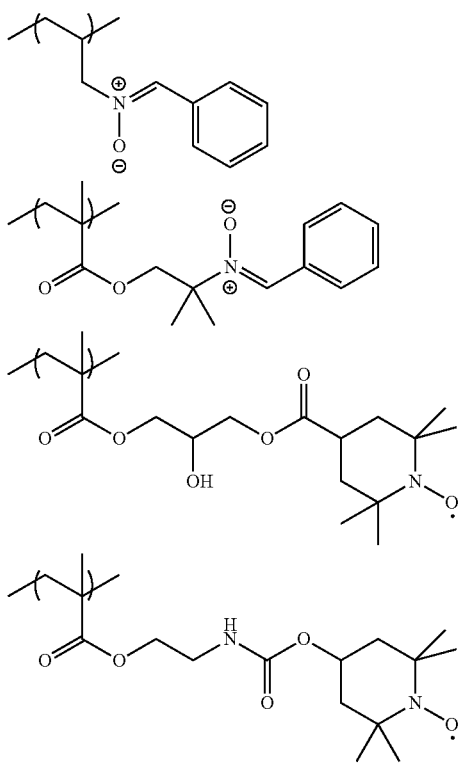

In the case where the compound (A4) having a radical trapping group is a low molecular weight compound, the molecular weight thereof is not particularly limited and is preferably 100 to 5,000, more preferably 100 to 2,000, and still more preferably 100 to 1,000.

In the case where the compound (A4) having a radical trapping group is a polymer compound having a repeating unit, the weight-average molecular weight thereof is preferably 5,000 to 20,000 and more preferably 5,000 to 10,000.

The compound (A4) having a radical trapping group may be a commercially available compound or may be synthesized by a known method. Alternatively, the compound (A4) may be synthesized by reacting a commercially available low molecular weight compound having a radical trapping group with a polymer compound having a reactive group such as an epoxy group, a halogenated alkyl group, an acid halide group, a carboxyl group, or an isocyanate group.

The content of the compound (A4) having a radical trapping group is usually 0.001 to 10 mass % and preferably 0.01 to 5 mass %, based on the total solid content of the top coat composition.

The top coat composition may contain a plural number of one compound selected from the group consisting of (A1) to (A4). For example, two or more compounds (A1) distinguished from each other may be contained.

Further, the top coat composition may contain two or more compounds selected from the group consisting of (A1) to (A4). For example, the top coat composition may contain both the compound (A1) and the compound (A2).

In the case where the top coat composition contains a plurality of compounds selected from the group consisting of (A1) to (A4), the total content of these compounds is usually 0.001 to 20 mass %, preferably 0.01 to 10 mass %, and more preferably 1 to 8 mass %, based on the total solid content of the top coat composition.

The compound (A4) having a radical trapping group may be used alone or in combination of two or more thereof.

<Surfactant>

The top coat composition may further contain a surfactant.

The surfactant is not particularly limited, and any of an anionic surfactant, a cationic surfactant, and a nonionic surfactant may be used as long as it is capable of ensuring uniform film formation from the top coat composition and is soluble in the solvent of the top coat composition.

The amount of the surfactant added is preferably 0.001 to 20 mass % and more preferably 0.01 to 10 mass %.

The surfactants may be used alone or in combination of two or more thereof.

The surfactant can be suitably selected from, for example, an alkyl cationic surfactant, an amide-type quaternary cationic surfactant, an ester-type quaternary cationic surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine-and/or silicon-based surfactant (a fluorine-based surfactant, a silicon-based surfactant, and a surfactant containing both a fluorine atom and a silicon atom).

Specific examples of the surfactant include surfactants including polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; and commercially available surfactants recited below.

Examples of usable commercially available surfactants include fluorine-based surfactants or silicon-based surfactants such as EFTOP EF301 and EF303 (manufactured by Shin-Akita Kasei Co., Ltd.), FLUORAD FC430, 431, and 4430 (manufactured by Sumitomo 3M Limited), MEGAFAC F171, F173, F176, F189, F113, F110, F177, F120, and R08 (manufactured by Dainippon Ink and Chemicals Inc.), SURFLON S-382, SC101, 102, 103, 104, 105, and 106 (manufactured by Asahi Glass Co., Ltd.), TROYSOL S-366 (manufactured by Troy Chemical Co., Ltd.), GF-300 and GF-150 (manufactured by Toagosei Co., Ltd.), SURFLON S-393 (manufactured by Seimi Chemical Co., Ltd.), EFTOP EF121, EF122A, EF122B, RF122C, EF125M, EF135M, EF351, EF352, EF801, EF802, and EF601 (manufactured by Jemco Inc.), PF636, PF656, PF6320, and PF6520 (manufactured by OMNOVA Solutions Inc.), FTX-204G, 208G, 218G, 230G, 204D, 208D, 212D, 218D, and 222D (manufactured by Neos Company Limited). In addition, a polysiloxane polymer KP-341 (manufactured by Shin-Etsu Chemical Co., Ltd.) may also be used as the silicon-based surfactant.

<Method for Preparing Top Coat Composition>

The top coat composition is preferably prepared in such a manner that the above-mentioned individual components are dissolved in a solvent, and then filtered using a filter. The filter is preferably a filter made of polytetrafluoroethylene, polyethylene, or nylon having a pore size of 0.1 µm or less, more preferably 0.05 µm or less, and still more preferably 0.03 µm or less. Note that a plurality of filters may be connected in series or in parallel. Further, the composition may be filtered a plurality of times, and the step of filtering a plurality of times may be a circulatory filtration step. In addition, the composition may be subjected to a deaeration treatment or the like before or after the filtration using a filter. The top coat composition of the present invention preferably does not contain impurities such as metals. The content of the metal components contained in these materials is preferably 10 ppm or less, more preferably 5 ppm or less, and still more preferably 1 ppm or less. Particularly preferably, the top coat composition of the present invention is substantially free of metal component impurities (under the detection limit of the measurement device).

The top coat may be formed, for example, based on the description of paragraphs <0072> to <0082> of JP2014-059543A, in addition to the embodiment in which the top coat is formed by the above-mentioned top coat composition. Also preferred is an embodiment in which a top coat containing a basic compound, described in JP2013-61648A, is formed on a resist film. Furthermore, even in the case where the exposure is carried out by a method other than an immersion exposure method, a top coat may be formed on a resist film.

In the immersion exposure step, it is required for the immersion liquid to move over a wafer while following the movement of an exposure head for scanning the wafer at a high speed to form an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

The film irradiated with actinic rays or radiation in the step (2) may be subjected to a heat treatment (PEB: Post Exposure Bake), after the step (2) and before the step (3) to be described later. This step promotes the reaction of the exposed portion. The heat treatment (PEB) may be carried out a plurality of times.

The temperature of the heat treatment is preferably 70° C. to 130° C. and more preferably 80° C. to 120° C.

The time of the heat treatment is preferably 30 to 300 seconds, more preferably 30 to 180 seconds, and still more preferably 30 to 90 seconds.

The heat treatment may be carried out by a means provided in a conventional exposure/development machine, and may also be carried out using a hot plate or the like.

[Step (3): Development Step]

The step (3) is a step of developing the film irradiated with actinic rays or radiation in the step (2) with a developer containing an organic solvent (hereinafter, also referred to as an organic developer).

As the organic developer, a polar solvent such as a ketone-based solvent, an ester-based solvent, an alcohol-based solvent, an amide-based solvent, or an ether-based solvent, and a hydrocarbon-based solvent may be used. Specific examples thereof include methyl 2-hydroxyisobutyrate, isobutyl isobutyrate, butyl propionate, butyl butanoate, and isoamyl acetate, in addition to those described in paragraphs <0461> to <0463> of JP2014-048500A.

The above-mentioned solvent may be used as a mixture of a plurality of solvents, or may be used in admixture with water or a solvent other than those described above. However, in order to fully achieve the effect of the present invention, it is preferred that the moisture content of the whole developer is less than 10 mass %, and it is more preferred that the developer is substantially free of water.

That is, the amount of the organic solvent used relative to the organic developer is preferably 90 mass % or more and 100 mass % or less, and more preferably 95 mass % or more and 100 mass % or less, with respect to the total amount of the developer.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, evaporation of the developer on a substrate or in a development cup is suppressed, the temperature uniformity in the wafer plane is improved, and as a result, the dimensional uniformity in the wafer plane is improved.

If necessary, a surfactant may be added in an appropriate amount to the organic developer.

The surfactant is not particularly limited, and for example, an ionic or nonionic fluorine-based and/or silicon-based surfactant may be used. Examples of the fluorine-based and/or silicon-based surfactants include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720A, 5,360,692A, 5,529,881A, 5,296,330A, 5,436,098A, 5,576,143A, 5,294,511A, and 5,824,451A. A nonionic surfactant is preferred. The nonionic surfactant is not particularly limited, but use of a fluorine-based surfactant or a silicon-based surfactant is more preferred.

The amount of the surfactant used is usually 0.001 to 5 mass %, preferably 0.005 to 2 mass %, and more preferably 0.01 to 0.5 mass %, with respect to the total amount of the developer.

The organic developer may contain a basic compound. Specific examples and preferred examples of the basic compound that can be contained in the organic developer used in the present invention are the same as those in the basic compound that may be contained in the composition, described above as the acid diffusion control agent.

Examples of the development method applicable herein include a method in which a substrate is dipped in a bath filled with a developer for a given period of time (dip method), a method in which a developer is raised on the surface of a substrate by its surface tension and allowed to stand still for a given period of time to thereby effect development (puddle method), a method in which a developer is sprayed onto the surface of a substrate (spray method), and a method in which a developer is continuously ejected onto a substrate spinning at a given speed while scanning a developer discharge nozzle at a given speed (dynamic dispense method). The preferable range of the discharge pressure of the discharged developer and the method of adjusting the discharge pressure of the developer are not particularly limited. For example, the range and method described in paragraphs <0631> to <0636> of JP2013-242397A can be used.

In the pattern forming method of the present invention, a combination of a development step (organic solvent development step) using a developer containing an organic solvent and a development step (alkaline development step) using an aqueous alkaline solution may also be used. As a result, a finer pattern can be formed.

The alkaline developer is not particularly limited, and examples thereof include an alkaline developer described in paragraph <0460> of JP2014-048500A.

As the rinsing liquid in the rinsing treatment which is carried out after alkaline development, pure water may be used or may also be used with the addition of an appropriate amount of a surfactant.

In the present invention, a portion having a weak exposure intensity is removed by an organic solvent development step, but a portion having a high exposure intensity is also removed by further carrying out an alkaline development step. Since the pattern formation can be carried out without dissolving only the region of the intermediate exposure intensity by the multiple development process in which the development is carried out a plurality of times in this way, a finer pattern than usual can be formed (mechanism similar to paragraph <0077> of JP2008-292975A).

In the pattern forming method of the present invention, the order of the alkaline development step and the organic solvent development step is not particularly limited, but it is more preferable to carry out the alkaline development before the organic solvent development step.

After the step of carrying out the development by using a developer containing an organic solvent, it is preferable to include a step of carrying out the rinsing by using a rinsing liquid.

The rinsing liquid used in the rinsing step after the step of carrying out development using a developer containing an organic solvent is not particularly limited as long as it does not dissolve the resist pattern, and a solution containing a conventional organic solvent may be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, ketone-based solvent, ester-based solvent, alcohol-based solvent, amide-based solvent, and ether-based solvent are the same as those described above for the developer containing an organic solvent.

After the step of carrying out the development by using a developer containing an organic solvent, more preferably, a step of carrying out the rinsing by using a rinsing liquid containing at least one organic solvent selected from the group consisting of a ketone-based solvent, an ester-based solvent, an alcohol-based solvent, an amide-based solvent, and a hydrocarbon-based solvent is carried out; still more preferably, a step of carrying out the rinsing by using a rinsing liquid containing an alcohol-based solvent or an ester-based solvent is carried out; particularly preferably, a step of carrying out the rinsing by using a rinsing liquid containing a monohydric alcohol is carried out; and most preferably, a step of carrying out the rinsing by using a rinsing liquid containing a monohydric alcohol having 5 or more carbon atoms is carried out.

As the hydrocarbon-based solvent to be contained in the rinsing liquid, a hydrocarbon compound having 6 to 30 carbon atoms is preferred, a hydrocarbon compound having 8 to 30 carbon atoms is more preferred, and a hydrocarbon compound having 10 to 30 carbon atoms is particularly preferred. By using a rinsing liquid containing decane and/or undecane among those, pattern collapse is inhibited.

In the case where an ester-based solvent is used as the organic solvent, a glycol ether-based solvent may also be used in addition to the ester-based solvent (one kind or two or more kinds). Specific examples in this case include use of an ester-based solvent (preferably butyl acetate) as a main component and a glycol ether-based solvent (preferably propylene glycol monomethyl ether (PGME)) as a minor component. By such a use, a residue defect is further inhibited.

The monohydric alcohol used in the rinsing step may be, for example, a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol. As for the particularly preferred monohydric alcohol having 5 or more carbon atoms, 1-hexanol, 2-hexanol, 4-methyl-2-pentanol, 1-pentanol, 3-methyl-1-butanol, or the like may be used.

Individual components may be used as a mixture of a plurality thereof, or may be used in admixture with an organic solvent other than those described above.

The moisture content in the rinsing liquid is preferably 10 mass % or less, more preferably 5 mass % or less, and particularly preferably 3 mass % or less. By setting the moisture content to 10 mass % or less, good development properties can be obtained.

The vapor pressure at 20° C. of the rinsing liquid to be used after the step of carrying out the development using a developer containing an organic solvent is preferably 0.05 kPa to 5 kPa, more preferably 0.1 kPa to 5 kPa, and most preferably 0.12 kPa to 3 kPa. By setting the vapor pressure of the rinsing liquid to a range of 0.05 kPa to 5 kPa, the temperature uniformity within a wafer plane is improved, and further, the dimensional uniformity within a wafer plane is enhanced by inhibition of swelling due to the permeation of the rinsing liquid.

The rinsing liquid may also be used after adding an appropriate amount of a surfactant thereto.

In the rinsing step, the wafer which has been subjected to development using a developer containing an organic solvent is subjected to a cleaning treatment using a rinsing liquid containing the organic solvent. The method of cleaning treatment is not particularly limited, but it is possible to employ, for example, a method of continuously ejecting a rinsing liquid on a substrate spinning at a given speed (spin coating method), a method of dipping a substrate in a bath filled with a rinsing liquid for a given period of time (dip method), or a method of spraying a rinsing liquid on a substrate surface (spray method), and among them, it is preferred that the cleaning treatment is carried out by the spin coating method and after the cleaning, the substrate is spun at a rotation speed of 2,000 rpm to 4,000 rpm to remove the rinsing liquid from the substrate. Further, it is also preferred that a heating step (Post Bake) is included after the rinsing step. The developer and the rinsing liquid that remain between and inside the patterns are removed by the baking. The heating step after the rinsing step is usually carried out at 40° C. to 160° C. and preferably at 70° C. to 95° C., and usually for 10 seconds to 3 minutes and preferably for 30 seconds to 90 seconds.

It is preferred that various materials (for example, a developer, a rinsing liquid, a composition for forming an antireflection film, a composition for forming a top coat, and the like) used in the composition of the present invention, and the pattern forming method of the present invention do not include impurities such as metals. The content of metal components contained in these materials is preferably 1 part per million (ppm) or less, more preferably 100 parts per trillion (ppt) or less, still more preferably 10 ppt or less, and particularly preferably 1 ppt or less.

The method for removing impurities such as metals from the various materials may be, for example, filtration using a filter. As for the filter pore diameter, the pore size is preferably 50 nm or less, more preferably 10 nm or less, and still more preferably 5 nm or less. As for the materials of a filter, a polytetrafluoroethylene-made filter, a polyethylene-made filter, and a nylon-made filter are preferred. In the step of filtration using a filter, plural kinds of filters may be connected in series or in parallel, and used. In the case of using plural kinds of filters, a combination of filters having different pore diameters and/or materials may be used. In addition, various materials may be filtered plural times, and a step of filtering plural times may be a circulatory filtration step.

Moreover, examples of the method for reducing impurities such as metals contained in the various materials include a method of selecting raw materials having a small content of metals as raw materials constituting various materials, and a method of subjecting raw materials constituting various materials to filtration using a filter. The preferred conditions for the filtration using a filter, which is carried out for raw materials constituting various materials, are the same as described above.

In addition to filtration using a filter, removal of impurities by an adsorbing material may be carried out, or a combination of filtration using a filter and filtration using an adsorbing material may be used. As the adsorbing material, known adsorbing materials may be used. For example, inorganic adsorbing materials such as silica gel and zeolite, and organic adsorbing materials such as activated carbon may be used.

In order to reduce impurities such as metals contained in the various materials, it is necessary to prevent incorporation of metal impurities in the production process. Whether metal impurities have been sufficiently removed from the production apparatus can be confirmed by measuring the content of the metal components contained in the cleaning liquid used for cleaning the production apparatus. The content of the metal components contained in the cleaning liquid after use is more preferably 100 parts per trillion (ppt) or less, still more preferably 10 ppt or less, and particularly preferably 1 ppt or less.

In order to prevent breakdown of chemical liquid piping and various parts (a filter, an O-ring, a tube, and the like) due to electrostatic charging and subsequent electrostatic discharging, a conductive compound may be added to the organic treatment liquid (a resist solvent, a developer, a rinsing liquid, or the like) used in the composition of the present invention and the pattern forming method of the present invention. The conductive compound is not particularly limited and is, for example, methanol. The addition amount of the conductive compound is not particularly limited, but it is preferably 10 mass % or less and more preferably 5 mass % or less from the viewpoint of maintaining favorable development properties. Regarding the members of the chemical liquid piping, it is possible to use various pipes coated with SUS (stainless steel), or polyethylene, polypropylene, or a fluororesin (a polytetrafluoroethylene resin, a perfluoroalkoxy resin, or the like) subjected to an antistatic treatment. Likewise, polyethylene, polypropylene, or a fluororesin (a polytetrafluoroethylene resin, a perfluoroalkoxy resin, or the like) subjected to an antistatic treatment may also be used for a filter and an O-ring.

A method for improving the surface roughness of a pattern may also be applied to the pattern formed by the method of the present invention. Examples of the method for improving the surface roughness of a pattern include a method for treating a resist pattern by plasma of a hydrogen-containing gas disclosed in WO2014/002808A1. In addition, known methods described in JP2004-235468A, US2010/0020297A, JP2008-83384A, and Proc. of SPIE Vol. 8328 83280N-1 "EUV Resist Curing Technique for LWR Reduction and Etch Selectivity Enhancement" may also be applied.

The pattern forming method of the present invention may also be used for guide pattern formation in Directed Self-Assembly (DSA) (see, for example, ACS Nano, Vol. 4, No. 8, pp. 4815 to 4823).

Further, the resist pattern formed by the above-mentioned method may be used as a core material (core) in the spacer process disclosed in, for example, JP1991-270227A (JP-H03-270227A) and JP2013-164509A.

Further, the present invention also relates to a method for producing an electronic device, including the above-mentioned pattern forming method of the present invention, and an electronic device produced by this production method.

The electronic device of the present invention is suitably mounted on electric electronic equipment (such as a home electronic device, an office automation (OA)•media-related device, an optical device, and a communication device).

EXAMPLES

The present invention will be described in more detail with reference to the Examples, but the present invention is not limited thereto.

Synthesis Example 1: Synthesis of Resin 1

Under nitrogen stream, 60.7 g of cyclohexanone was placed in a three-neck flask and heated to 80° C. 5.23 g, 20.61 g and 4.77 g of monomers corresponding to individual repeating units of Resin 1 listed below (sequentially from the left), and a solution of a polymerization initiator V-601 (0.506 g, manufactured by Wako Pure Chemical Industries, Ltd.) dissolved in 112.7 g of cyclohexanone were added dropwise thereto over 6 hours. After completion of the dropwise addition, the reaction was further carried out at 80° C. for 2 hours. The reaction liquid was allowed to cool and then added dropwise to a mixed liquid of 1286 g of methanol/143 g of water over 20 minutes. The precipitated powder was collected by filtration and dried to obtain the following Resin 1 (18.6 g) which is an acid-decomposable resin. The composition ratio (molar ratio) of the repeating units determined from the nuclear magnetic resonance (NMR) method was 5/75/20. The weight-average molecular weight of Resin 1 obtained was 20,000 in terms of standard polystyrene and the dispersity (Mw/Mn) was 1.7.

Resins 2 to 40 and Comparative Resins 1 to 3 described below were synthesized in the same manner as in Synthesis Example 1, except that the monomers corresponding to the repeating units were changed.

<Preparation of Resist Composition>

The components shown in Tables 1 and 2 below were dissolved in the solvents shown in the same tables so as to have the contents (contents in the total solid content) shown in the same tables, and a solution having a solid content concentration of 4.9 mass % was prepared for each. This solution was filtered through a polyethylene filter having a pore size of 0.1 μm to prepare an actinic ray-sensitive or radiation-sensitive resin composition (resist composition).

Evaluation

Examples 1 to 39 and Comparative Examples 1 to 4: ArF Dry Exposure (Formation of Resist Film)

The prepared resist composition was applied onto an 8-inch Si wafer (Si wafer with a diameter of 200 mm) coated with an organic antireflection film (ARC 29A manufactured by Brewer Science, Inc.) using a spin coater Act 8 manufactured by Tokyo Electron Co., Ltd., and dried on a hot plate at 90° C. for 60 seconds to obtain a resist film having a film thickness of 140 nm. In Examples 25, 26, 27, 29, 31, 33, 34, 37, and 38, a top coat layer having a film thickness of 100 nm was formed on the resist film, using any one of top coat compositions T-1 to T-6 shown in Table 4. The top coat compositions T-1 to T-6 shown in Table 4 were prepared and used in such a manner that the components shown in Table 4 were dissolved in the solvents shown in the same table so as to have the contents (contents in the total solid content) shown in the same table to prepare a solution having a predetermined solid content concentration for each.

(Formation of Resist Pattern)

The formed resist film was subjected to patternwise exposure using an ArF exposure apparatus (PAS5500/1100 manufactured by ASML, numerical aperture (NA) of 0.75, Dipole (dipole illumination), outer sigma of 0.89, and inner sigma of 0.65), and an exposure mask (line/space=1/1). After irradiation, heating was carried out on a hot plate at 110° C. for 60 seconds, and then development was carried out to obtain a 1:1 line and space resist pattern with a line width of 75 nm. In Table 1, those described as "NTI" in the column of Development were subjected to the development with butyl acetate and those described as "PTI" in the column of Development were subjected to the development with tetramethyl ammonium hydroxide.

Examples 40 to 54 and Comparative Examples 5 and 6: ArF Liquid Immersion Exposure An organic antireflection film ARC29SR (manufactured by Nissan Chemical Industries, Ltd.) was applied onto a silicon wafer and baked at 205° C. for 60 seconds. As a result, an antireflection film having a film thickness of 88 nm was formed on the silicon wafer. The obtained resist composition was applied thereon and baked (PB: prebake) at 90° C. for 60 seconds. Thus, a resist film having a film thickness of 80 nm was formed. In Examples 48 and 54, a top coat layer having a film thickness of 100 nm was formed on the resist film, using any one of top coat compositions T-1 to T-6 shown in Table 4.

The obtained wafer was subjected to patternwise exposure using an ArF excimer laser immersion scanner (XT1700i manufactured by ASML, NA of 1.20, Dipole, outer sigma of 0.950, inner sigma of 0.850, and Y deflection). As a reticle, a 6% halftone mask having a line size of 44 nm and a line:space of 1:1 was used. As the immersion liquid, ultrapure water was used. Thereafter, the wafer was baked (Post Exposure Bake; PEB) under the conditions described in Table 2, puddled with an organic developer (butyl acetate) for 30 seconds and then developed. The wafer was rotated at 4000 rpm for 30 seconds to thereby obtain a line and space pattern (pattern) having a pitch of 88 nm and a space width of 44 nm (line width of 44 nm).

(Evaluation of Residue Defects)

After forming the resist pattern described above, the coordinate data of the defects was acquired using a defect evaluation apparatus KLA 2360 (manufactured by KLA Co., Ltd.) and the electron microscope image of each coordinate was observed, whereby the number of residue defects on an 8-inch Si wafer (Si wafer with a diameter of 200 mm) was counted. The results are shown in Tables 1 and 2 (Residue defects). From the viewpoint of practical applications, the number of residue defects is preferably 100 or less, more preferably 40 or less, and still more preferably 10 or less.

(Evaluation of Etching Resistance)

The obtained resist pattern was etched using a plasma etching apparatus (Hitachi ECR Plasma Etching System U-621) to determine the etching rate (plasma conditions: Ar 500 ml/min, $N_2$ 500 ml/min, and $O_2$ 10 ml/minute). In consideration of the stabilization of the plasma, the etching rate was determined from the difference between the film thickness etched in 10 seconds from the start of etching and the film thickness etched in 5 seconds from the start of etching. The results are shown in Tables 1 and 2 (Etching rate). From the viewpoint of practical applications, the etching rate is preferably 210 angstrom (Å)/second (sec) or less, more preferably 140 Å/sec or less, and still more preferably 70 Å/sec or less.

(Etching rate)={(film thickness etched in 10 seconds)−(film thickness etched in 5 seconds)}/5

In Tables 1 and 2, "Si content" represents the Si content described above.

In addition, in Tables 1 and 2, "Si content after elimination" represents the Si content of the resin in a state where the leaving group is eliminated. However, in Comparative Example 1 only, the Si content of the resin before elimination of the leaving group is shown. The "Si content after elimination" corresponds to the Si content in the resin in the resist pattern.

TABLE 1

|  | Resin | | | Acid generator 1 | | Acid generator 2 | | Basic compound | |
| --- | --- | --- | --- | --- | --- | --- | --- | --- | --- |
|  | Kind | Si content (mass %) | Content (mass %) | Kind | Content (mass %) | kind | Content (mass %) | Kind | Content (mass %) |
| Example 1 | Resin 1 | 5.1 | 77.4 | A-1 | 11.2 | | | B-1/B-2 | 5.1/0.3 |
| Example 2 | Resin 1 | 5.1 | 73.6 | A-1 | 13.8 | A-2 | 0.9 | B-1 | 6.7 |
| Example 3 | Resin 1 | 5.1 | 77.9 | A-1 | 11.4 | A-2 | 3.5 | B-3 | 1.2 |
| Example 4 | Resin 1 | 5.1 | 77.3 | A-1 | 8.5 | | | B-1/B-2 | 5.1/4.1 |
| Example 5 | Resin 1 | 5.1 | 77.4 | A-1 | 11.2 | | | B-1/B-2 | 5.1/0.3 |
| Example 6 | Resin 2 | 9.1 | 81.5 | A-2 | 8.5 | A-5 | 3.5 | B-2/B-3 | 2.0/1.5 |
| Example 7 | Resin 2/Resin 11 (mass ratio of 50/50) | 9.0 | 79.4 | A-1 | 11.2 | | | B-1/B-2 | 5.1/0.3 |
| Example 8 | Resin 3 | 7.5 | 78.4 | A-1 | 11.2 | | | B-1/B-2 | 5.1/0.3 |
| Example 9 | Resin 4 | 5.8 | 77.2 | A-1 | 10.6 | | | B-1/B-2 | 5.1/1.1 |
| Example 10 | Resin 5 | 8.9 | 81.7 | A-1 | 8.9 | | | B-1/B-2 | 4.1/0.3 |
| Example 11 | Resin 6 | 4.9 | 68.6 | A-1 | 13.7 | | | B-1/B-2 | 6.2/6.5 |
| Example 12 | Resin 7 | 4.8 | 79.6 | A-1 | 12.0 | | | B-1/B-2 | 5.7/0.7 |
| Example 13 | Resin 1 | 5.1 | 82.4 | A-3 | 12.0 | | | B-1/B-3 | 2.9/0.7 |
| Example 14 | Resin 1 | 5.1 | 78.2 | A-4 | 10.0 | | | B-1 | 5.8 |
| Example 15 | Resin 2 | 9.1 | 81.8 | A-1 | 10.6 | A-5 | 4.4 | B-3 | 1.2 |
| Example 16 | Resin 8 | 9.2 | 80.4 | A-1 | 11.2 | | | B-1/B-2 | 5.1/0.3 |
| Example 17 | Resin 9 | 5.0 | 82.0 | A-4 | 9.0 | A-6 | 2.0 | B-1/B-2 | 3.5/0.5 |
| Example 18 | Resin 10 | 4.7 | 79.7 | A-4 | 14.0 | | | B-3 | 1.3 |
| Example 19 | Resin 11 | 8.8 | 79.4 | A-1 | 11.2 | | | B-1/B-2 | 5.1/0.3 |
| Example 20 | Resin 12 | 4.8 | 81.0 | A-4 | 14.0 | | | B-3 | 2.0 |
| Example 21 | Resin 13 | 9.0 | 82.4 | A-1 | 11.2 | | | B-1/B-2 | 5.1/0.3 |
| Example 22 | Resin 14 | 9.2 | 77.4 | A-1 | 11.2 | | | B-1/B-2 | 5.1/0.3 |
| Example 23 | Resin 10 | 4.7 | 79.7 | A-4 | 14.0 | | | B-4 | 1.3 |
| Example 24 | Resin 1 | 5.1 | 73.6 | A-1 | 13.8 | A-2 | 0.9 | B-4 | 6.7 |
| Example 25 | Resin 10 | 4.7 | 79.7 | A-4 | 14.0 | | | B-6 | 1.3 |
| Example 26 | Resin 1 | 5.1 | 73.6 | A-1 | 13.8 | A-2 | 0.9 | B-1/B-2 | 6.0/0.7 |
| Example 27 | Resin 15 | 6.0 | 76.0 | A-1 | 12.6 | | | B-1/B-2 | 5.1/0.3 |
| Example 28 | Resin 16 | 4.0 | 77.1 | A-3 | 12.2 | | | B-1 | 6.7 |
| Example 29 | Resin 17 | 6.1 | 75.8 | A-1 | 13.8 | A-2 | 1.2 | B-1/B-2 | 5.1/4.1 |
| Example 30 | Resin 18 | 3.1 | 78.1 | A-4 | 12.6 | | | B-2/B-3 | 1.9/1.4 |
| Example 31 | Resin 19 | 6.7 | 77.7 | A-2 | 10.6 | | | B-1 | 6.7 |
| Example 32 | Resin 20 | 7.6 | 84.2 | A-3 | 11.8 | | | B-1/B-2 | 3.5/0.5 |
| Example 33 | Resin 21 | 7.2 | 78.5 | A-4 | 8.5 | A-6 | 1.9 | B-1/B-2 | 4.8/0.3 |
| Example 34 | Resin 22 | 2.7 | 81.6 | A-2 | 9.7 | | | B-6 | 6.7 |
| Example 35 | Resin 23 | 5.3 | 82.4 | A-4 | 12.2 | | | B-1/B-2 | 5.1/0.3 |
| Example 36 | Resin 24 | 2.5 | 68.6 | A-1 | 20.7 | A-5 | 4.3 | B-2/B-3 | 2.0/1.4 |
| Example 37 | Resin 25 | 2.9 | 82.0 | A-3 | 11.8 | | | B-3 | 1.2 |
| Example 38 | Resin 26 | 5.3 | 82.6 | A-2 | 8.5 | A-5 | 3.5 | B-1/B-2 | 5.1/0.3 |
| Example 39 | Resin 27 | 6.6 | 66.6 | A-1 | 20.4 | | | B-5 | 9.0 |
| Comparative Example 1 | Resin 1 | 5.1 | 77.4 | A-1 | 11.2 | | | B-1/B-2 | 5.1/0.3 |
| Comparative Example 2 | Comparative Resin 1 | 0 | 77.4 | A-1 | 11.2 | | | B-1/B-2 | 5.1/0.3 |
| Comparative Example 3 | Comparative Resin 2 | 0 | 77.4 | A-1 | 11.2 | | | B-1/B-2 | 5.1/0.3 |
| Comparative Example 4 | Comparative Resin 3 | 0.35 | 77.4 | A-1 | 11.2 | | | B-1/B-2 | 5.1/0.3 |

|  | Hydrophobic resin | | Solvent (mass ratio) | Top coat composition | Development | Si content after elimination (mass %) | Evaluation | |
| --- | --- | --- | --- | --- | --- | --- | --- | --- |
|  | Kind | Content (mass %) | | | | | Etching rate (Å/sec) | Residue defects (number) |
| Example 1 | HR-3 | 6 | SL-1/SL-2(70/30) | — | NTI | 8.3 | 51 | 4 |
| Example 2 | HR-2/HR-3 | 2/3 | SL-1/SL-2(70/30) | — | NTI | 8.3 | 60 | 8 |
| Example 3 | HR-3 | 6 | SL-1/SL-4(90/10) | — | NTI | 8.3 | 57 | 7 |
| Example 4 | HR-1 | 5 | SL-6/SL-8(50/50) | — | NTI | 8.3 | 55 | 5 |
| Example 5 | HR-3 | 6 | SL-2(100) | — | NTI | 8.3 | 56 | 7 |
| Example 6 | HR-1 | 3 | SL-3/SL-8(95/5) | — | NTI | 13.3 | 61 | 6 |
| Example 7 | HR-2 | 4 | SL-3/SL-5(80/20) | — | NTI | 13.3 | 54 | 5 |
| Example 8 | HR-4 | 5 | SL-1/SL-3(80/20) | — | NTI | 9.2 | 187 | 7 |
| Example 9 | HR-3 | 6 | SL-2/SL-4(90/10) | — | NTI | 8.9 | 193 | 8 |
| Example 10 | HR-1 | 5 | SL-1/SL-7(80/20) | — | NTI | 14.8 | 91 | 9 |
| Example 11 | HR-2/HR-4 | 1/4 | SL-1/SL-6(70/30) | — | NTI | 7.4 | 58 | 7 |
| Example 12 | HR-4 | 2 | SL-2/SL-7(95/5) | — | NTI | 7.4 | 55 | 5 |
| Example 13 | HR-1 | 2 | SL-3/SL-4(80/20) | — | NTI | 8.3 | 98 | 6 |
| Example 14 | HR-3 | 6 | SL-1/SL-2/SL-4(70/20/10) | — | NTI | 8.3 | 68 | 4 |

TABLE 1-continued

| | | | | | | | | |
|---|---|---|---|---|---|---|---|---|
| Example 15 | HR-3 | 2 | SL-1 (100) | — | NTI | 13.3 | 59 | 5 |
| Example 16 | HR-1 | 3 | SL-2/SL-7(95/5) | — | NTI | 11.7 | 53 | 6 |
| Example 17 | HR-2 | 3 | SL-1/SL-2(70/30) | — | NTI | 7.1 | 112 | 5 |
| Example 18 | HR-4 | 5 | SL-2(100) | — | NTI | 8.3 | 73 | 5 |
| Example 19 | HR-1 | 4 | SL-1/SL-2(70/30) | — | NTI | 13.3 | 78 | 7 |
| Example 20 | HR-2 | 3 | SL-1/SL-3(80/20) | — | NTI | 7.0 | 57 | 4 |
| Example 21 | HR-4 | 1 | SL-3/SL-4(80/20) | — | NTI | 12.6 | 56 | 8 |
| Example 22 | HR-3 | 6 | SL-1/SL-2(70/30) | — | NTI | 13.5 | 55 | 3 |
| Example 23 | HR-4 | 5 | SL-2(100) | — | NTI | 8.3 | 73 | 5 |
| Example 24 | HR-2/HR-3 | 2/3 | SL-1/SL-2(70/30) | — | NTI | 8.3 | 60 | 8 |
| Example 25 | HR-4 | 5 | SL-2(100) | T-1 | NTI | 8.3 | 73 | 5 |
| Example 26 | HR-2/HR-3 | 2/3 | SL-1/SL-2(70/30) | T-1 | NTI | 8.3 | 60 | 8 |
| Example 27 | HR-3 | 6 | SL-1/SL-2(70/30) | T-4 | NTI | 8.1 | 55 | 4 |
| Example 28 | HR-1 | 4 | SL-3/SL-4(80/20) | — | NTI | 5.7 | 110 | 8 |
| Example 29 | — | — | SL-1/SL-2(70/30) | T-5 | NTI | 8.7 | 68 | 5 |
| Example 30 | HR-3 | 6 | SL-1/SL-4(90/10) | — | NTI | 4.5 | 106 | 5 |
| Example 31 | HR-4 | 5 | SL-2/SL-7(95/5) | T-3 | NTI | 8.3 | 53 | 8 |
| Example 32 | — | — | SL-2(100) | — | NTI | 11.4 | 57 | 3 |
| Example 33 | HR-3 | 6 | SL-1/SL-2(70/30) | T-6 | NTI | 8.7 | 56 | 5 |
| Example 34 | HR-3 | 2 | SL-3/SL-4(80/20) | T-4 | NTI | 3.3 | 120 | 3 |
| Example 35 | — | — | SL-1/SL-2(70/30) | — | NTI | 7.2 | 73 | 6 |
| Example 36 | HR-2 | 3 | SL-1/SL-2(70/30) | — | NTI | 3.2 | 108 | 4 |
| Example 37 | HR-4 | 5 | SL-2/SL-4(90/10) | T-2 | NTI | 6.1 | 118 | 8 |
| Example 38 | — | — | SL-1/SL-2(70/30) | T-1 | NTI | 7.0 | 60 | 6 |
| Example 39 | HR-3 | 2 | SL-2/SL-7(95/5) | — | NTI | 8.3 | 60 | 5 |
| Comparative Example 1 | HR-3 | 6 | SL-1/SL-6(70/30) | — | NTI | 5.1 | 105 | 127 |
| Comparative Example 2 | HR-3 | 6 | SL-1/SL-3(80/20) | — | NTI | 0 | 261 | 8 |
| Comparative Example 3 | HR-3 | 6 | SL-3/SL-8(95/5) | — | NTI | 0 | 287 | 7 |
| Comparative Example 4 | HR-3 | 6 | SL-1/SL-4(90/10) | — | NTI | 0.6 | 251 | 6 |

TABLE 2

| | Resin | | | Acid generator 1 | | Acid generator 2 | | Basic compound | |
|---|---|---|---|---|---|---|---|---|---|
| | Kind | Si content (mass %) | Content (mass %) | Kind | Content (mass %) | Kind | Content (mass %) | Kind | Content (mass %) |
| Example 40 | Resin 28 | 5.9 | 78.8 | A-2 | 18.2 | | | B-3 | 2.2 |
| Example 41 | Resin 29 | 4.7 | 88.6 | A-1 | 5.2 | A-2 | 2.1 | B-1 | 4.1 |
| Example 42 | Resin 30 | 6.0 | 81.2 | A-2 | 9.2 | | | B-1 | 9.0 |
| Example 43 | Resin 31 | 6.4 | 79.4 | A-1 | 11.5 | | | B-1 | 8.3 |
| Example 44 | Resin 32 | 6.1 | 87.4 | A-2 | 9.5 | | | B-3 | 2.1 |
| Example 45 | Resin 33 | 6.4 | 81.5 | A-5 | 13 | | | B-1/B-3 | 2.0/1.5 |
| Example 46 | Resin 34 | 5.3 | 84.1 | A-4 | 12 | | | B-5 | 3.0 |
| Example 47 | Resin 35 | 5.4 | 78.2 | A-1 | 12 | | | B-2 | 6.0 |
| Example 48 | Resin 36 | 6.7 | 78.0 | A-6 | 14.0 | | | B-1 | 8.0 |
| Example 49 | Resin 37 | 7.3 | 81.7 | A-1 | 8.9 | | | B-1/B-2 | 4.1/0.3 |
| Example 50 | Resin 38 | 7.3 | 79.8 | A-1 | 13.7 | | | B-4 | 5.0 |
| Example 51 | Resin 39 | 8.1 | 79.6 | A-1 | 12.0 | | | B-1/B-2 | 5.7/0.7 |
| Example 52 | Resin 40 | 6.7 | 77.5 | A-2 | 13.0 | | | B-1/B-3 | 5.7/0.8 |
| Example 53 | Resin 1 | 5.1 | 77.4 | A-1 | 11.2 | | | B-1/B-2 | 5.1/0.3 |
| Example 54 | Resin 21 | 7.2 | 77.6 | A-4 | 9.0 | A-6 | 2.0 | B-1/B-2 | 5.1/0.3 |
| Comparative Example 5 | Comparative Resin 1 | 0 | 77.4 | A-1 | 11.2 | | | B-1/B-2 | 5.1/0.3 |
| Comparative Example 6 | Comparative Resin 2 | 0 | 77.4 | A-1 | 11.2 | | | B-1/B-2 | 5.1/0.3 |

| | Hydrophobic resin | | | | PEB | Si content after | Evaluation | |
|---|---|---|---|---|---|---|---|---|
| | Kind | Content (mass %) | Solvent (mass ratio) | Top coat composition | temperature (° C.) | elimination (mass %) | Etching rate (Å/sec) | Residue defects (number) |
| Example 40 | HR-3 | 0.8 | SL-1/SL-3(90/10) | — | 85 | 7.4 | 60 | 4 |
| Example 41 | | | SL-1/SL-2(70/30) | — | 80 | 5.1 | 62 | 5 |
| Example 42 | HR-3 | 0.6 | SL-1/SL-3(90/10) | — | 95 | 7.5 | 57 | 6 |
| Example 43 | HR-1 | 0.8 | SL-1/SL-4(95/5) | — | 90 | 7.7 | 58 | 5 |
| Example 44 | HR-3 | 1 | SL-2(100) | — | 85 | 7.8 | 55 | 7 |
| Example 45 | HR-1 | 2 | SL-3/SL-8(95/5) | — | 90 | 7.6 | 58 | 5 |
| Example 46 | HR-2 | 0.9 | SL-3/SL-5(80/20) | — | 85 | 7.0 | 59 | 8 |
| Example 47 | HR-4 | 3.8 | SL-1/SL-3(80/20) | — | 90 | 6.3 | 62 | 6 |
| Example 48 | | | SL-2/SL-4(90/10) | T-3 | 100 | 8.5 | 56 | 9 |
| Example 49 | HR-1 | 5 | SL-1/SL-7(80/20) | — | 85 | 9.0 | 55 | 8 |
| Example 50 | HR-2/HR-4 | 1/0.5 | SL-1/SL-6(70/30) | — | 85 | 9.3 | 50 | 6 |

TABLE 2-continued

| Example 51 | HR-4 | 2 | SL-2/SL-7(95/5) | — | 90 | 9.8 | 49 | 5 |
| Example 52 | HR-2 | 3 | SL-2/SL-7(95/6) | — | 90 | 8.7 | 52 | 4 |
| Example 53 | HR-3 | 6 | SL-1/SL-2(70/30) | — | 85 | 8.3 | 51 | 5 |
| Example 54 | HR-3 | 6 | SL-1/SL-2(70/30) | T-6 | 90 | 8.7 | 56 | 5 |
| Comparative Example 5 | HR-3 | 6 | SL-1/SL-3(80/20) | — | 90 | 0 | 261 | 9 |
| Comparative Example 6 | HR-3 | 6 | SL-3/SL-8(95/5) | — | 95 | 0 | 287 | 10 |

In Tables 1 and 2, the structure of the resin is as follows. Here, the composition ratio of the repeating unit is a molar ratio. In addition, Et represents an ethyl group, iBu represents an isobutyl group, and TMS represents a trimethylsilyl group.

<Resin 1>

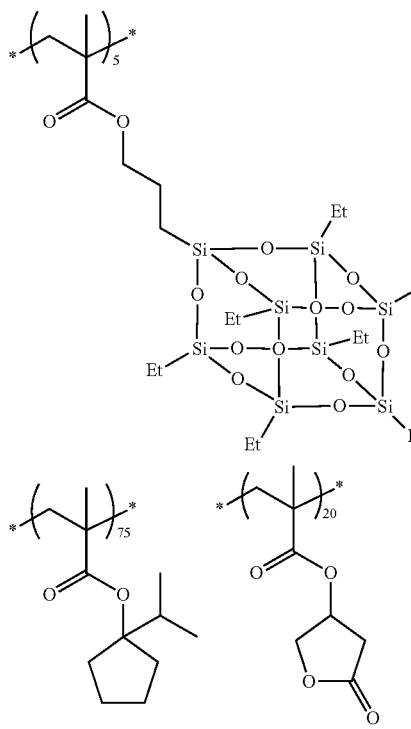

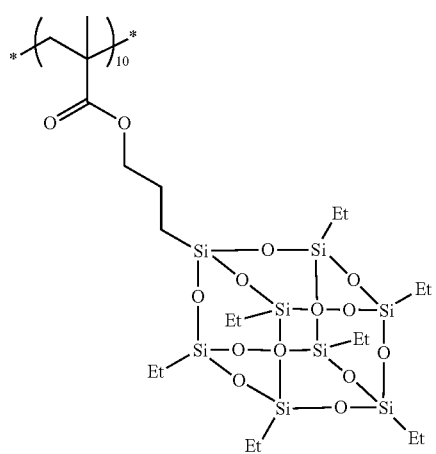

Mw = 20000
Mw/Mn = 1.7

<Resin 2>

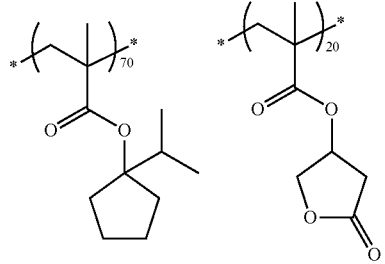

Mw = 21000
Mw/Mn = 1.6

<Resin 3>

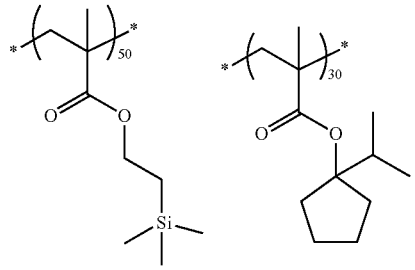

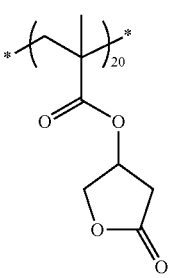

Mw = 18000
Mw/Mn = 1.5

<Resin 4>

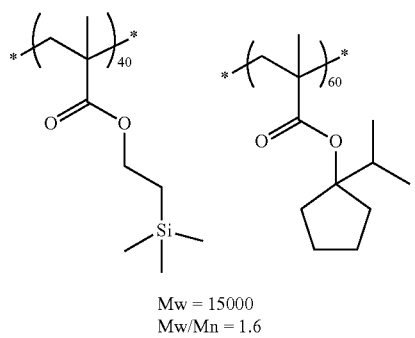

Mw = 15000
Mw/Mn = 1.6

<Resin 5>
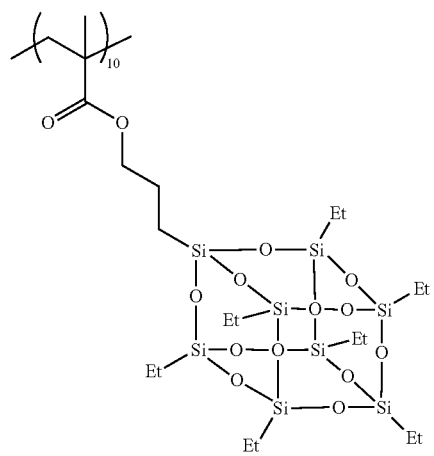
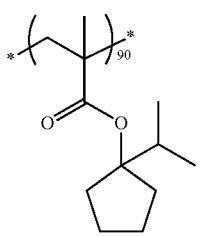
Mw = 18000
Mw/Mn = 1.6
<Resin 6>
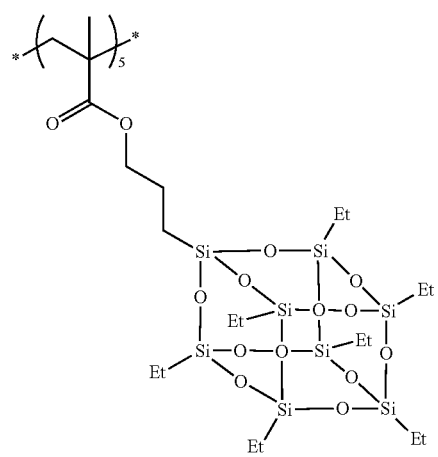
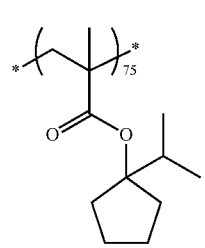
Mw = 19000
Mw/Mn = 1.6
<Resin 7>
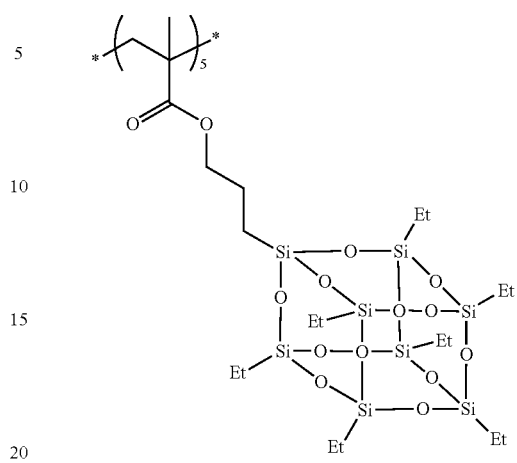
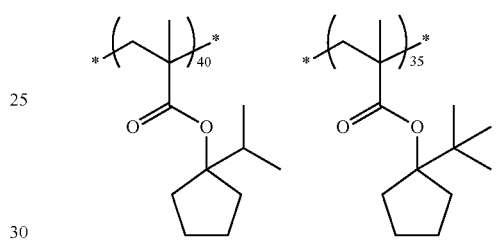
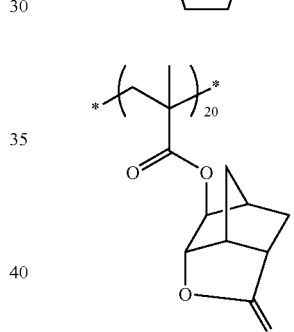
Mw = 15000
Mw/Mn = 1.7
<Resin 8>
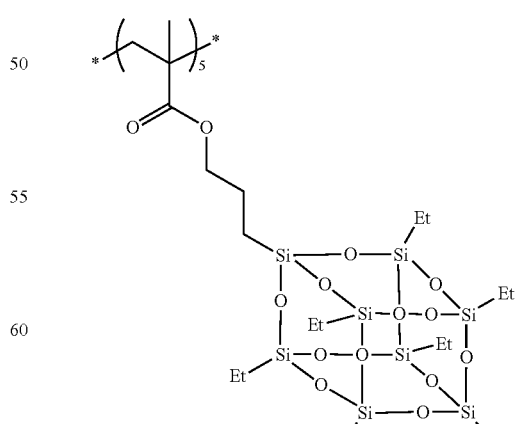

127
-continued
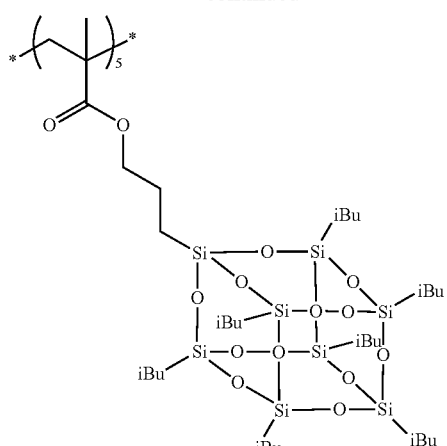
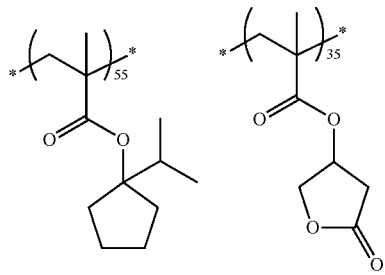
Mw = 20000
Mw/Mn = 1.7
<Resin 9>
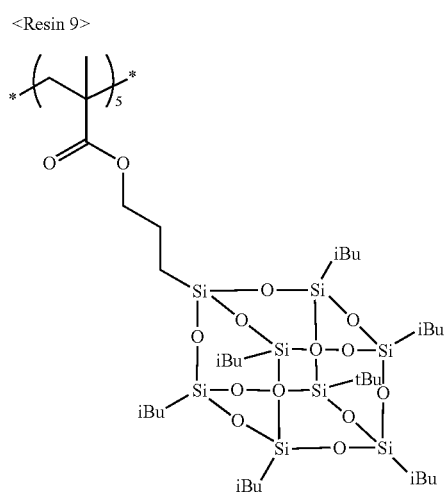
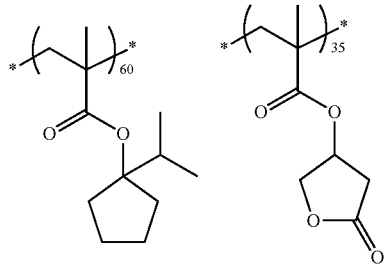
Mw = 18000
Mw/Mn = 1.6
128
-continued
<Resin 10>
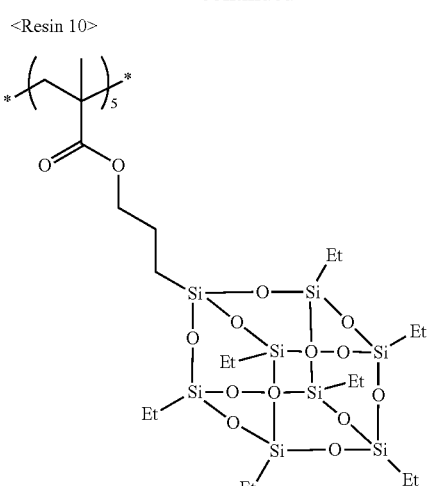
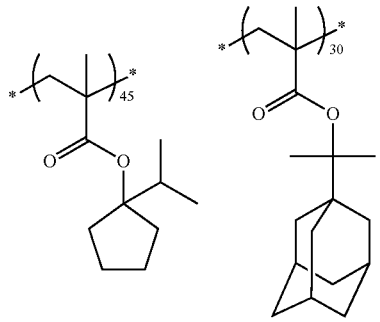
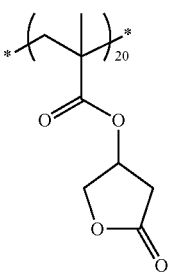
Mw = 15000
Mw/Mn = 1.7
<Resin 11>
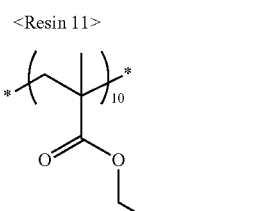
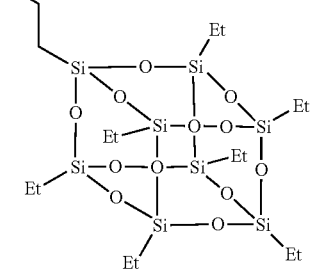

-continued
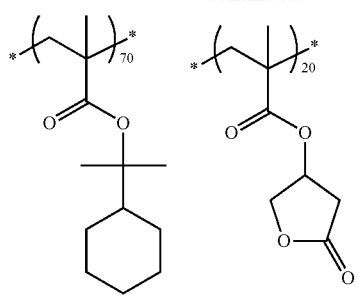
Mw = 18000
Mw/Mn = 1.5
<Resin 12>
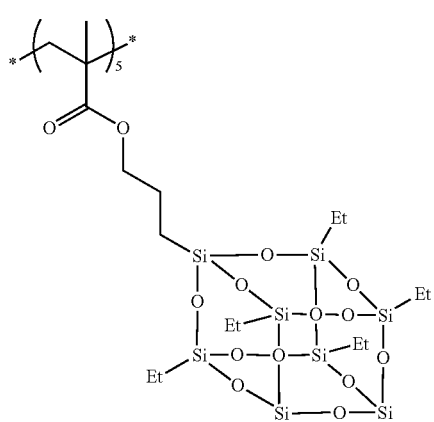
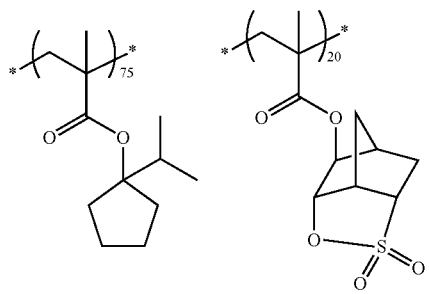
Mw = 13000
Mw/Mn = 1.7
<Resin 13>
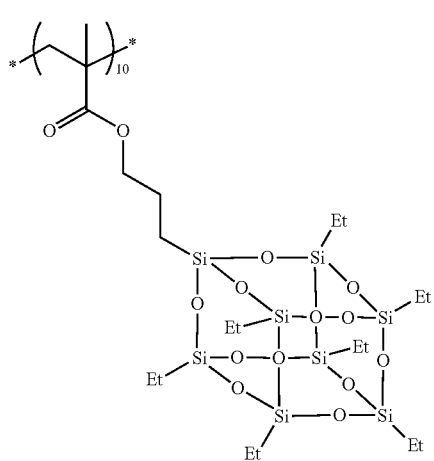
-continued
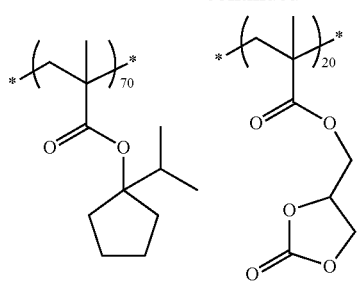
Mw = 21000
Mw/Mn = 1.6
<Resin 14>
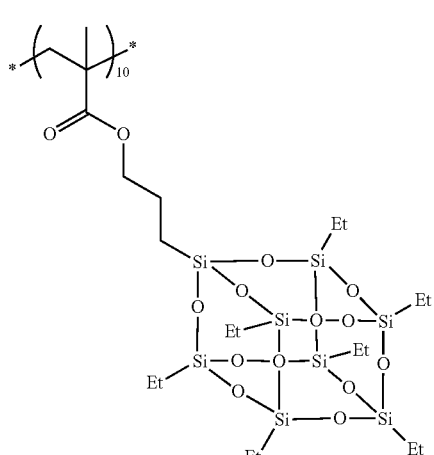
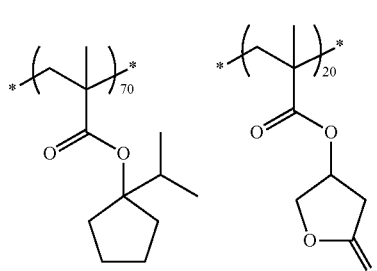
Mw = 19000
Mw/Mn = 1.6
<Comparative Resin 1>
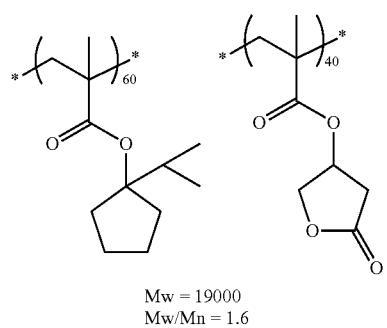
Mw = 19000
Mw/Mn = 1.6

131
-continued
<Comparative Resin 2>
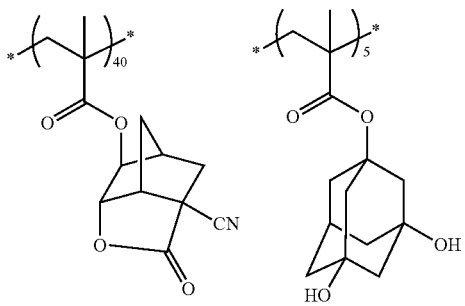
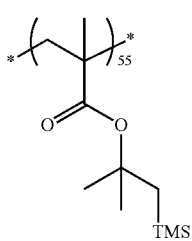
Mw = 12000
Mw/Mn = 1.7
<Comparative Resin 3>
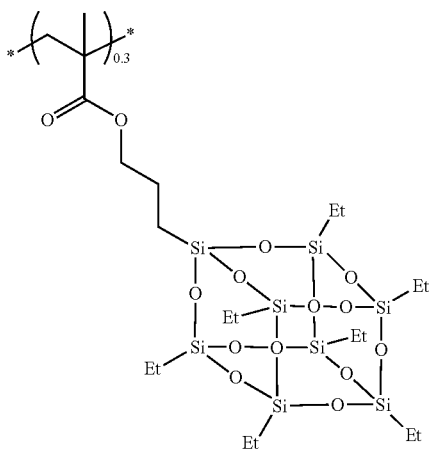
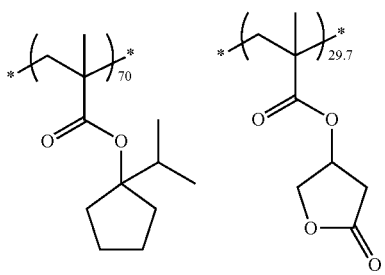
Mw = 19000
Mw/Mn = 1.6
132
-continued
<Resin 15>
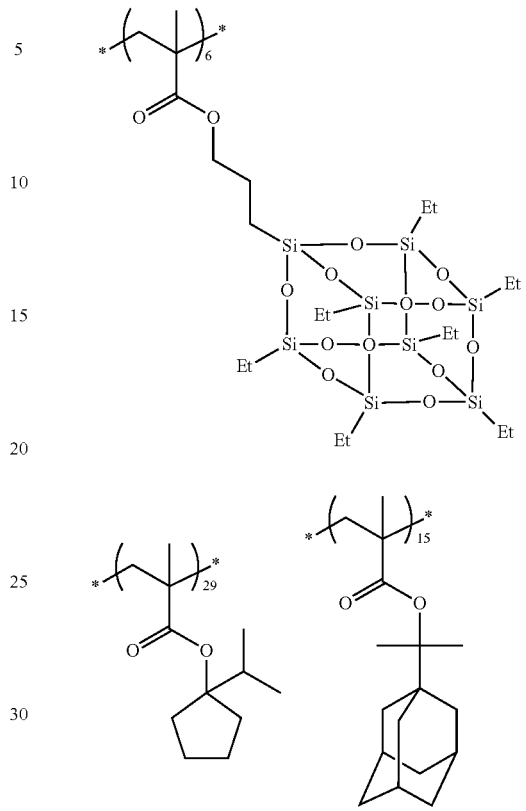
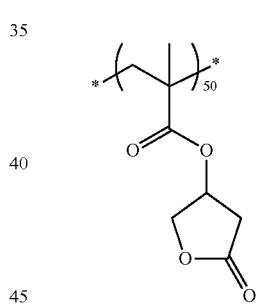
Mw = 12000
Mw/Mn = 1.6
<Resin 16>
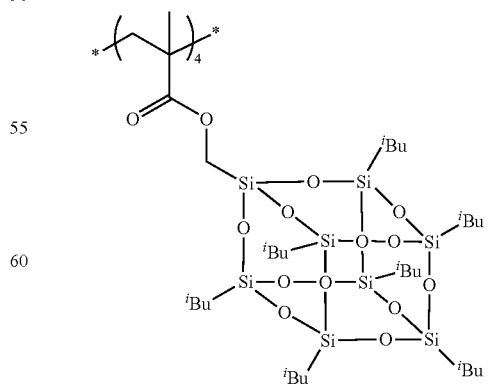

133
-continued
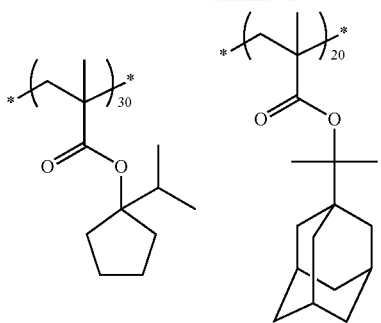
Mw = 11000
Mw/Mn = 1.6
<Resin 17>
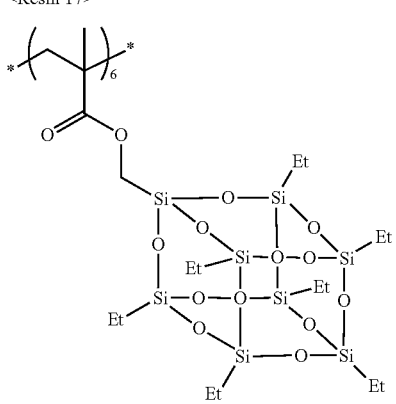
Mw = 9000
Mw/Mn = 1.7
134
-continued
<Resin 18>
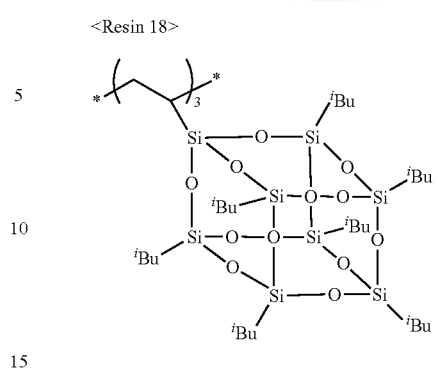
Mw = 8000
Mw/Mn = 1.8
<Resin 19>
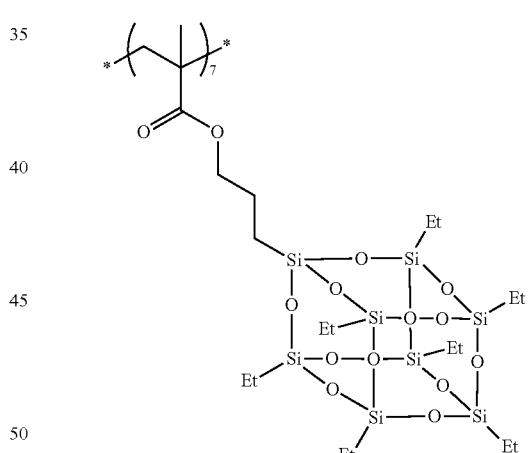

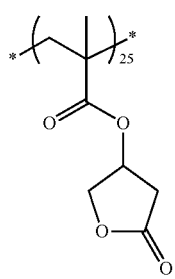
Mw = 12000
Mw/Mn = 1.6
<Resin 20>
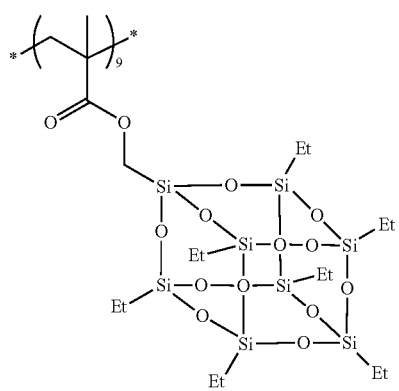
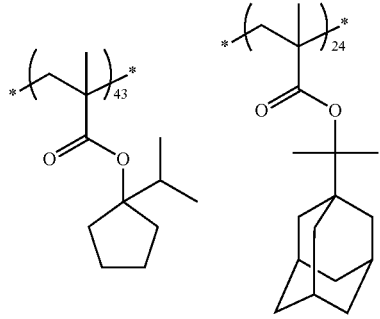
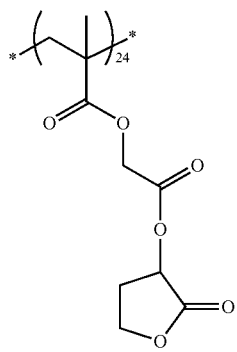
Mw = 10000
Mw/Mn = 1.6
<Resin 21>
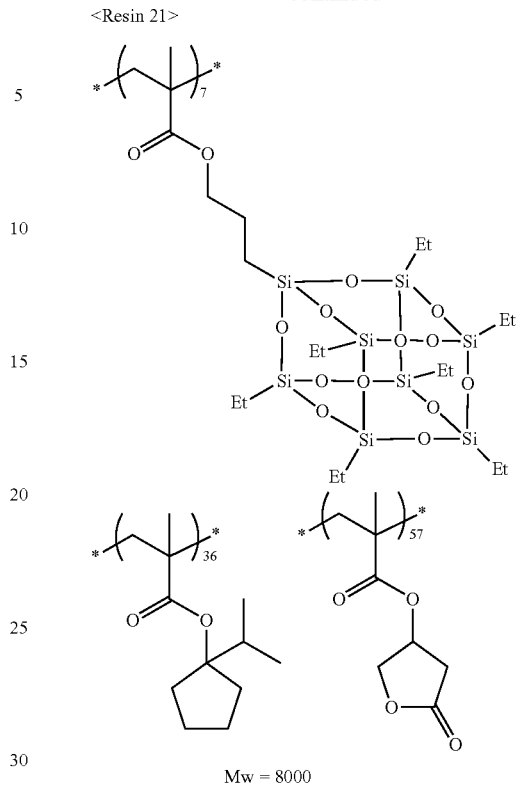
Mw = 8000
Mw/Mn = 1.5
<Resin 22>
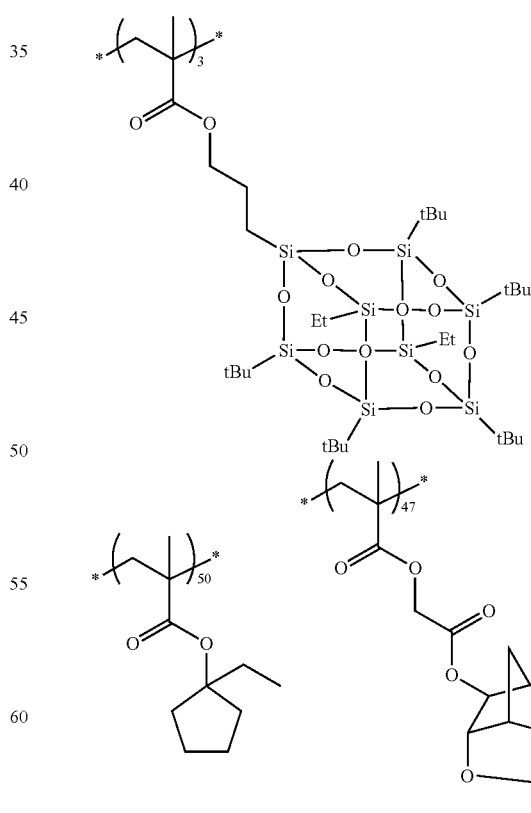
Mw = 12000
Mw/Mn = 1.6

<Resin 23>
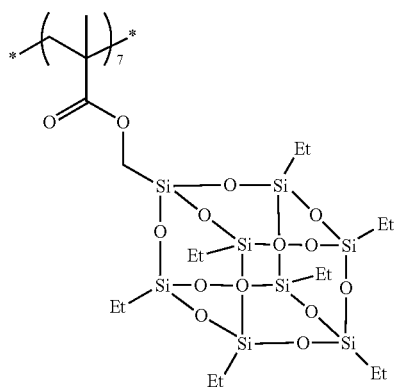
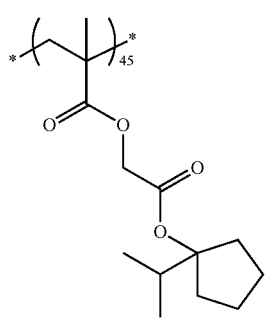
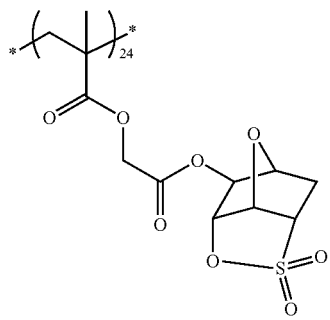
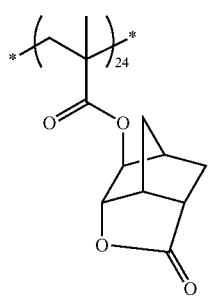
Mw = 14000
Mw/Mn = 1.7
<Resin 24>
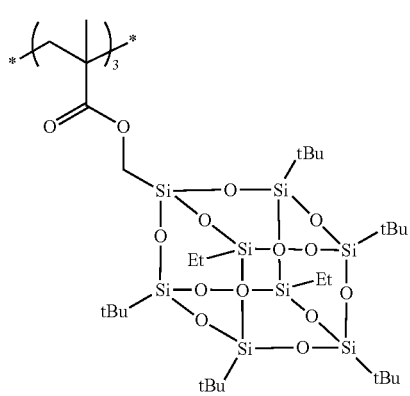
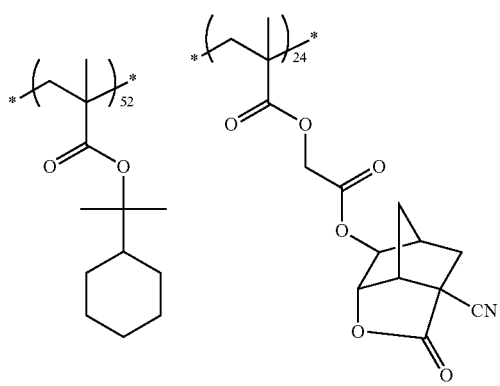
Mw = 11000
Mw/Mn = 1.6
<Resin 25>
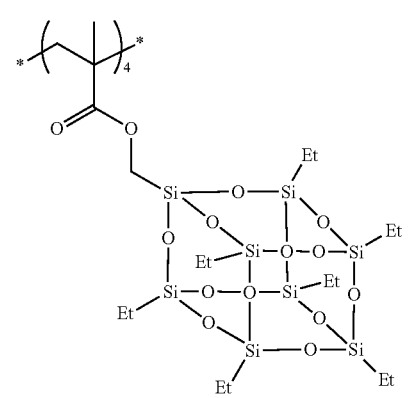
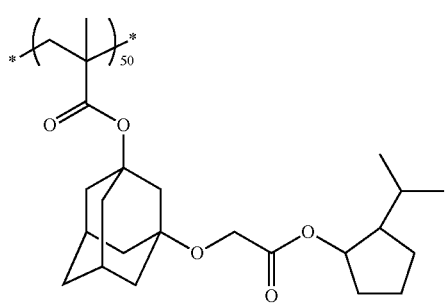

-continued
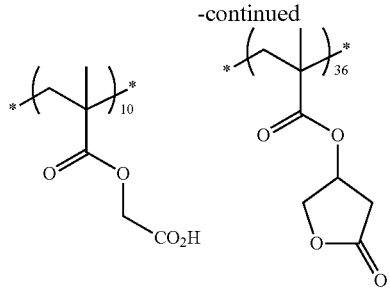
Mw = 14000
Mw/Mn = 1.7
<Resin 26>
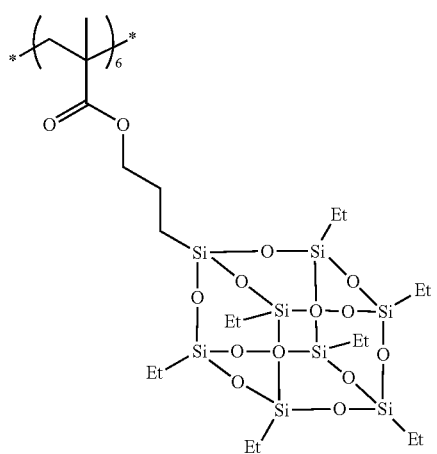
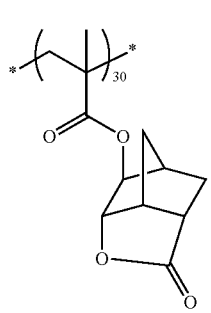
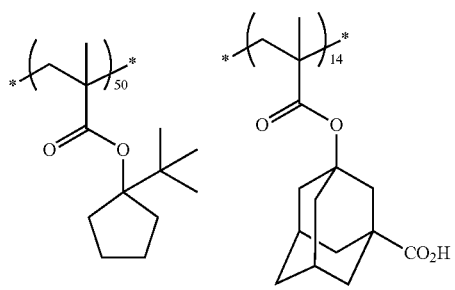
Mw = 9000
Mw/Mn = 1.7
<Resin 27>
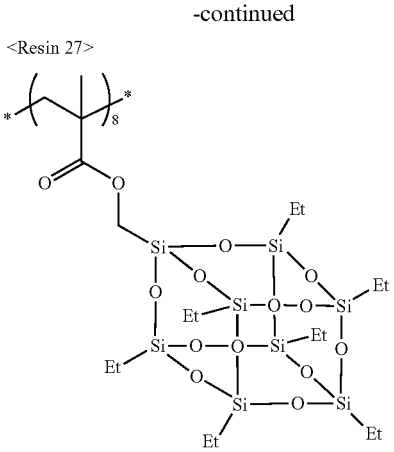
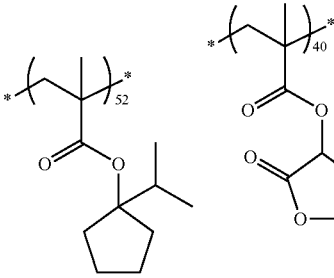
Mw = 13000
Mw/Mn = 1.5
<Resin 28>
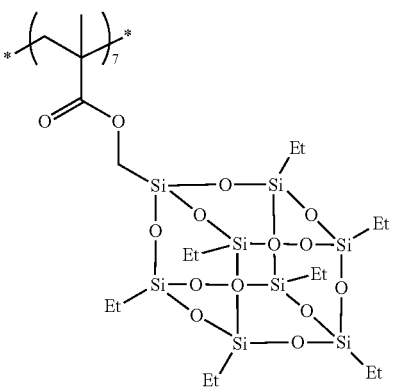
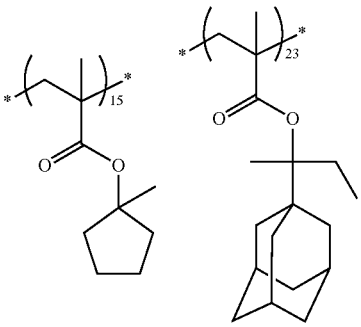

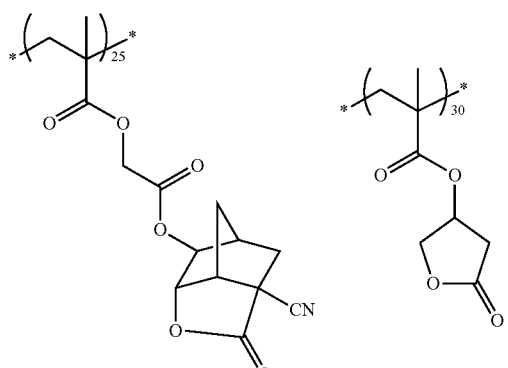
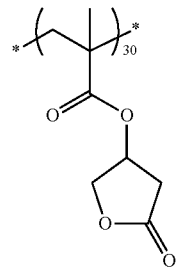
Mw = 10000
Mw/Mn = 1.6
<Resin 29>
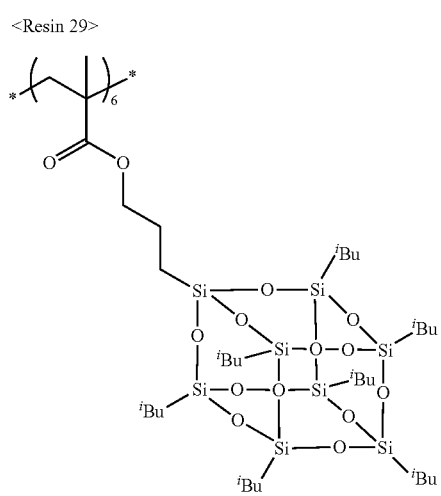
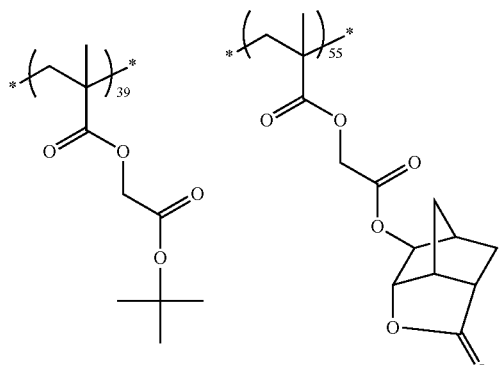
Mw = 14000
Mw/Mn = 1.6
<Resin 30>
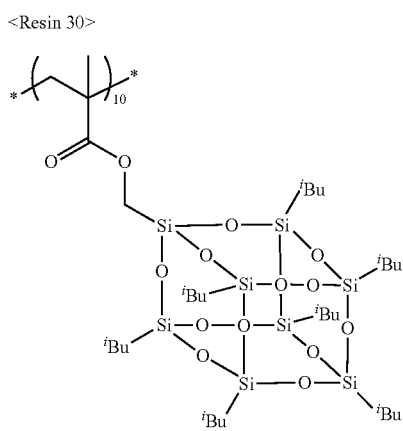
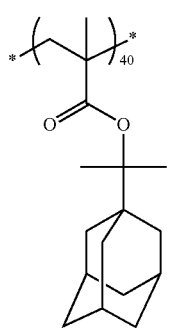
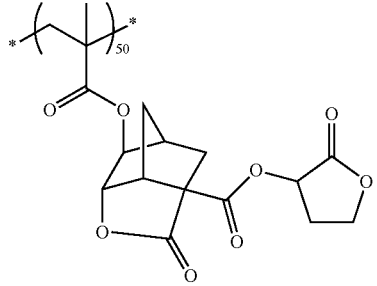
Mw = 11000
Mw/Mn = 1.6
<Resin 31>
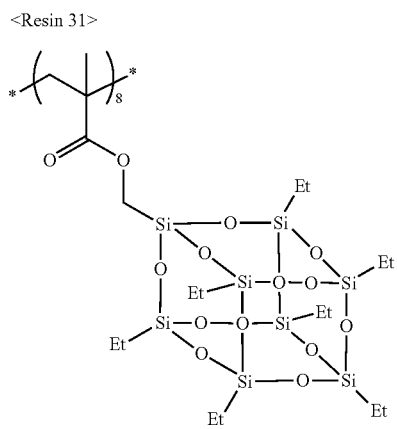

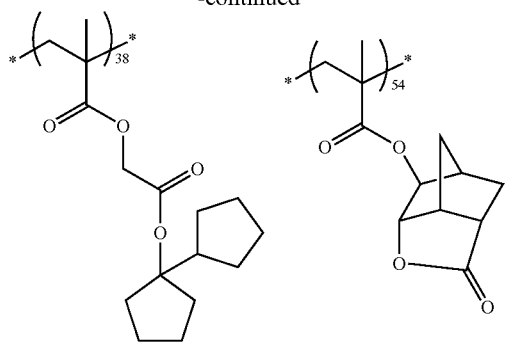
Mw = 10000
Mw/Mn = 1.7
<Resin 32>
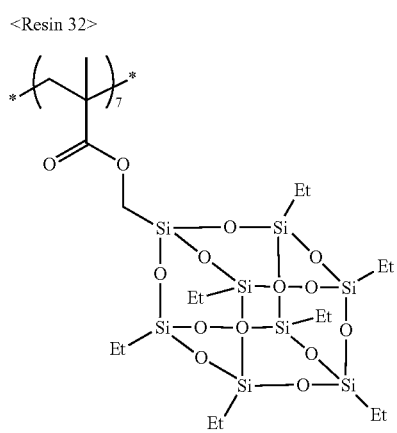
Mw = 9000
Mw/Mn = 1.7
<Resin 33>
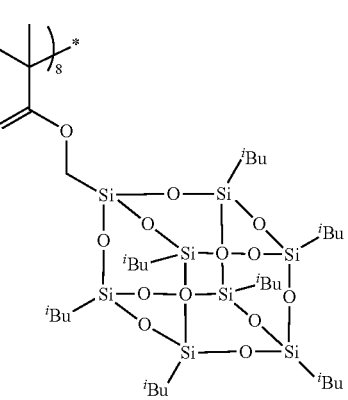
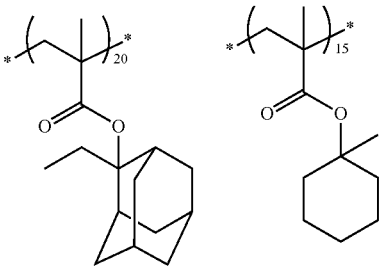
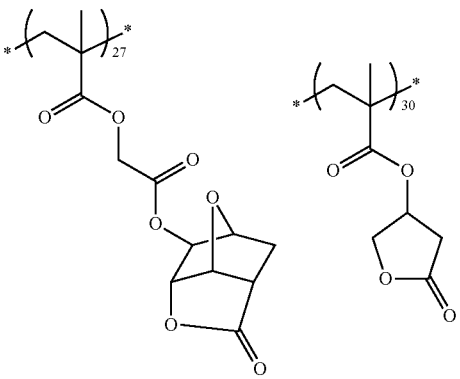
Mw = 9000
Mw/Mn = 1.6
<Resin 34>
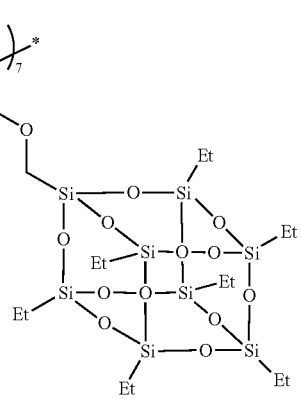

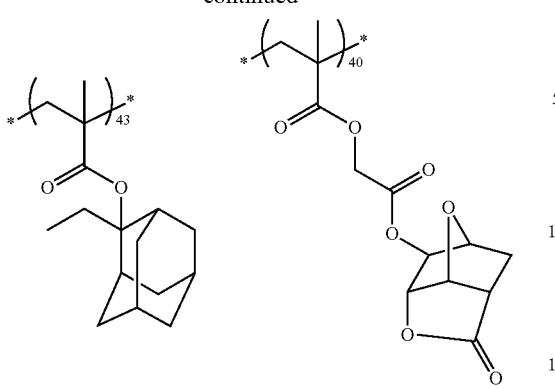
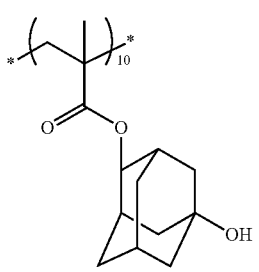
Mw = 8000
Mw/Mn = 1.7
<Resin 35>
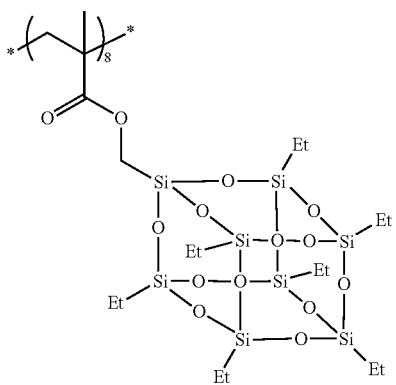
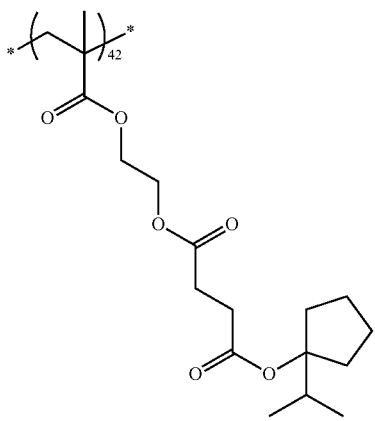
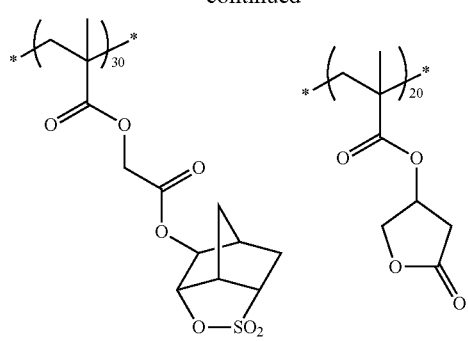
Mw = 9000
Mw/Mn = 1.6
<Resin 36>
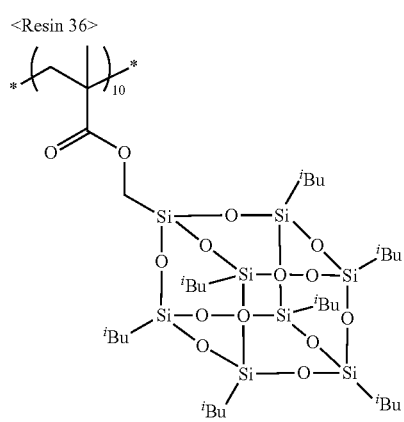
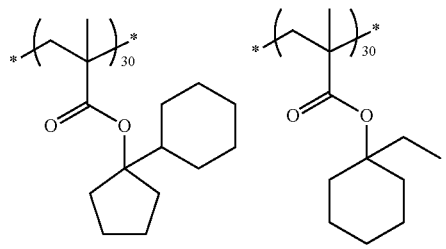
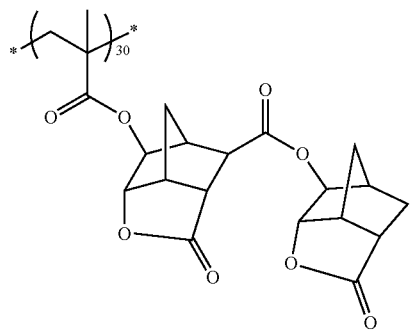
Mw = 8000
Mw/Mn = 1.6

<Resin 37>
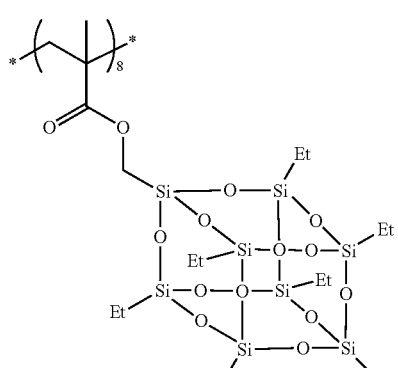
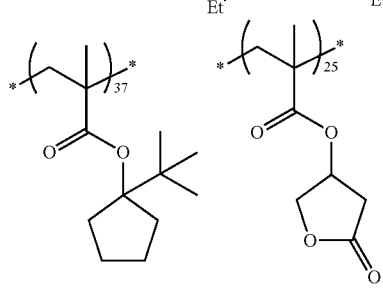
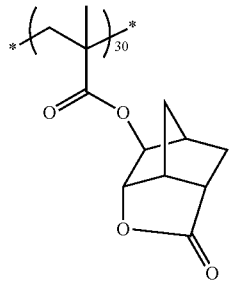
Mw = 10000
Mw/Mn = 1.7
<Resin 37>
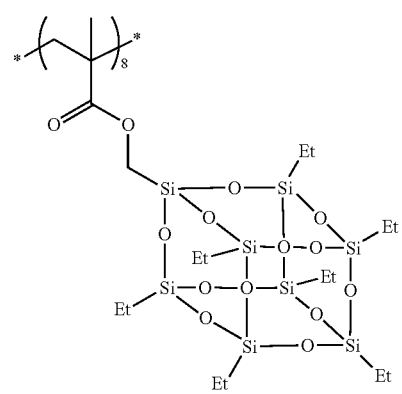
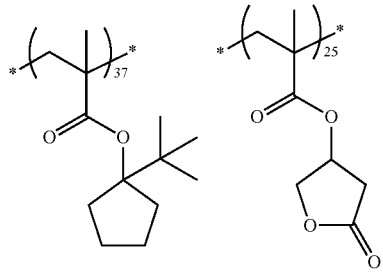
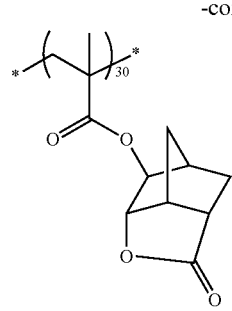
Mw = 10000
Mw/Mn = 1.7
<Resin 38>
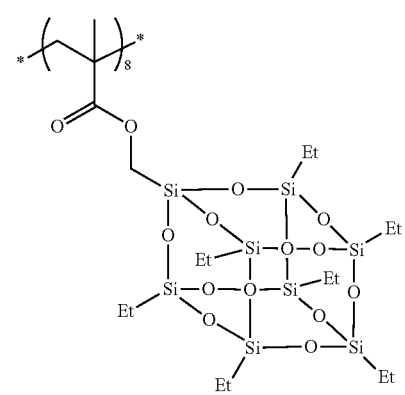
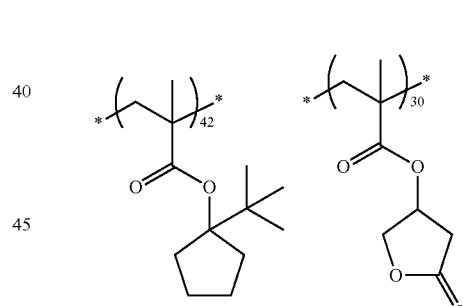
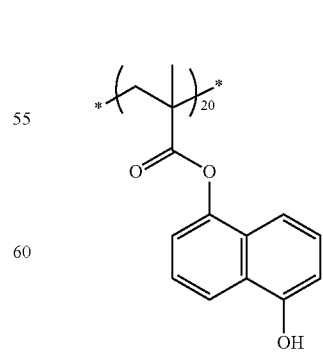
Mw = 12000
Mw/Mn = 1.6

<Resin 39>
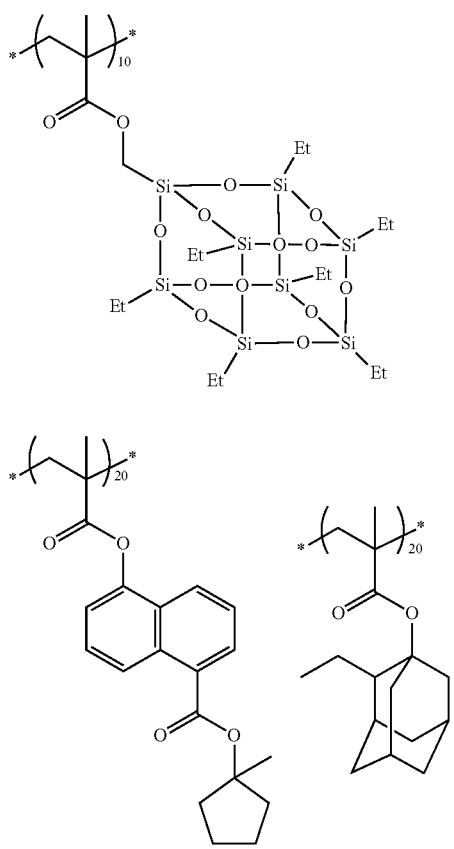
Mw = 16000
Mw/Mn = 1.6
<Resin 40>
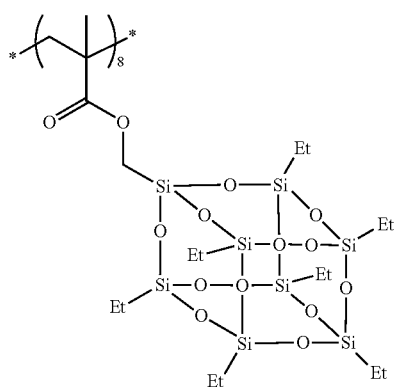
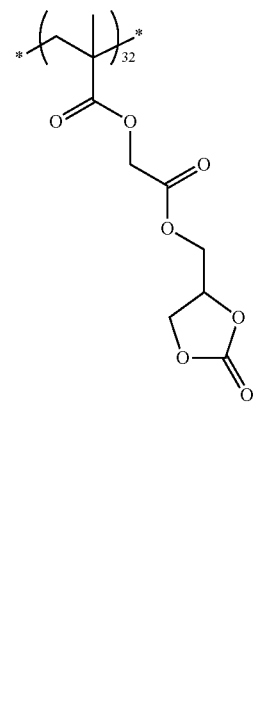
Mw = 7000
Mw/Mn = 1.6
In Tables 1 and 2, the structures of acid generators (acid generators 1 and 2) are as follows. Here, Me represents a methyl group. The molecular weight of each acid generator is shown in Table 3 below.
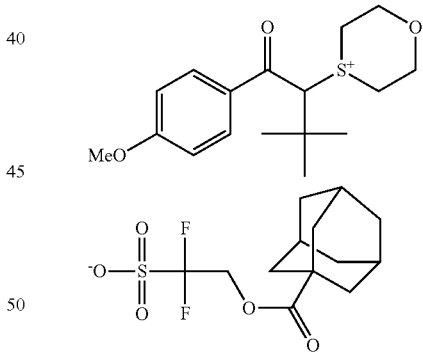
A-1
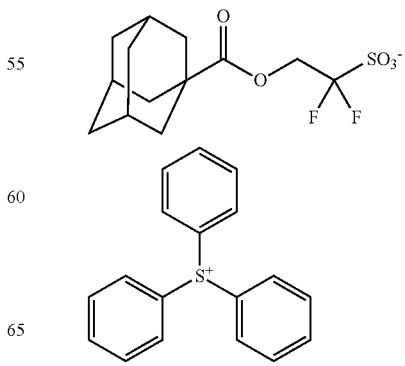
A-2

-continued
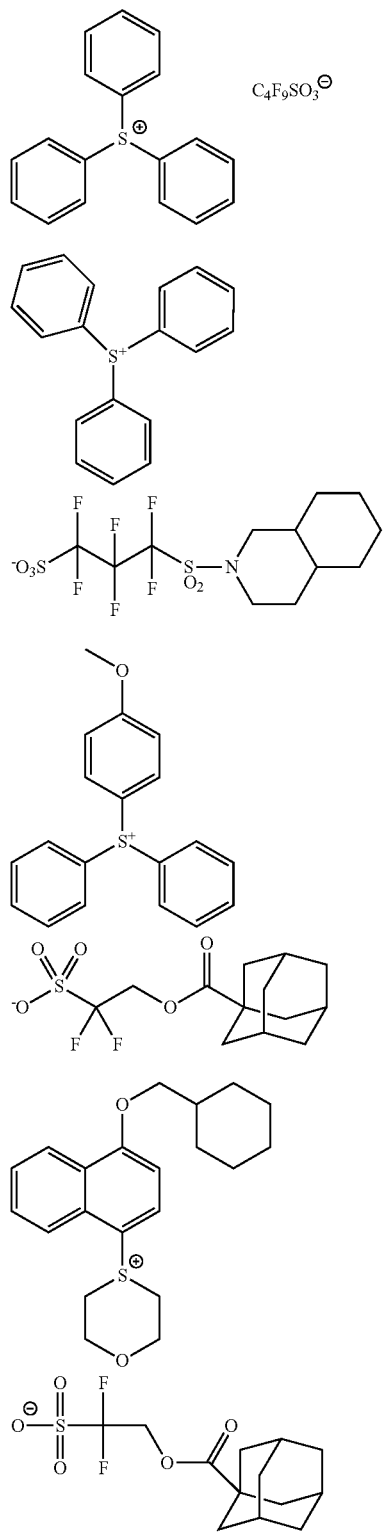
TABLE 3
| | Molecular weight |
|---|---|
| A-1 | 633 |
| A-2 | 587 |
TABLE 3-continued
| | Molecular weight |
|---|---|
| A-3 | 562 |
| A-4 | 696 |
| A-5 | 617 |
| A-6 | 667 |
In Tables 1 and 2, the structures of basic compounds are as follows. Here, Me represents a methyl group.
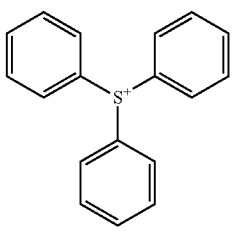
B-1
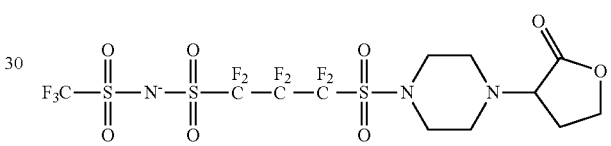
B-2
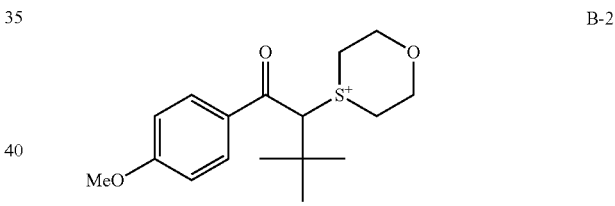
B-3
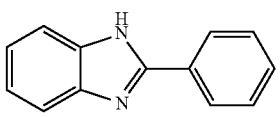
B-4
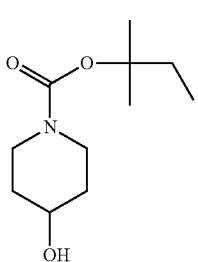

153

-continued

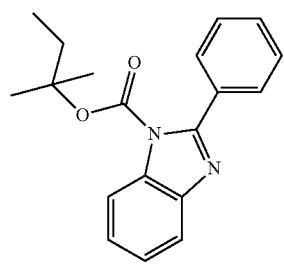
B-5

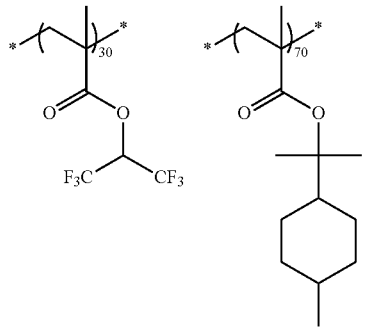
B-6

In Tables 1 and 2, the structures of hydrophobic resins are as follows. Here, the composition ratio of the repeating unit is a molar ratio.

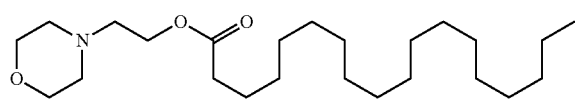
HR-1

154

-continued

HR-2

HR-3

HR-4

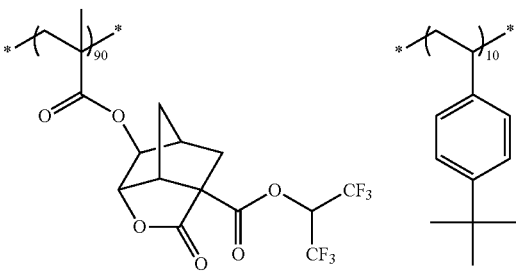

In Tables 1 and 2, the solvents are as follows.
SL-1: propylene glycol monomethyl ether acetate (PGMEA)
SL-2: cyclohexanone
SL-3: propylene glycol monomethyl ether (PGME)
SL-4: γ-butyrolactone
SL-5: propylene carbonate
SL-6: 2-ethylbutanol
SL-7: perfluorobutyltetrahydrofuran
SL-8: ethyl lactate

TABLE 4

| Top coat composition | Resin | | | | Additive | | Solvent |
| | Structure | Mw | Mw/Mn | Solid content concentration (mass %) | Kind | Added amount [based on solid content] (mass %) | (mass %) |
|---|---|---|---|---|---|---|---|
| T-1 | X-1 | 8000 | 1.64 | 3.00% | AD-1 | 12.0% | 4-methyl-2-pentanol (100%) |
| T-2 | X-3 | 9000 | 1.61 | 3.00% | AD-5 | 0.5% | ethyl 3,5,5-trimethylhexanoate/isoamyl isovalerate (90%/10%) |
| T-3 | X-3 | 9000 | 1.61 | 3.50% | AD-3 | 0.5% | 4-methyl-2-pentanol/n-decane (50%/50%) |
| T-4 | X-2 | 8000 | 1.57 | 3.00% | AD-1/AD-4 | 12%/0.7% | 4-methyl-2-pentanol/n-decane (70%/30%) |
| T-5 | X-2 | 8000 | 1.57 | 2.50% | AD-2 | 0.6% | 4-methyl-2-pentanol/n-decane/isobutyl isobutyrate (40%/50%/10%) |
| T-6 | X-1 | 8000 | 1.64 | 3.50% | AD-4 | 0.8% | diisoamyl ether/4-methyl-2-pentanol (80%/20%) |

In Table 4, the structures of resins and additives are as follows. Here, the composition ratio of the repeating unit constituting the resin is a molar ratio.
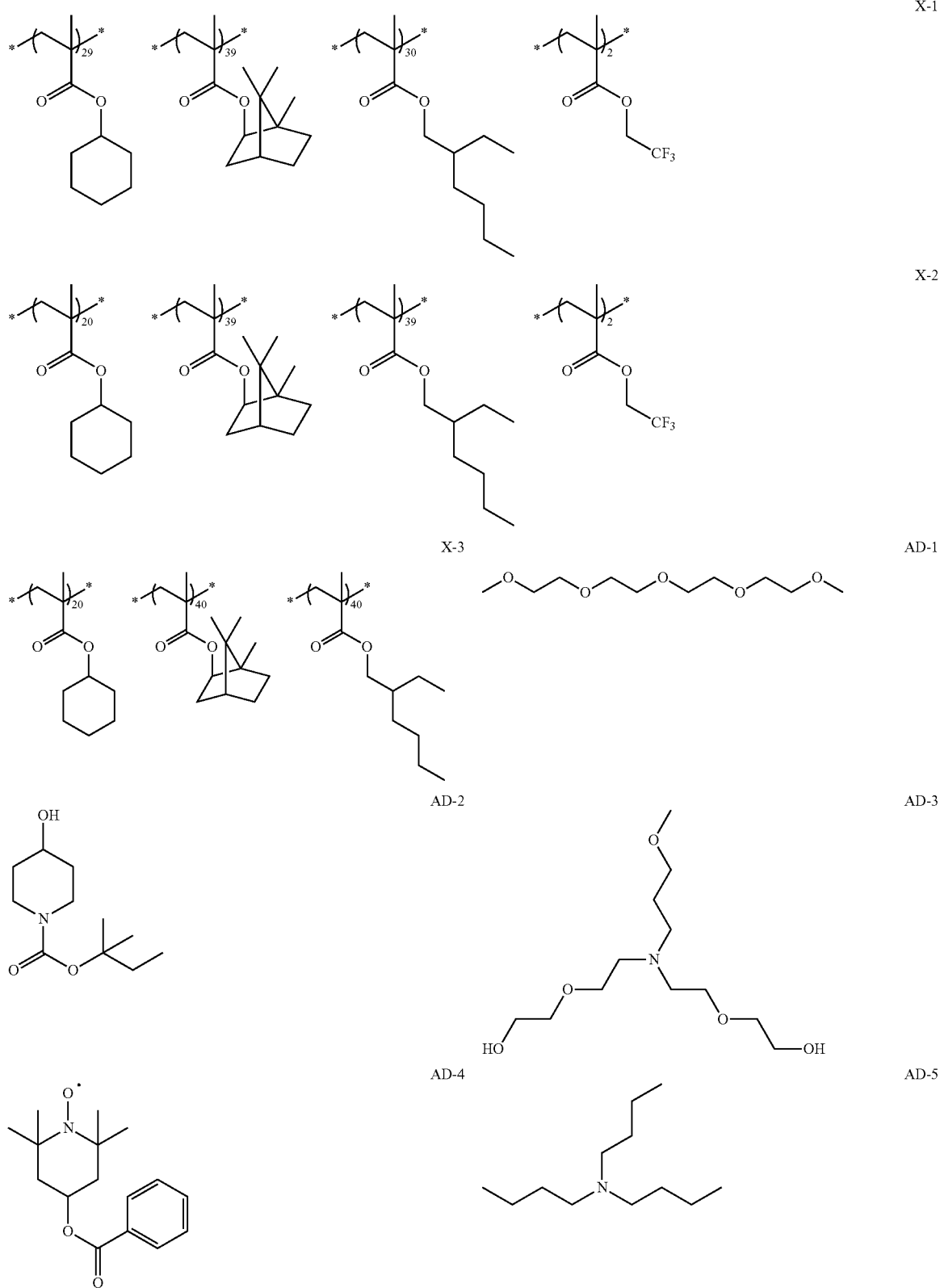

As can be seen from Tables 1 and 2, the residue defects were small and the etching resistance of the formed pattern was excellent in Examples 1 to 54 in which a resist film was formed using a resist composition containing a resin having an Si content within a specific range, subjected to exposure (Examples 1 to 39: ArF dry exposure, and Examples 40 to 54: ArF liquid immersion exposure), and then subjected to development using an organic developer.

Comparing Examples 1 to 39 developed by ArF dry exposure, etching resistance was more excellent in Examples 1 to 7 and 10 to 39 in which the repeating unit having an Si atom has a silsesquioxane structure. Among them, Examples 1 to 7 and 11 to 39, in which the resin contains a repeating unit having at least one of a lactone structure, a sultone structure, or a carbonate structure, exhibited less residue defects.

On the other hand, the etching resistance of the pattern thus formed was insufficient in Comparative Examples 2 to 6 (Comparative Examples 2 to 4: ArF dry exposure, and Comparative Examples 5 and 6: ArF liquid immersion exposure) using a resist composition not containing a resin having an Si content within a specific range.

In addition, many residue defects were observed in Comparative Example 1 which was subjected to development using an alkaline developer even though a resist composition containing a resin having an Si content within a specific range was used.

Comparing Example 1 with Comparative Example 1, the etching resistance of the formed pattern was more excellent in Example 1 subjected to development using an organic developer than Comparative Example 1 subjected to development using an alkaline developer. This is thought to be due to the fact that the Si content in the resin becomes higher in the pattern formed by organic solvent development rather than the pattern formed by alkaline development because leaving groups remain in the pattern in alkaline development, whereas leaving groups do not remain in the pattern in organic solvent development.

What is claimed is:

1. A pattern forming method, comprising:
forming a film using an actinic ray-sensitive or radiation-sensitive resin composition;
irradiating the film with actinic rays or radiation; and
developing the film irradiated with actinic rays or radiation using a developer containing an organic solvent,
wherein the actinic ray-sensitive or radiation-sensitive resin composition contains a resin containing a repeating unit having an Si atom and a repeating unit having an acid-decomposable group and a compound capable of generating an acid upon irradiation with actinic rays or radiation,
the content of Si atoms in the resin is 1.0 to 30 mass %,
the content of the resin in the total solid content of the actinic ray-sensitive or radiation-sensitive resin composition is 40 mass % or more, provided that, in the case where the repeating unit having an Si atom has a structure in which a polar group is protected by a leaving group capable of decomposing and leaving by the action of an acid and the leaving group has an Si atom, the amount of Si atoms in the leaving group is not included in the content of Si atoms in the resin,
the amount of the organic solvent relative to the developer is 90 mass% or more and 100 mass% or less,
the actinic ray-sensitive or radiation-sensitive resin composition further contains a hydrophobic resin containing a repeating unit represented by General Formula (II), and
the repeating unit represented by General Formula (II) is 90 mol% or more with respect to the total repeating units of the hydrophobic resin,

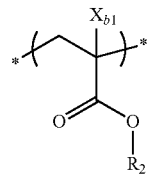

(II)

in General Formula (II),
$X_{b1}$ represents a hydrogen atom, an alkyl group, a cyano group, or a halogen atom, and
R2 represents an organic group which has one or more $CH_3$ partial structures and is stable to an acid.

2. The pattern forming method according to claim 1, wherein the repeating unit having an Si atom has a silsesquioxane structure.

3. The pattern forming method according to claim 2, wherein the silsesquioxane structure is a cage-type silsesquioxane structure.

4. The pattern forming method according to claim 1, wherein the resin contains a repeating unit having at least one of a lactone structure, a sultone structure, or a carbonate structure.

5. The pattern forming method according to claim 1, wherein the compound capable of generating an acid upon irradiation with actinic rays or radiation has a molecular weight of 580 or more.

6. A method for producing an electronic device, comprising the pattern forming method according to claim 1.

7. The pattern forming method according to claim 1, wherein the content of the resin in the total solid content of the actinic ray-sensitive or radiation-sensitive resin composition is 60 mass % or more.

8. The pattern forming method according to claim 1, wherein the repeating unit having an acid-decomposable group is represented by General Formula (AI),

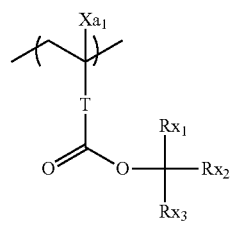

(AI)

in General Formula (AI),
$Xa_1$ represents a hydrogen atom, an alkyl group, a cyano group, or a halogen atom,
T represents a single bond or a divalent linking group,
$Rx_1$ to $Rx_3$ each independently represent an alkyl group or a cycloalkyl group, and
two of $Rx_1$ to $Rx_3$ are bonded to each other to form a ring structure.

9. The pattern forming method according to claim 1, wherein the actinic ray-sensitive or radiation-sensitive resin composition further contains a hydrophobic resin containing a repeating unit represented by General Formula (III),
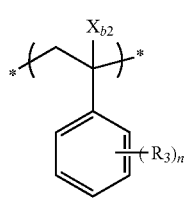
(III)
in General Formula (III),
   $X_{b}2$ represents a hydrogen atom, an alkyl group, a cyano group, or a halogen atom,
   R3 represents an alkyl group which has one or more CH3 partial structures, and
   n represents an integer of 1 to 5.
* * * * *